US012439595B2

(12) United States Patent
Son

(10) Patent No.: US 12,439,595 B2
(45) Date of Patent: Oct. 7, 2025

(54) SEMICONDUCTOR DEVICE AND MASSIVE DATA STORAGE SYSTEM INCLUDING THE SAME

(71) Applicant: SAMSUNG ELECTRONICS CO., LTD., Suwon-si (KR)

(72) Inventor: Younghwan Son, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 821 days.

(21) Appl. No.: 17/352,837

(22) Filed: Jun. 21, 2021

(65) Prior Publication Data

US 2022/0139951 A1 May 5, 2022

(30) Foreign Application Priority Data

Nov. 2, 2020 (KR) .......................... 10-2020-0144339

(51) Int. Cl.
*H10B 43/27* (2023.01)
*H01L 23/522* (2006.01)
(Continued)

(52) U.S. Cl.
CPC .......... *H10B 43/27* (2023.02); *H01L 23/5226* (2013.01); *H10B 43/35* (2023.02);
(Continued)

(58) Field of Classification Search
CPC ............. H01L 29/7808; H01L 29/7802; H01L 29/66712; H01L 29/788; H01L 29/42324;
(Continued)

(56) References Cited

U.S. PATENT DOCUMENTS 7,696,559 B2 * 4/2010 Arai ....................... H10B 43/30
257/315
7,982,260 B2 * 7/2011 Fukuzumi ......... H01L 29/42324
257/329
(Continued)

FOREIGN PATENT DOCUMENTS

CN 111968987 A * 11/2020 ........ H01L 27/11565
CN 112993016 A * 6/2021 ........ H01L 27/11524
(Continued)

OTHER PUBLICATIONS

Office Action dated Aug. 31, 2024 from the Korean Intellectual Property Office (KIPO) for Korean Patent Application No. 10-2020-0144339.

*Primary Examiner* — Ajay Ojha
*Assistant Examiner* — Tsz K Chiu
(74) *Attorney, Agent, or Firm* — Muir Patent Law, PLLC

(57) ABSTRACT

A semiconductor device includes a gate electrode structure, a channel, a division pattern, an insulation pattern structure, a through via, and a support structure. The gate electrode structure is on a substrate, and includes gate electrodes stacked in a first direction perpendicular to the substrate. Each of the gate electrodes extends in a second direction parallel to the substrate. The channel extends through the gate electrode structure. The division pattern is at each of opposite sides of the gate electrode structure in a third direction parallel to the substrate. The insulation pattern structure extends through the gate electrode structure. The through via extends through the insulation pattern structure. The support structure extends through the gate electrode structure between the insulation pattern structure and the division pattern. The support structure includes first and second extension portion extending in the second and third directions, respectively.

19 Claims, 47 Drawing Sheets

(51) Int. Cl.
*H10B 43/35* (2023.01)
*H10B 43/40* (2023.01)
*H10D 62/17* (2025.01)
*H01L 23/00* (2006.01)
*H01L 25/065* (2023.01)

(52) U.S. Cl.
CPC ........... *H10B 43/40* (2023.02); *H10D 62/292* (2025.01); *H01L 24/32* (2013.01); *H01L 25/0657* (2013.01); *H01L 2224/32145* (2013.01)

(58) Field of Classification Search
CPC ............. H01L 29/66825; H01L 29/792; H01L 2924/13081; H01L 2924/13085; H01L 29/6684; H01L 29/78391; H01L 29/4236; H01L 2224/32145; H01L 2224/16225; H01L 2224/32225; H01L 2224/48145; H01L 2224/49175; H01L 2224/73265; H01L 2224/83191; H01L 2225/06506; H01L 2225/0651; H01L 2225/06562; H01L 23/5226; H01L 29/1037; H01L 24/32; H01L 25/0657; H01L 24/16; H01L 24/48; H01L 24/49; H01L 24/73; H01L 24/83; H01L 24/05; H10B 20/40; H10B 41/00; H10B 43/27; H10B 43/35; H10B 43/40; H10B 43/50; H10B 41/35; H10B 41/27

See application file for complete search history.

(56) References Cited

U.S. PATENT DOCUMENTS

| | | | | |
|---|---|---|---|---|
| 8,030,700 B2 * | 10/2011 | Sakamoto | ............... | H10B 43/27 257/306 |
| 8,072,024 B2 * | 12/2011 | Ishikawa | ............. | H01L 29/4234 438/386 |
| 8,211,811 B2 * | 7/2012 | Matsushita | ....... | H01L 29/66833 438/763 |
| 8,236,673 B2 * | 8/2012 | Son | ................... | H01L 29/40117 438/259 |
| 8,338,876 B2 * | 12/2012 | Kito | .................... | H01L 29/7926 257/314 |
| 8,349,681 B2 * | 1/2013 | Alsmeier | ............. | H01L 29/7889 257/E21.309 |
| 8,415,242 B2 * | 4/2013 | Mizushima | ............ | H10B 43/27 257/E21.409 |
| 8,552,489 B2 * | 10/2013 | Eom | ................. | H01L 29/66833 257/E21.21 |
| 8,658,499 B2 * | 2/2014 | Makala | .................. | H10B 43/20 257/334 |
| 8,829,595 B2 * | 9/2014 | Lee | ........................ | H10B 43/27 257/E21.21 |
| 8,928,061 B2 * | 1/2015 | Chien | ................. | H01L 29/4925 257/315 |
| 8,994,091 B2 * | 3/2015 | Lee | .................... | H01L 29/7889 257/316 |
| 9,018,682 B2 * | 4/2015 | Izumida | ............ | H01L 29/40117 257/234 |
| 9,076,879 B2 * | 7/2015 | Yoo | ........................ | H01L 29/04 |
| 9,099,496 B2 * | 8/2015 | Tian | ....................... | H10B 41/27 |
| 9,159,739 B2 * | 10/2015 | Makala | ............. | H01L 29/66825 |
| 9,236,396 B1 * | 1/2016 | Koka | .................... | H01L 21/0217 |
| 9,305,849 B1 * | 4/2016 | Tsutsumi | ........... | H01L 29/40117 |
| 9,312,008 B2 * | 4/2016 | Nam | .................... | G11C 16/3418 |
| 9,406,692 B2 * | 8/2016 | Lee | ........................ | H10B 43/35 |
| 9,406,693 B1 | 8/2016 | Pang et al. | | |
| 9,406,694 B2 * | 8/2016 | Ikeno | .................... | H01L 21/764 |
| 9,634,024 B2 * | 4/2017 | Kanamori | ............. | H10B 43/10 |
| 9,659,958 B2 * | 5/2017 | Lee | ........................ | H10B 41/27 |
| 9,806,093 B2 | 10/2017 | Toyama et al. | | |
| 9,812,462 B1 | 11/2017 | Pang et al. | | |
| 9,960,181 B1 * | 5/2018 | Cui | ........................ | H10B 41/50 |
| 10,068,917 B2 * | 9/2018 | Kanamori | ............. | H01L 28/00 |
| 10,276,583 B2 * | 4/2019 | Sharangpani | .......... | H10B 41/43 |
| 10,340,286 B2 * | 7/2019 | Goda | ..................... | H10B 43/27 |
| 10,355,009 B1 | 7/2019 | Kai et al. | | |
| 10,529,865 B2 | 1/2020 | Kwon et al. | | |
| 10,566,346 B2 * | 2/2020 | Lee | ........................ | H10B 43/27 |
| 10,580,791 B1 | 3/2020 | Lee | | |
| 10,651,197 B2 | 5/2020 | Hong et al. | | |
| 10,685,975 B2 | 6/2020 | Baek | | |
| 2008/0173928 A1 * | 7/2008 | Arai | ....................... | H10B 41/27 257/E21.409 |
| 2010/0019310 A1 * | 1/2010 | Sakamoto | .............. | H10B 43/27 257/324 |
| 2010/0038699 A1 * | 2/2010 | Katsumata | .......... | H01L 29/7926 257/E21.409 |
| 2012/0012920 A1 * | 1/2012 | Shin | .................... | H01L 29/7926 257/E29.262 |
| 2012/0091521 A1 * | 4/2012 | Goda | ..................... | H10B 43/27 257/E29.17 |
| 2012/0098050 A1 * | 4/2012 | Shim | ..................... | H10B 43/20 257/E29.262 |
| 2012/0140562 A1 * | 6/2012 | Choe | ..................... | H10B 43/35 257/329 |
| 2012/0267702 A1 * | 10/2012 | Jee | ......................... | H10B 43/35 257/E21.423 |
| 2013/0134493 A1 * | 5/2013 | Eom | .................... | H01L 29/7926 257/314 |
| 2013/0270643 A1 * | 10/2013 | Lee | ........................ | H10B 43/27 257/365 |
| 2014/0203442 A1 * | 7/2014 | Yun | ....................... | H10B 41/50 257/773 |
| 2015/0372005 A1 * | 12/2015 | Yon | ........................ | H10B 41/27 257/314 |
| 2016/0293625 A1 * | 10/2016 | Kang | .................... | H01L 23/528 |
| 2017/0040337 A1 * | 2/2017 | Kim | ........................ | H10B 41/27 |
| 2017/0221921 A1 * | 8/2017 | Kanamori | ............. | H10B 43/27 |
| 2017/0309635 A1 * | 10/2017 | Kim | ........................ | H10B 43/27 |
| 2018/0122819 A1 * | 5/2018 | Shim | ..................... | H10B 43/10 |
| 2018/0240811 A1 * | 8/2018 | Kim | ........................ | H10B 43/00 |
| 2018/0301374 A1 * | 10/2018 | Masamori | ............. | H10B 43/40 |
| 2019/0244969 A1 * | 8/2019 | Lee | ........................ | H10B 43/10 |
| 2020/0105785 A1 | 4/2020 | Jung et al. | | |
| 2020/0119031 A1 * | 4/2020 | Shen | ..................... | H10B 41/27 |
| 2021/0050368 A1 * | 2/2021 | Han | ........................ | H10B 43/27 |
| 2022/0293627 A1 * | 9/2022 | Xu | ......................... | H10B 43/27 |
| 2023/0057630 A1 * | 2/2023 | Woo | ..................... | H10B 43/40 |

FOREIGN PATENT DOCUMENTS

| | | | | |
|---|---|---|---|---|
| CN | 114628397 A | * | 6/2022 | ......... H01L 23/5283 |
| CN | 115715089 A | * | 2/2023 | ........... H01L 23/535 |
| KR | 10-2018-0095499 A | | 8/2018 | |
| KR | 10-2020-0038323 A | | 4/2020 | |

* cited by examiner

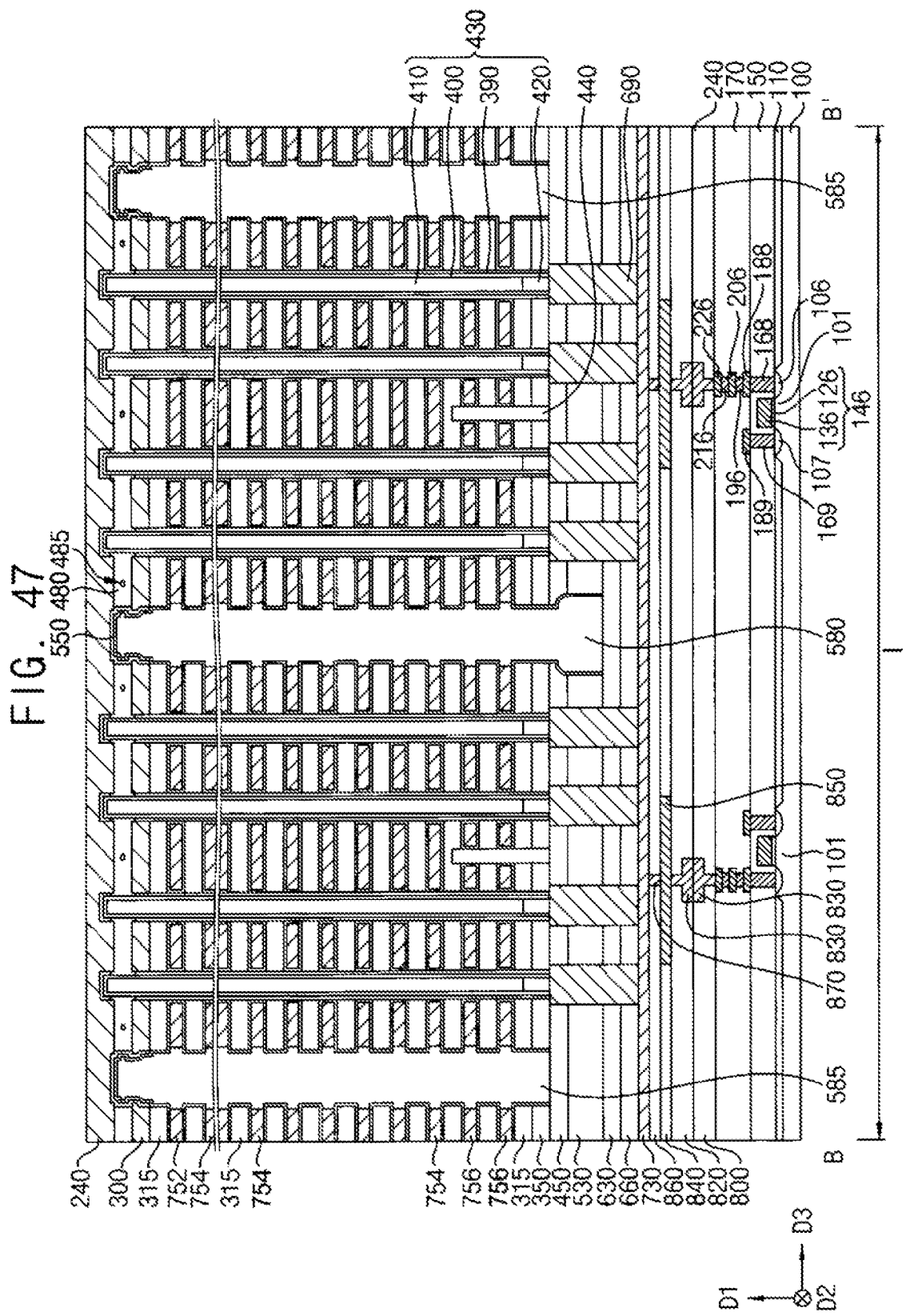

SEMICONDUCTOR DEVICE AND MASSIVE DATA STORAGE SYSTEM INCLUDING THE SAME

CROSS-REFERENCE TO RELATED APPLICATION

Korean Patent Application No. 10-2020-0144339, filed on Nov. 2, 2020 in the Korean Intellectual Property Office, and entitled: "Semiconductor Device and Massive Data Storage System Including the Same," is incorporated by reference herein in its entirety.

BACKGROUND

1. Field

Embodiments relate to a semiconductor device and a massive data storage system including the same.

2. Description of the Related Art

An electronic system that includes data storage may use a high capacity semiconductor device that may store high capacity data. Thus, a method of increasing the data storage capacity of the semiconductor device has been studied. For example, a semiconductor device including memory cells that may be 3-dimensionally stacked has been suggested.

SUMMARY

Embodiments are directed to a semiconductor device, including: a gate electrode structure on a substrate, the gate electrode structure including gate electrodes spaced apart from each other in a first direction perpendicular to an upper surface of the substrate, each of the gate electrodes extending in a second direction parallel to the upper surface of the substrate; a channel extending in the first direction through the gate electrode structure; a division pattern at each of opposite sides of the gate electrode structure in a third direction, the third direction being parallel to the upper surface of the substrate and crossing the second direction, the division pattern extending in the second direction; an insulation pattern structure extending through a portion of the gate electrode structure; a through via extending in the first direction through the insulation pattern structure; and a support structure extending in the first direction through a portion of the gate electrode structure between the insulation pattern structure and the division pattern. The support structure may include: a first extension portion extending in the second direction in a plan view; and a second extension portion connected to the first extension portion, the second extension portion extending in the third direction from the first extension portion.

Embodiments are directed to a semiconductor device, including: lower circuit patterns on a substrate, the substrate including a cell array region and an extension region at least partially surrounding the cell array region; a common source plate (CSP) over the lower circuit patterns; a gate electrode structure on the CSP, the gate electrode structure including gate electrodes spaced apart from each other in a first direction perpendicular to an upper surface of the substrate, each of the gate electrodes extending in a second direction parallel to the upper surface of the substrate; a memory channel structure extending through the gate electrode structure on the cell array region and contacting an upper surface of the CSP, the memory channel structure including: a channel extending in the first direction; and a charge storage structure on an outer sidewall of the channel; a division pattern at each of opposite sides of the gate electrode structure in a third direction, the third direction being parallel to the upper surface of the substrate and crossing the second direction, the division pattern extending in the second direction; an insulation pattern structure extending through a portion of the gate electrode structure on the CSP; a through via extending in the first direction through the insulation pattern structure and the CSP, the through via contacting one of the lower circuit patterns and electrically connected thereto; a contact plug extending in the first direction to contact an upper surface of an end portion in the second direction of one of the gate electrodes; a first support structure extending in the first direction through the gate electrode structure and contacting an upper surface of the CSP, the first support structure being adjacent to the contact plug; and a second support structure extending in the first direction through a portion of the gate electrode structure between the insulation pattern structure and the division pattern, and contacting an upper surface of the CSP. The second support structure may have a shape of "C," "U," or "T" in a plan view.

Embodiments are directed to a massive data storage system, including: a semiconductor device having: a memory cell structure including: a gate electrode structure on a substrate, the gate electrode structure including gate electrodes spaced apart from each other in a first direction perpendicular to an upper surface of the substrate, each of the gate electrodes extending in a second direction parallel to the upper surface of the substrate; a channel extending in the first direction through the gate electrode structure; a division pattern at each of opposite sides of the gate electrode structure in a third direction, the third direction being parallel to the upper surface of the substrate and crossing the second direction, the division pattern extending in the second direction; an insulation pattern structure extending through a portion of the gate electrode structure; a through via extending in the first direction through the insulation pattern structure; and a support structure extending in the first direction through a portion of the gate electrode structure between the insulation pattern structure and the division pattern, the support structure including a first extension portion extending in the second direction in a plan view, and including a second extension portion connected to the first extension portion, the second extension portion extending in the third direction from the first extension portion; peripheral circuit wirings configured to apply electrical signals to the memory cell structure; and an input/output pad electrically connected to the peripheral circuit wirings; and a controller electrically connected to the semiconductor device through the input/output pad, the controller configured to control the semiconductor device.

BRIEF DESCRIPTION OF THE DRAWINGS

Features will become apparent to those of skill in the art by describing in detail example embodiments with reference to the attached drawings in which:

FIG. 47 is a cross-sectional view illustrating a semiconductor device in accordance with example embodiments, which may correspond to FIG. 37.

DETAILED DESCRIPTION

Figure 1:
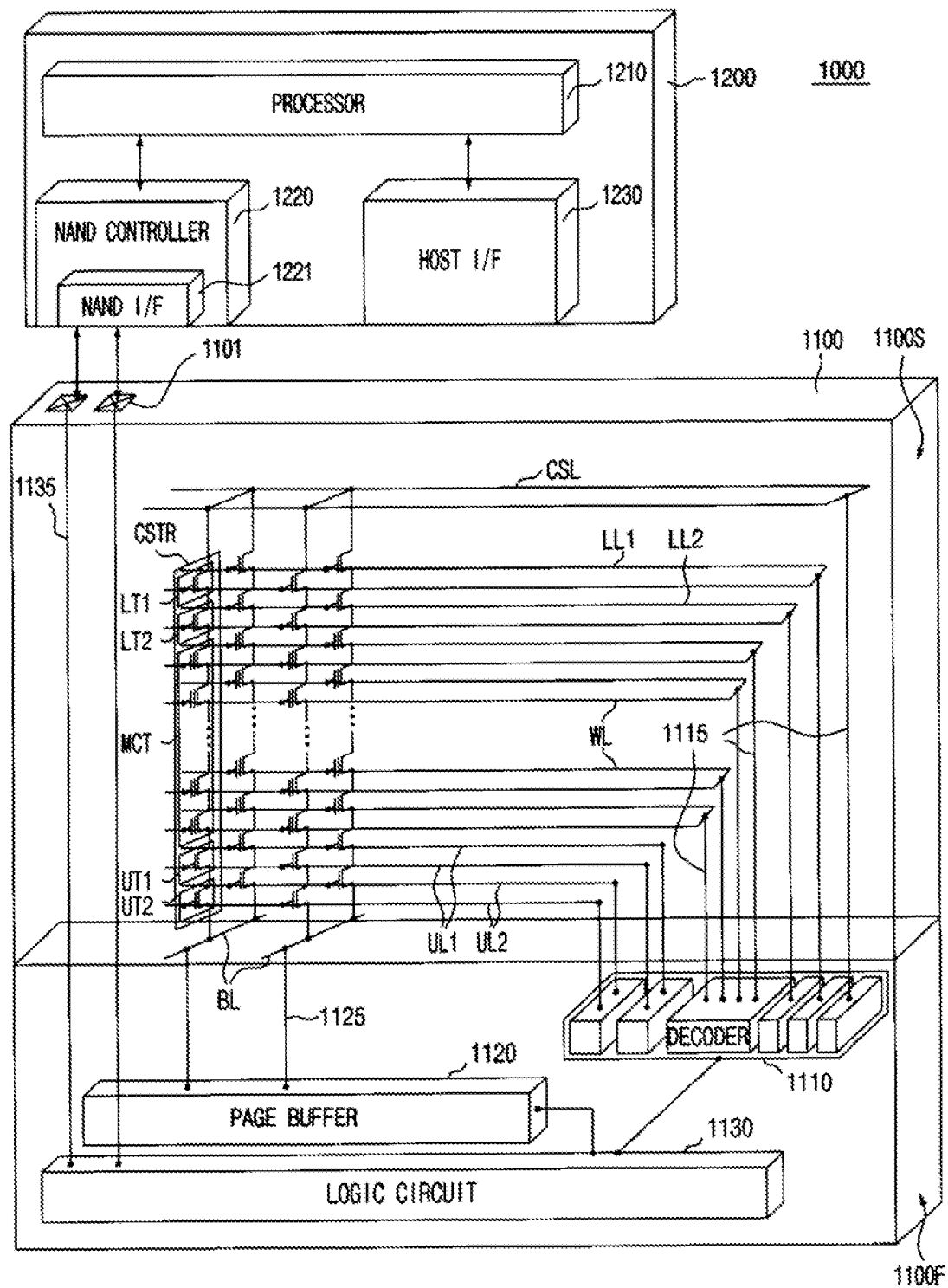
FIG. 1 is a schematic diagram illustrating an electronic system including a semiconductor device in accordance with example embodiments.

FIG. 1 is a schematic diagram illustrating an electronic system including a semiconductor device in accordance with example embodiments.

Referring to FIG. 1, an electronic system 1000 may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be a solid state drive (SSD) device, a universal serial bus (USB) device, a computing system, a medical device, or a communication device that may include one or a plurality of semiconductor devices 1100.

The semiconductor device 1100 may be a non-volatile memory device, e.g., a NAND flash memory device that will be illustrated with reference to FIGS. 36 to 47. The semiconductor device 1100 may include a first structure 1100F and a second structure 1100S on the first structure 1100F. In the drawing, the first structure 1100F is disposed under the second structure 1100S, but embodiments are not limited thereto, and it may be disposed beside or on the second structure 1100S. The first structure 1100F may be a peripheral circuit structure including a decoder circuit 1110, a page buffer 1120, and a logic circuit 1130. The second structure 1100S may be a memory cell structure including a bit line BL, a common source line CSL, word lines WL, first and second upper gate lines UL1 and UL2, first and second lower gate lines LL1 and LL2, and memory cell strings CSTR between the bit line BL and the common source line CSL.

In the second structure 1100S, each of the memory cell strings CSTR may include lower transistors LT1 and LT2 adjacent to the common source line CSL, upper transistors UT1 and UT2 adjacent to the bit line BL, and a plurality of memory cell transistors MCT between the lower transistors LT1 and LT2 and the upper transistors UT1 and UT2. The number of the lower transistors LT1 and LT2 and the number of the upper transistors UT1 and UT2 may be varied in accordance with example embodiments.

In example embodiments, the upper transistors UT1 and UT2 may include string selection transistors, and the lower transistors LT1 and LT2 may include ground selection transistors. The lower gate lines LL1 and LL2 may be gate electrodes of the lower transistors LT1 and LT2, respectively. The word lines WL may be gate electrodes of the memory cell transistors MCT, respectively, and the upper gate lines UL1 and UL2 may be gate electrodes of the upper transistors UT1 and UT2, respectively.

In example embodiments, the lower transistors LT1 and LT2 may include a lower erase control transistor LT1 and a ground selection transistor LT2 that may be connected with each other in series. The upper transistors UT1 and UT2 may include a string selection transistor UT1 and an upper erase control transistor UT2. At least one of the lower erase control transistor LT1 and the upper erase control transistor UT2 may be used in an erase operation for erasing data stored in the memory cell transistors MCT through gate induced drain leakage (GIDL) phenomenon.

The common source line CSL, the first and second lower gate lines LL1 and LL2, the word lines WL, and the first and second upper gate lines UL1 and UL2 may be electrically connected to the decoder circuit 1110 through first connection wirings 1115 extending to the second structure 1100S in the first structure 1100F. The bit lines BL may be electrically connected to the page buffer 1120 through second connection wirings 1125 extending to the second structure 1100S in the first structure 1100F.

In the first structure 1100F, the decoder circuit 1110 and the page buffer 1120 may perform a control operation for at least one selected memory cell transistor MCT among the plurality of memory cell transistors MCT. The decoder circuit 1110 and the page buffer 1120 may be controlled by the logic circuit 1130. The semiconductor device 1100 may communicate with the controller 1200 through an input/output pad 1101 electrically connected to the logic circuit 1130. The input/output pad 1101 may be electrically connected to the logic circuit 1130 through an input/output connection wiring 1135 extending to the second structure 1100S in the first structure 1100F.

The controller 1200 may include a processor 1210, a NAND controller 1220, and a host interface 1230. The electronic system 1000 may include a plurality of semiconductor devices 1100, and in this case, the controller 1200 may control the plurality of semiconductor devices 1100.

The processor 1210 may control operations of the electronic system 1000 including the controller 1200. The processor 1210 may be operated by firmware, and may control the NAND controller 1220 to access the semiconductor device 1100. The NAND controller 1220 may include a NAND interface 1221 for communicating with the semiconductor device 1100. Through the NAND interface 1221, control commands for controlling the semiconductor device 1100, data to be written in the memory cell transistors MCT of the semiconductor device 1100, data to be read from the memory cell transistors MCT of the semiconductor device 1100, etc., may be transferred. The host interface 1230 may provide communication between the electronic system 1000 and an outside host. When a control command is received from the outside host through the host interface 1230, the processor 1210 may control the semiconductor device 1100 in response to the control command.

Figure 2:
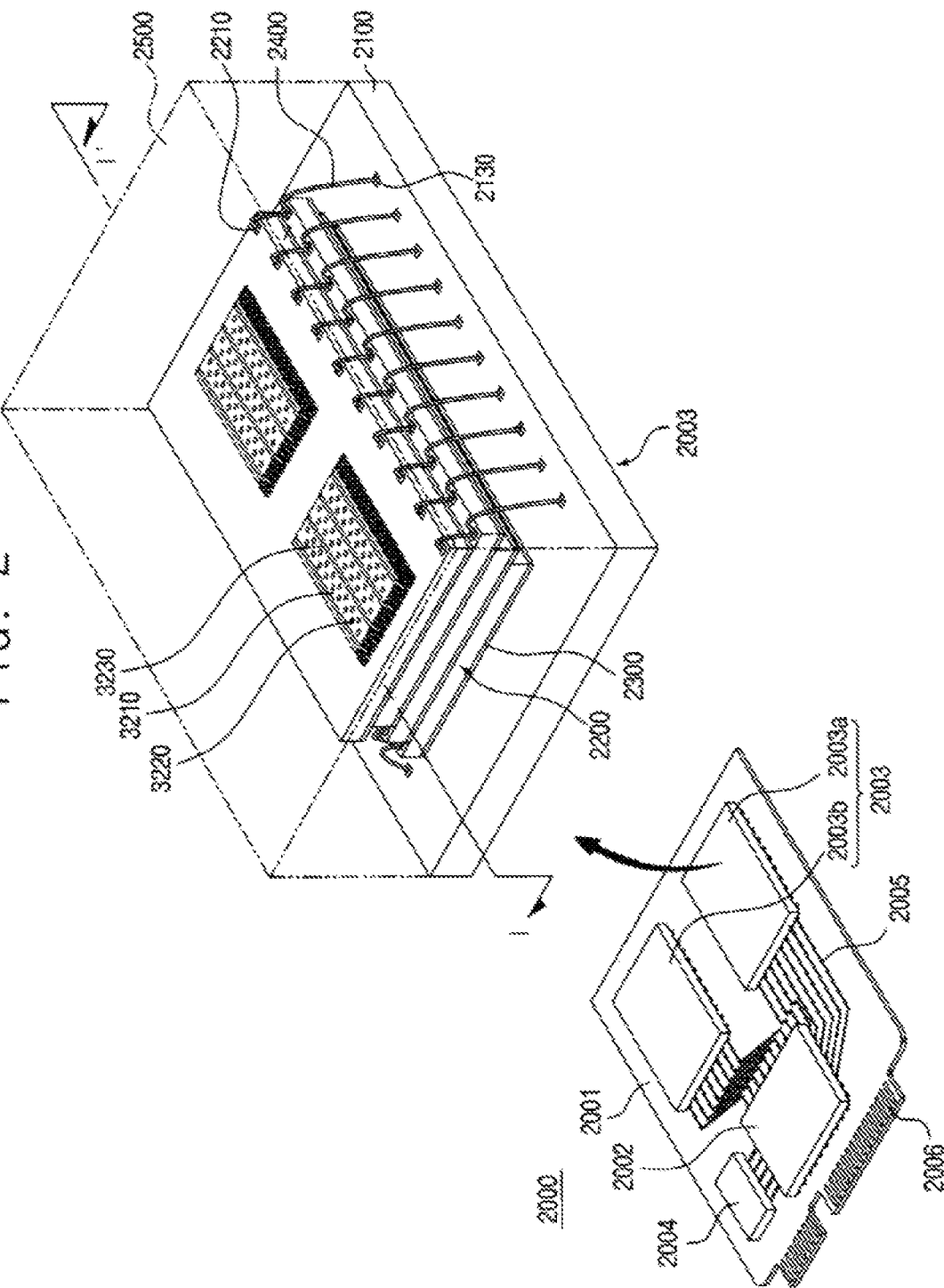
FIG. 2 is a schematic perspective view illustrating an electronic system including a semiconductor device in accordance with example embodiments.

FIG. 2 is a schematic perspective view illustrating an electronic system including a semiconductor device in accordance with example embodiments.

Referring to FIG. 2, an electronic system 2000 may include a main substrate 2001, a controller 2002 mounted on the main substrate 2001, at least one semiconductor package 2003, and a dynamic random access memory (DRAM) device 2004. The semiconductor package 2003 and the DRAM device 2004 may be connected to the controller 2002 through wiring patterns 2005 on the main substrate 2001.

The main substrate 2001 may include a connector 2006 having a plurality of pins to connect to an outside host. The number and layout of the plurality pins in the connector 2006 may be changed depending on communication interface between the electronic system 2000 and the outside host. In example embodiments, the electronic system 2000 may communicate with the outside host according to one of a USB, peripheral component interconnect express (PCI-Express), serial advanced technology attachment (SATA), M-Phy for universal flash storage (UFS), etc. In example embodiments, the electronic system 2000 may be operated by power provided from the outside host through the connector 2006. The electronic system 2000 may further include a power management integrated circuit (PMIC) for distributing the power provided from the outside host to the controller 2002 and the semiconductor package 2003.

The controller 2002 may write data in the semiconductor package 2003 or read data from the semiconductor package 2003, and may enhance the operation speed of the electronic system 2000.

The DRAM device 2004 may be a buffer memory for reducing a speed difference between the semiconductor package 2003 for storing data and the outside host. The DRAM device 2004 may serve as a cache memory, and may provide a space for temporarily storing data during the control operation for the semiconductor package 2003. If the electronic system 2000 includes the DRAM device 2004, the controller 2002 may further include a DRAM controller for controlling the DRAM device 2004 in addition to a NAND controller for controlling the semiconductor package 2003.

The semiconductor package 2003 may include first and second semiconductor packages 2003*a* and 2003*b* spaced apart from each other. The first and second semiconductor packages 2003*a* and 2003*b* may each include a plurality of semiconductor chips 2200. Each of the first and second semiconductor packages 2003*a* and 2003*b* may include a package substrate 2100, the semiconductor chips 2200, bonding layers 2300 disposed under the semiconductor chips 2200, a connection structure 2400 for electrically connecting the semiconductor chips 2200 and the package substrate 2100, and a mold layer 2500 covering the semiconductor chips 2200 and the connection structure 2400 on the package substrate 2100.

The package substrate 2100 may be a printed circuit board (PCB) having package upper pads 2130. Each semiconductor chip 2200 may include an input/output pad 2210. The input/output pad 2210 may correspond to the input/output pad 1101 of FIG. 1. Each semiconductor chip 2200 may include gate electrode structures 3210, memory channel structures 3220 extending through the gate electrode structures 3210, and division structures 3230 for dividing the gate electrode structures 3210. Each semiconductor chip 2200 may include a semiconductor device that will be illustrated with reference to FIGS. 36 to 47.

In example embodiments, the connection structure 2400 may be a bonding wire for electrically connecting the input/output pad 2210 and the package upper pads 2130. Thus, in the first and second semiconductor packages 2003*a* and 2003*b*, the semiconductor chips 2200 may be electrically connected with each other by a bonding wire method, and may be electrically connected to the package upper pads 2130 of the package substrate 2100. Alternatively, in each of the first and second semiconductor packages 2003*a* and 2003*b*, the semiconductor chips 2200 may be electrically connected with each other by a connection structure including through a silicon via (TSV), instead of the connection structure 2400 of the bonding wire method.

In example embodiments, the controller 2002 and the semiconductor chips 2200 may be included in one package. In example embodiments, the controller 2002 and the semiconductor chips 2200 may be mounted on an interposer substrate that is different from the main substrate 2001, and the controller 2002 and the semiconductor chips 2200 may be connected with each other by a wiring on the interposer substrate.

Figure 3:
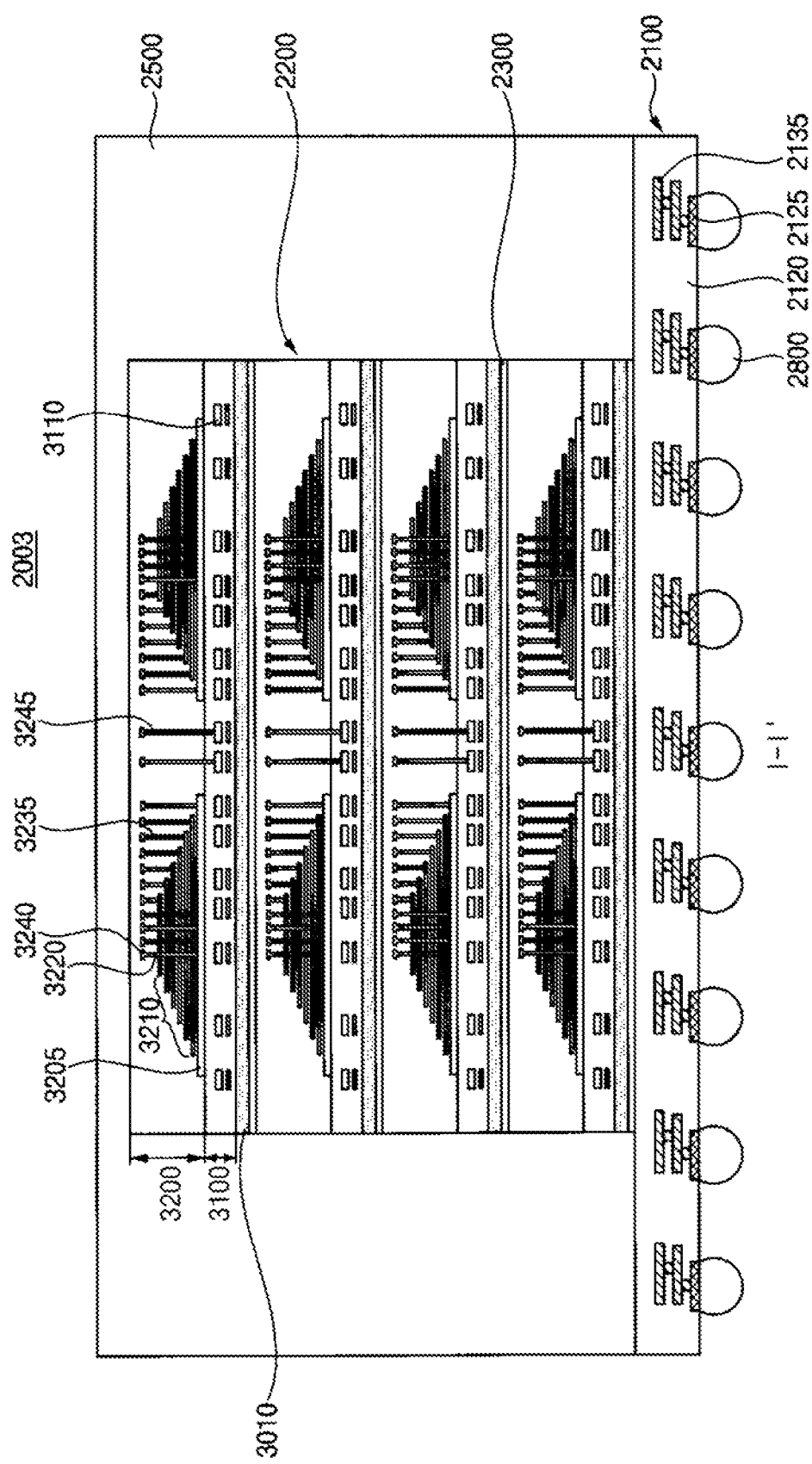
FIGS. 3 and 4 are schematic cross-sectional views illustrating semiconductor packages each of which may include a semiconductor device in accordance with example embodiments.
Figure 4:
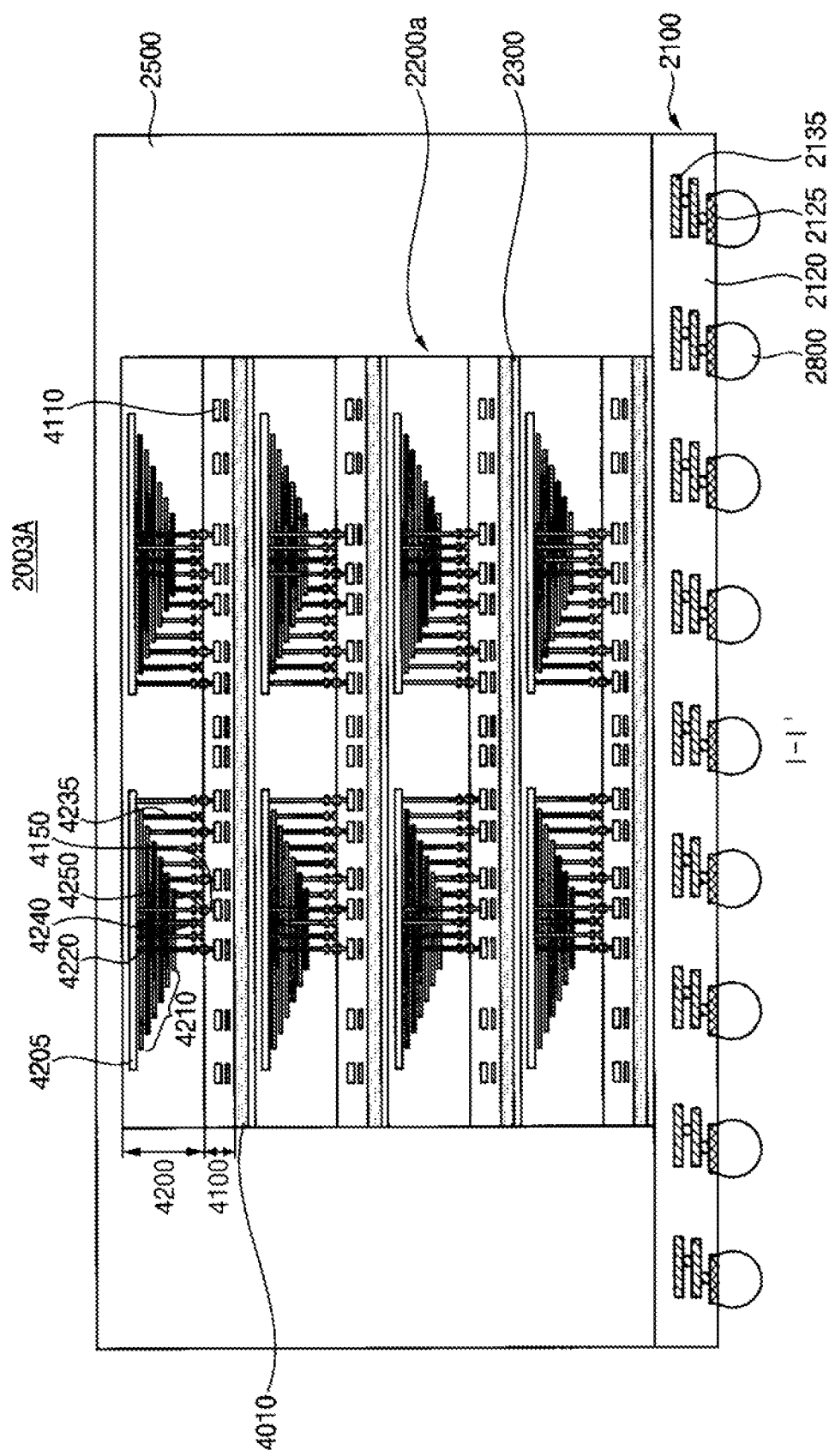

FIGS. 3 and 4 are schematic cross-sectional views illustrating semiconductor packages that may each include a semiconductor device in accordance with example embodiments. FIGS. 3 and 4 illustrate example embodiments of the semiconductor package 2003 shown in FIG. 2, and show a cross-section taken along a line I-I' of the semiconductor package 2003 in FIG. 2.

Referring to FIG. 3, in the semiconductor package 2003, the package substrate 2100 may be a PCB. The package substrate 2100 may include a substrate body part 2120, upper pads 2130 (refer to FIG. 2) on an upper surface of the substrate body part 2120, lower pads 2125 on a lower surface of the substrate body part 2120 or exposed through the lower surface of the substrate body part 2120, and inner wirings 2135 for electrically connecting the upper pads 2130 and the lower pads 2125 in an inside of the substrate body part 2120. The upper pads 2130 may be electrically connected to the connection structures 2400. The lower pads 2125 may connect to wiring patterns 2005 of the main substrate 2010 in the electronic system 2000 through conductive connection parts 2800, as shown in FIG. 2.

Each semiconductor chip 2200 may include a semiconductor substrate 3010, and a first structure 3100 and a second structure 3200 sequentially stacked on the semiconductor substrate 3010. The first structure 3100 may include a peripheral circuit region in which peripheral circuit wirings 3110 may be formed. The second structure 3200 may include a common source line 3205, a gate electrode structure 3210 on the common source line 3205, memory channel structures 3220 and division structures 3230 (refer to FIG. 2) extending through the gate electrode structure 3210, bit lines 3240 electrically connected to the memory channel structures 3220, and gate connection wirings 3235 electrically connected to the word lines WL of the gate electrode structure 3210 (refer to FIG. 1).

The second structure 3200 may further include first to third support structures 432, 434, and 436 as illustrated in FIGS. 11 to 13, FIG. 34, and FIGS. 36 to 39.

Each semiconductor chip 2200 may include a through wiring 3245 that is electrically connected to the peripheral circuit wirings 3110 of the first structure 3100 and extends in the second structure 3200. The through wiring 3245 may be disposed at an outside of the gate electrode structure 3210, and some through wirings 3245 may extend through the gate electrode structure 3210. Each semiconductor chip 2200 may further include the input/output pad 2210 (refer to FIG. 2) electrically connected to the peripheral circuit wirings 3110 of the first structure 3100.

Referring to FIG. 4, in a semiconductor package 2003A, each semiconductor chip 2200a may include a semiconductor substrate 4010, a first structure 4100 on the semiconductor substrate 4010, and a second structure 4200 on and bonded with the first structure 4100 by a wafer bonding method.

The first structure 4100 may include a peripheral circuit region in which a peripheral circuit wiring 4110 and first bonding structures 4150 may be formed. The second structure 4200 may include a common source line 4205, a gate electrode structure 4210 between the common source line 4205 and the first structure 4100, memory channel structures 4220 and the division structure 3230 (refer to FIG. 2) extending through the gate electrode structure 4210, and second bonding structures 4250 electrically connected to the memory channel structures 4220 and the word lines WL (refer to FIG. 1) of the gate electrode structure 4210. For example, the second bonding structures 4250 may be electrically connected to the memory channel structures 4220 and the word lines WL (refer to FIG. 1) through the bit lines 4240 electrically connected to the memory channel structures 4220 and the gate connection wirings 4235 electrically connected to the word lines WL (refer to FIG. 1), respectively. The first bonding structures 4150 of the first structure 4100 and the second bonding structures 4250 of the second structure 4200 may contact each other to be bonded with each other. The first bonding structures 4150 and the second bonding structures 4250 may include, e.g., copper, and may be bonded by copper-copper bonding.

The second structure 4200 may further include the first to third support structures 432, 434, and 436 as shown in FIGS. 11 to 13, FIG. 34, and FIGS. 36 to 39.

Each semiconductor chip 2200a may further include the input/output pad 2210 (refer to FIG. 2) electrically connected to the peripheral circuit wirings 4110 of the first structure 4100.

The semiconductor chips 2200 of FIG. 3 and the semiconductor chips 2200a of FIG. 4 may be electrically connected with each other by the connection structures 2400 in a bonding wire method. However, in example embodiments, semiconductor chips such as the semiconductor chips 2200 of FIG. 3 and the semiconductor chips 2200a of FIG. 4 in the same semiconductor package may be electrically connected with each other by a connection structure including a TSV.

FIGS. 5 to 39 are plan views and cross-sectional views illustrating a method of manufacturing a vertical memory device in accordance with example embodiments. Particularly, FIGS. 5-6, 10-13, 17, 22, 29, 32, and 34 are the plan views, and the FIGS. 7-9, 14-16, 18-21, 23-28, 30-31, 33, and 35-39 are the cross-sectional views.

Figure 11:
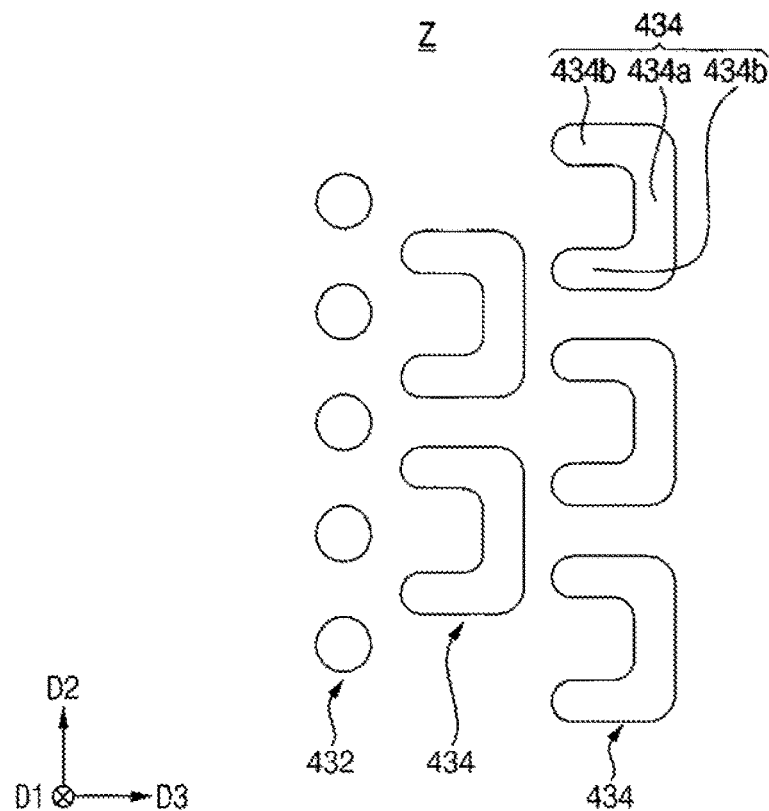
Figure 12:
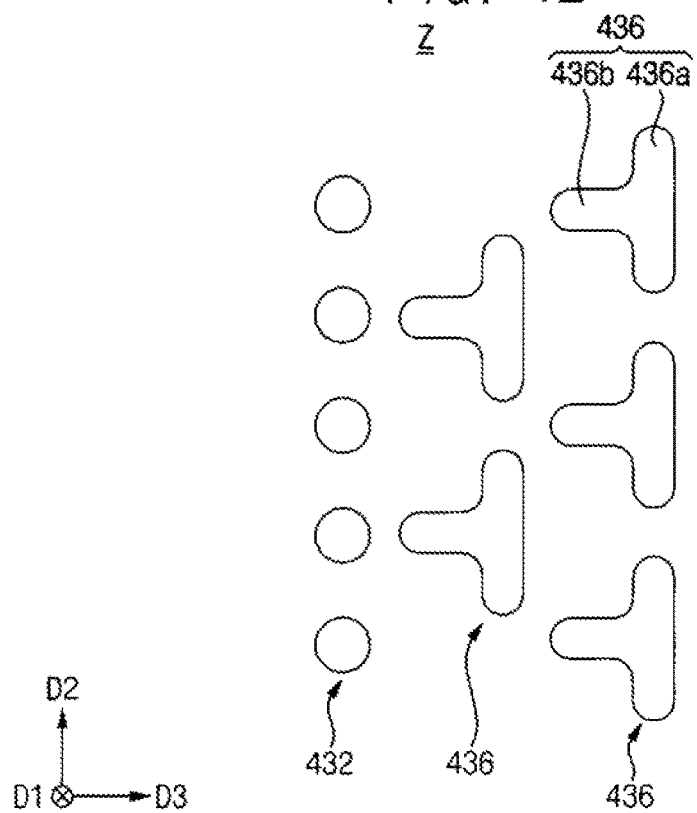
Figure 13:
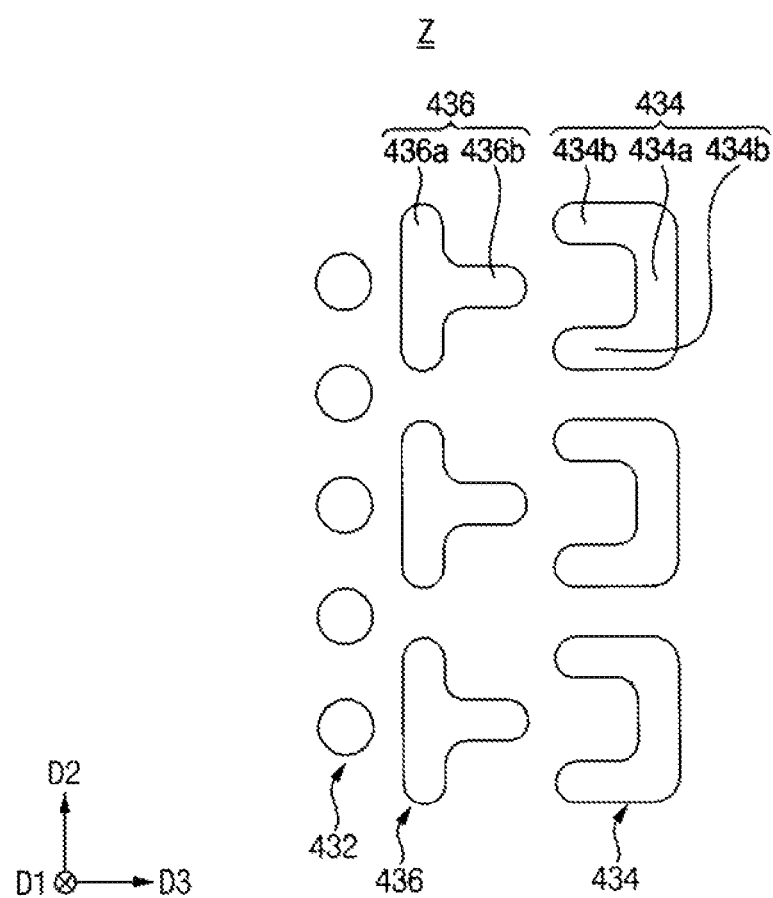
Figure 14:
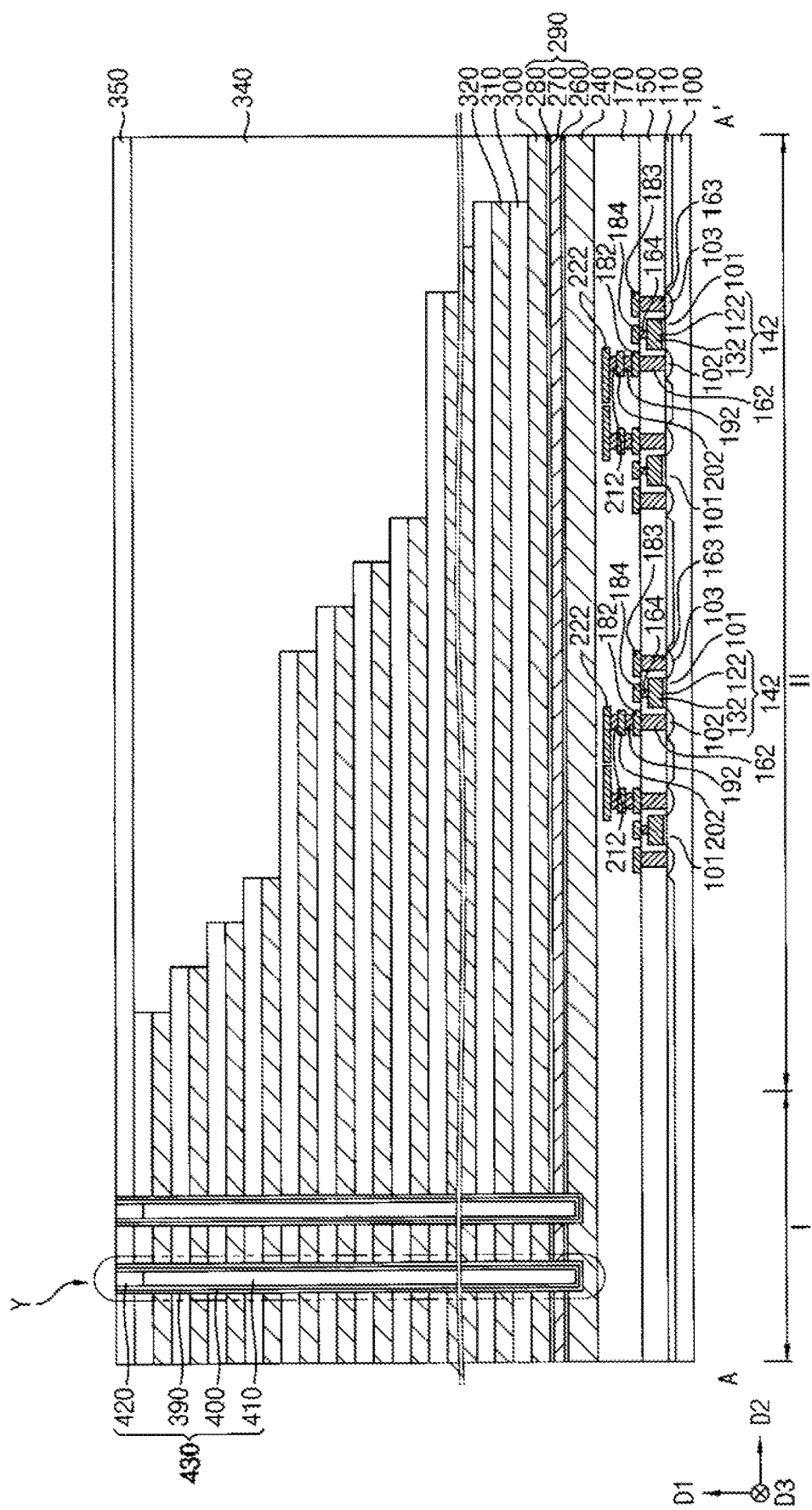
Figure 15:
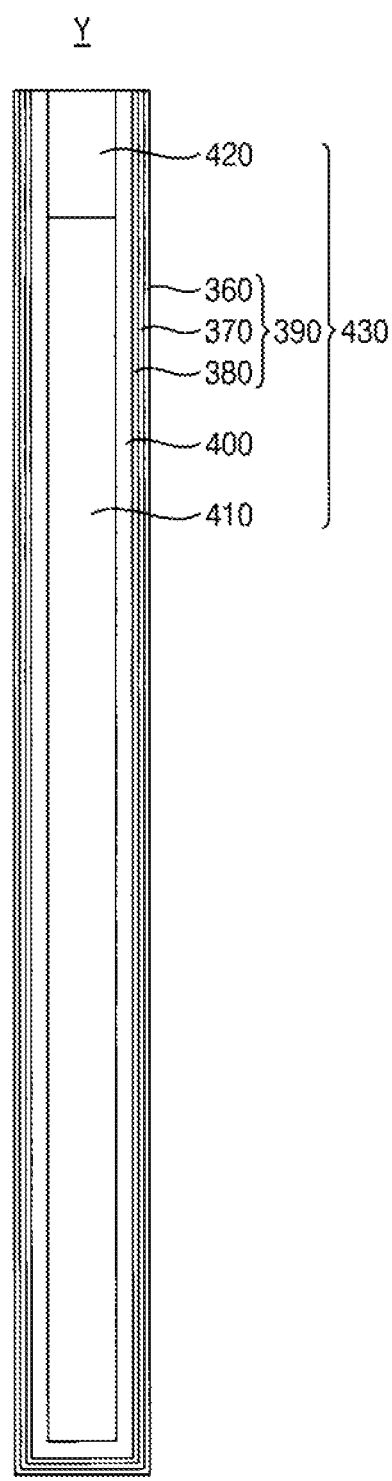
Figure 16:
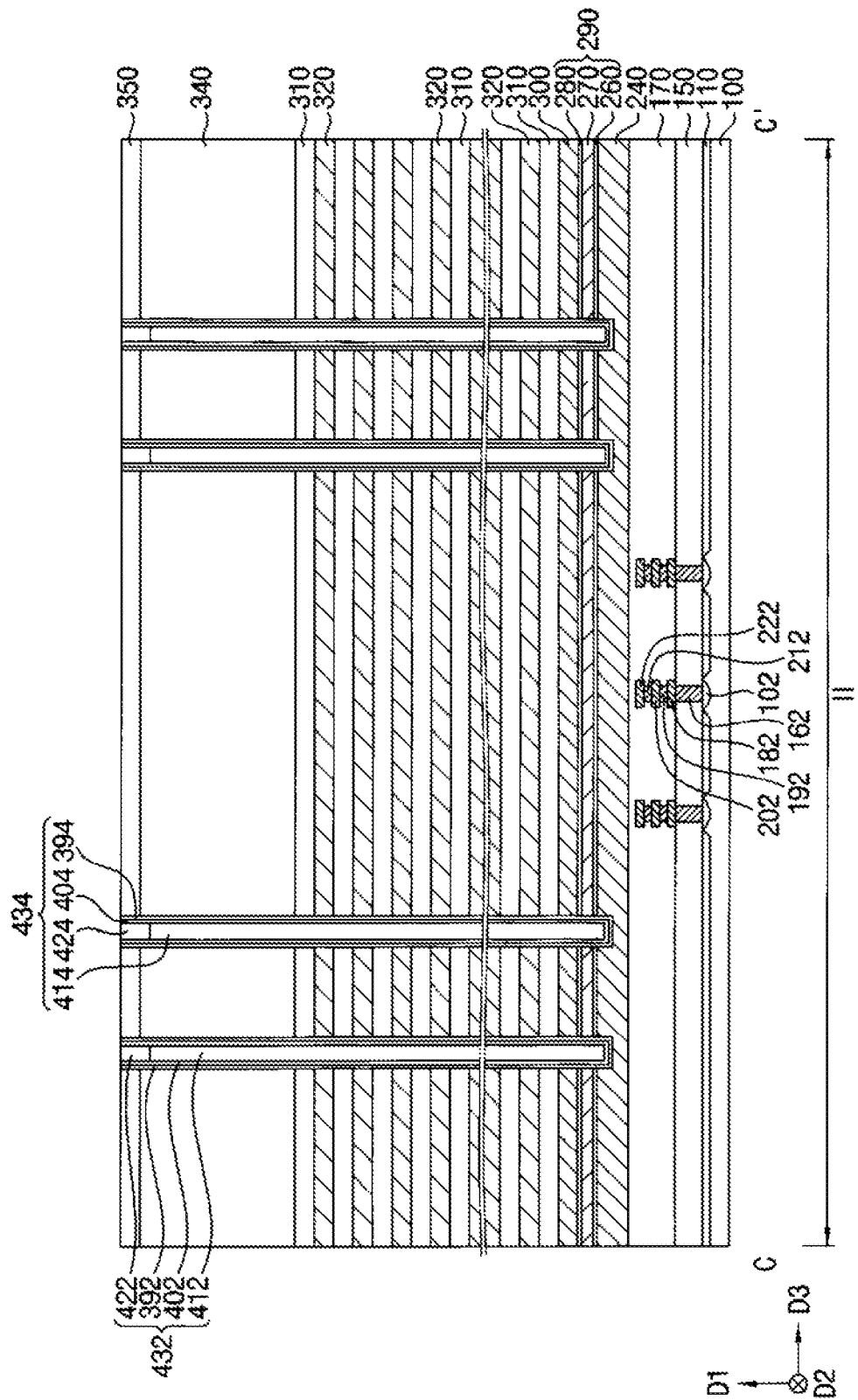
Figure 39:
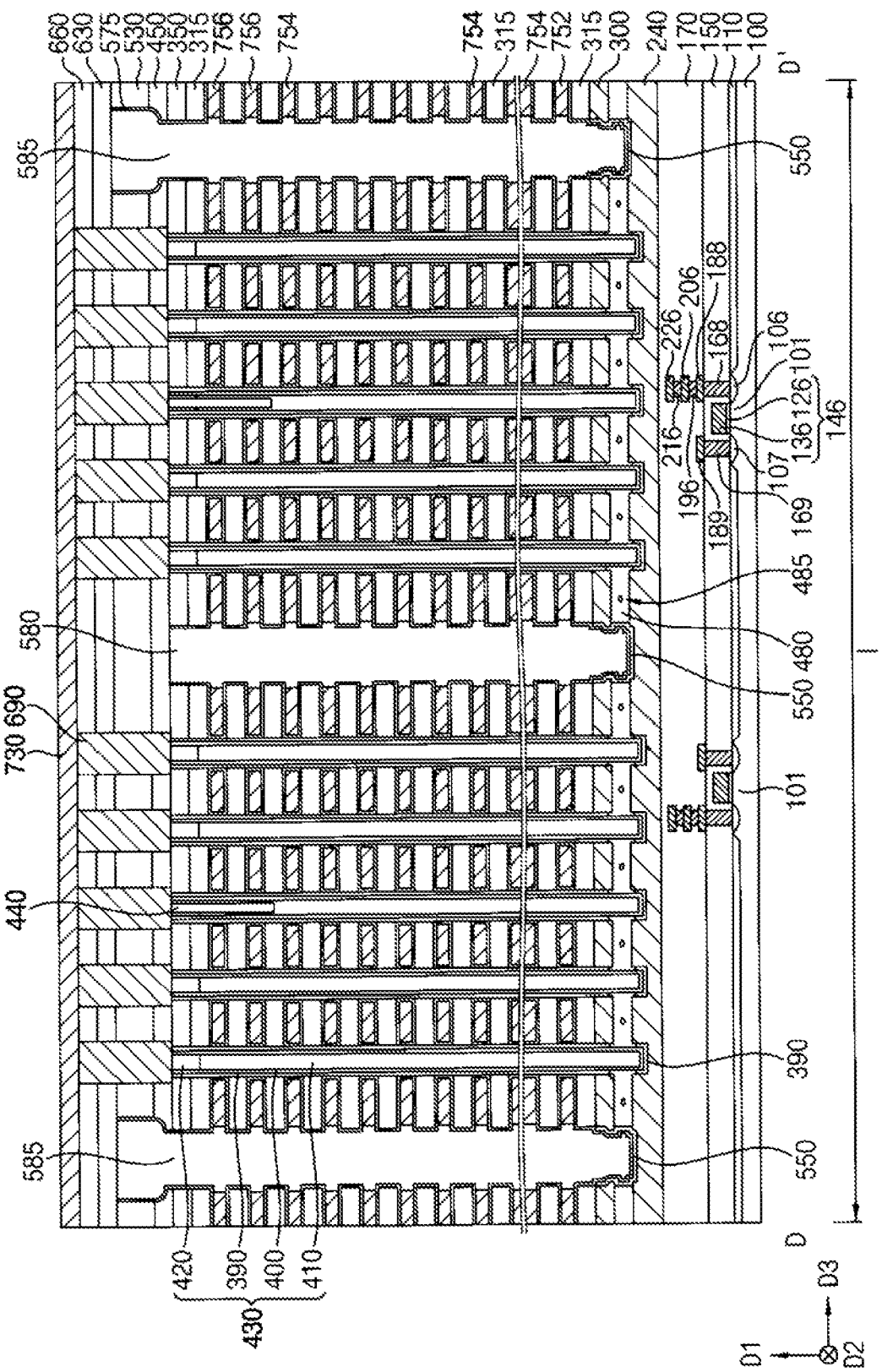

FIGS. 7-9, 14-15, 33, and 35-36 are cross-sectional views taken along lines A-A', respectively, of corresponding plan views. FIGS. 18-21, 23-25, 27, 30, and 37 are cross-sectional views taken along lines B-B', respectively, of corresponding plan views. FIGS. 16, 26, 28, 31, and 38 are cross-sectional views taken along lines C-C', respectively, of corresponding plan views. FIG. 39 is a cross-sectional view taken along a line D-D' of a corresponding plan view. FIGS. 6 to 39 are drawings of region X in FIG. 5. FIGS. 11 to 13 are enlarged cross-sectional views of region Z in FIG. 10. FIG. 15 is an enlarged cross-sectional view of region Y in FIG. 14.

Hereinafter, in the specification (but not necessarily in the claims) a direction substantially perpendicular to an upper surface of a first substrate may be defined as a first direction D1, and two directions substantially parallel to the upper surface of the first substrate and crossing each other may be defined as second and third directions D2 and D3, respectively. In example embodiments, the second and third directions D2 and D3 may be substantially perpendicular to each other.

Figure 5:
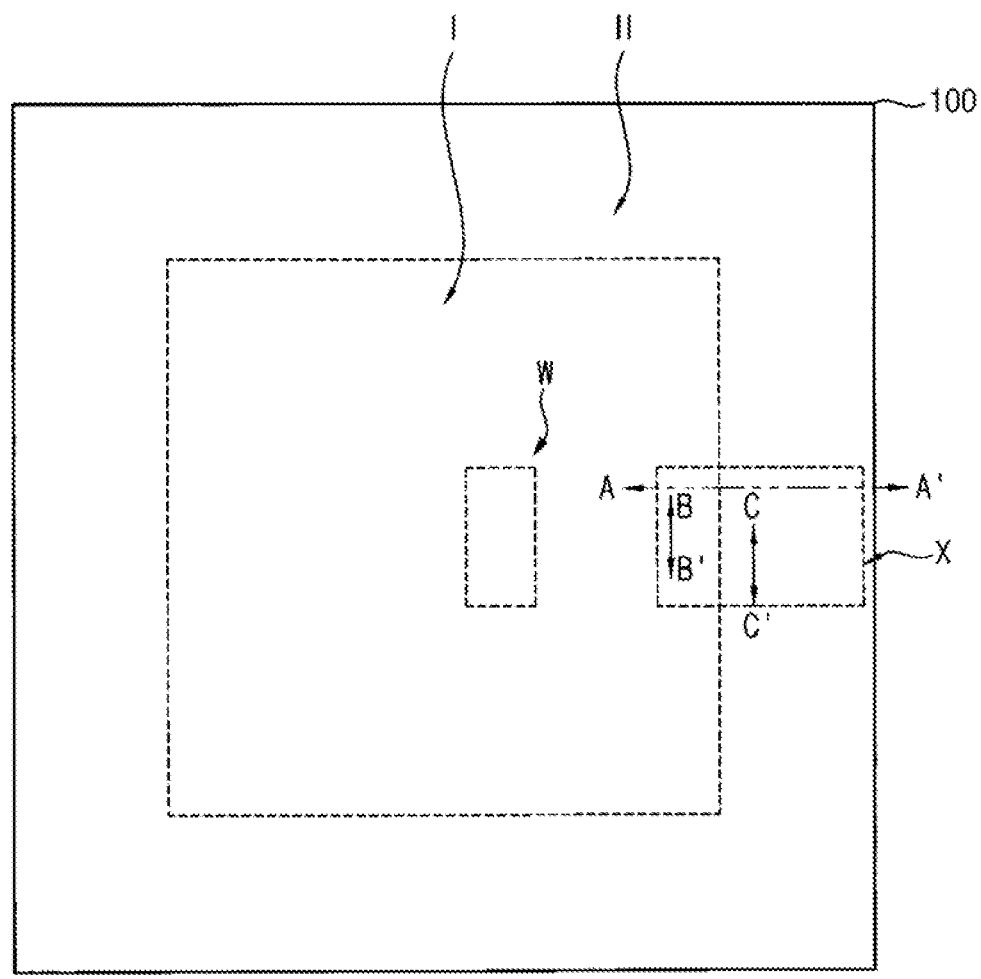
FIGS. 5 to 39 are plan views and cross-sectional views illustrating a method of manufacturing a vertical memory device in accordance with example embodiments.

Referring to FIG. 5, a substrate 100 may include a first region I and a second region II surrounding the first region I.

The substrate 100 may include silicon, germanium, silicon-germanium, or a Group III-V compound such as GaP, GaAs, GaSb, etc. In example embodiments, the substrate 100 may be a silicon-on-insulator (SOI) substrate or a germanium-on-insulator (GOI) substrate. In example embodiments, the substrate 100 may be doped with p-type impurities, e.g., boron or n-type impurities, e.g., phosphorus.

In example embodiments, the first region I may be a cell array region, the second region II be a pad region or extension region, and the first and second cell regions I and II together may form a cell region. Thus, memory cells (each of which may include a gate electrode, a channel, and a charge storage structure) may be formed on the first region I of the substrate 100, and upper contact plugs (for transferring electrical signals to the memory cells and pads of the gate electrodes contacting the upper contact plugs) may be formed on the second region II of the substrate 100. In the drawing, the second region II entirely surrounds the first region I, but embodiments are not limited thereto. For example, the second region II may be formed only on opposite sides in the second direction D2 of the first region I.

The substrate 100 may further include a third region surrounding the second region II, and upper circuit patterns for applying electrical signals to the memory cells through the upper contact plugs may be formed on the third region of the substrate 100.

Hereinafter, only structures in the region X partially including the first and second regions I and II of the substrate 100 will be illustrated.

Figure 6:
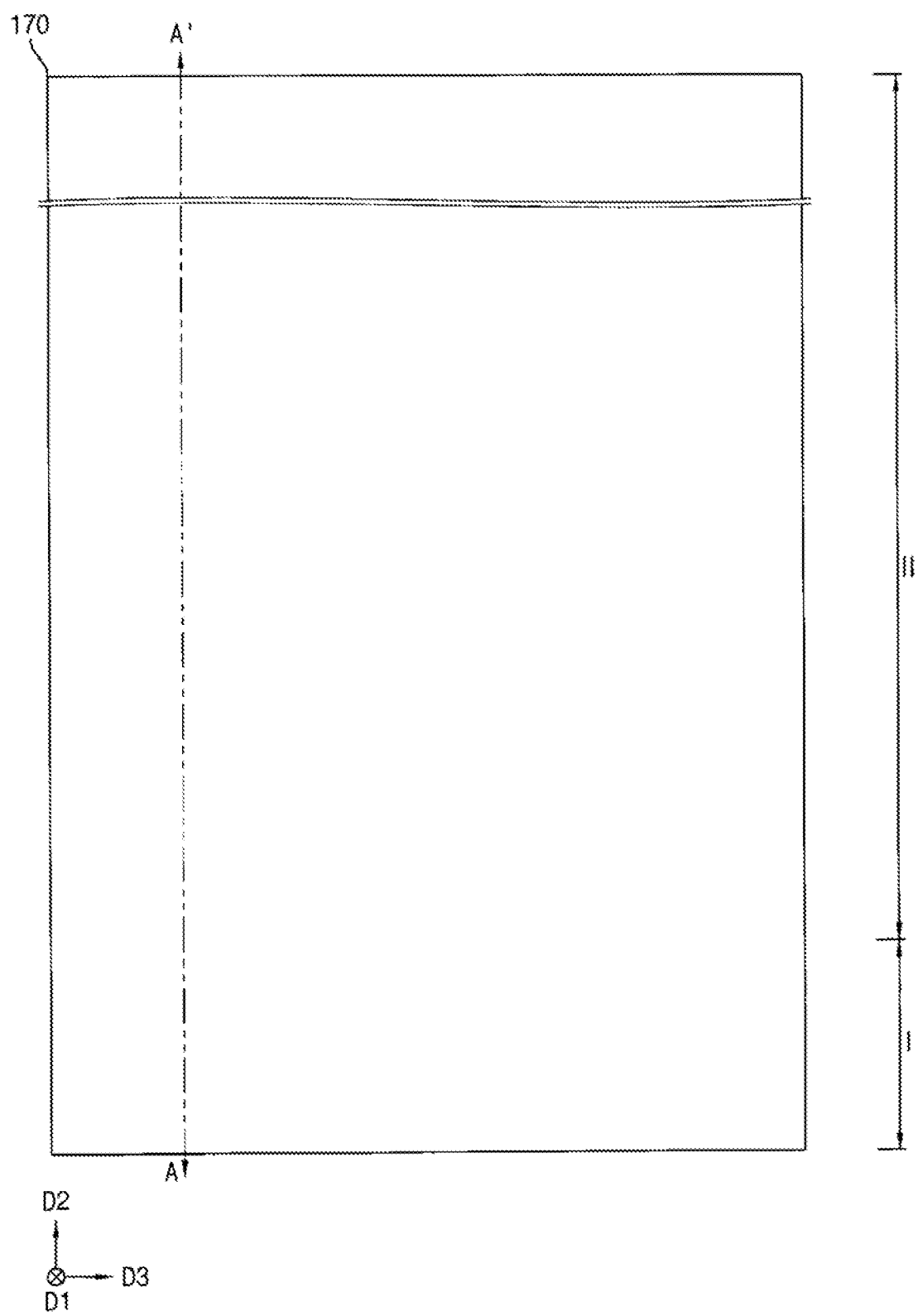
Figure 7:
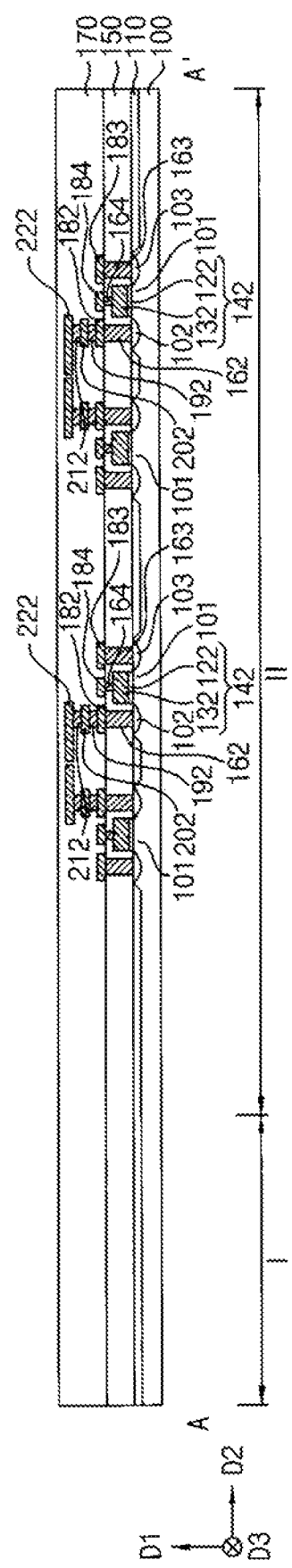

Referring to FIGS. 6 and 7, lower circuit patterns may be formed on the substrate 100, and first and second insulating interlayers 150 and 170 may be formed on the substrate 100 to cover the lower circuit patterns.

The substrate 100 may include a field region on which an isolation pattern 110 is formed and an active region 101 on which no isolation pattern is formed. The isolation pattern 110 may be formed by a shallow trench isolation (STI) process, and may include an oxide, e.g., silicon oxide.

In example embodiments, the semiconductor device may have a cell-over-periphery (COP) structure. Thus, the lower circuit patterns may be formed on the substrate 100, and memory cells, upper contact plugs, and upper circuit patterns may be formed over the lower circuit patterns.

The lower circuit patterns may include, e.g., transistors, lower contact plugs, lower wirings, lower vias, etc.

Figure 18:
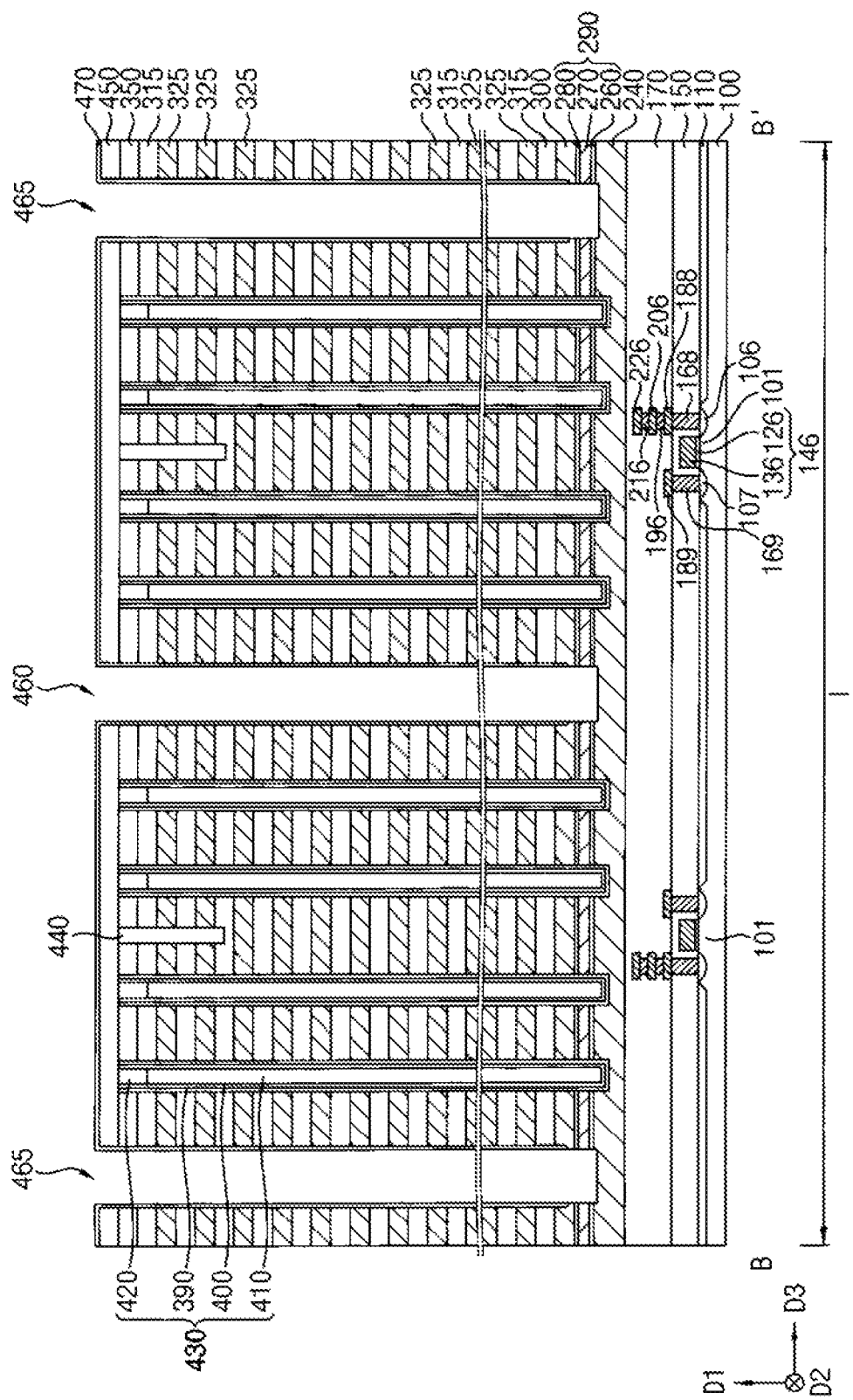

Referring to FIG. 18 together with FIGS. 6 and 7, e.g., first and second transistors may be formed on the second and first regions II and I, respectively, of the substrate 100. The first transistor may include a first lower gate structure 142 on the substrate 100, and first and second regions 102 and 103 serving as source/drain regions at upper portions of the active region 101 adjacent to the first lower gate structure 142. The second transistor may include a second lower gate structure 146 on the substrate 100, and third and fourth regions 106 and 107 serving as source/drain regions at upper portions of the active region 101 adjacent to the second lower gate structure 146.

The first lower gate structure 142 may include a first lower gate insulation pattern 122 and a first lower gate electrode 132 sequentially stacked on the substrate 100. The second lower gate structure 146 may include a second lower gate insulation pattern 126 and a second lower gate electrode 136 sequentially stacked on the substrate 100.

A first insulating interlayer 150 may be formed on the substrate 100 to cover the first and second transistors. First, second, fourth, and fifth lower contact plugs 162, 163, 168, and 169 extending through the first insulating interlayer 150 to contact the first to fourth impurity regions 102, 103, 106, and 107, respectively, and a third lower contact plug 164 extending through the first insulating interlayer 150 to contact the first lower gate electrode 132 may be formed.

First to fifth lower wirings 182, 183, 184, 188 and 189 may be formed on the first insulating interlayer 150 to contact upper surfaces of the first to fifth lower contact plugs 162, 163, 164, 168, and 169, respectively. A first lower via 192, a sixth lower wiring 202, a third lower via 212, and an eighth lower wiring 222 may be sequentially stacked on the first lower wiring 182. A second lower via 196, a seventh lower wiring 206, a fourth lower via 216 and a ninth lower wiring 226 may be sequentially stacked on the fourth lower wiring 188.

The second insulating interlayer 170 may be formed on the first insulating interlayer 150 to cover the first to ninth lower wirings 182, 183, 184, 188, 189, 202, 206, 222, and 226 and the first to fourth lower vias 192, 194, 212, and 216.

Each element included in the lower circuit patterns may be formed by, e.g., a patterning process and/or a damascene process.

Figure 8:
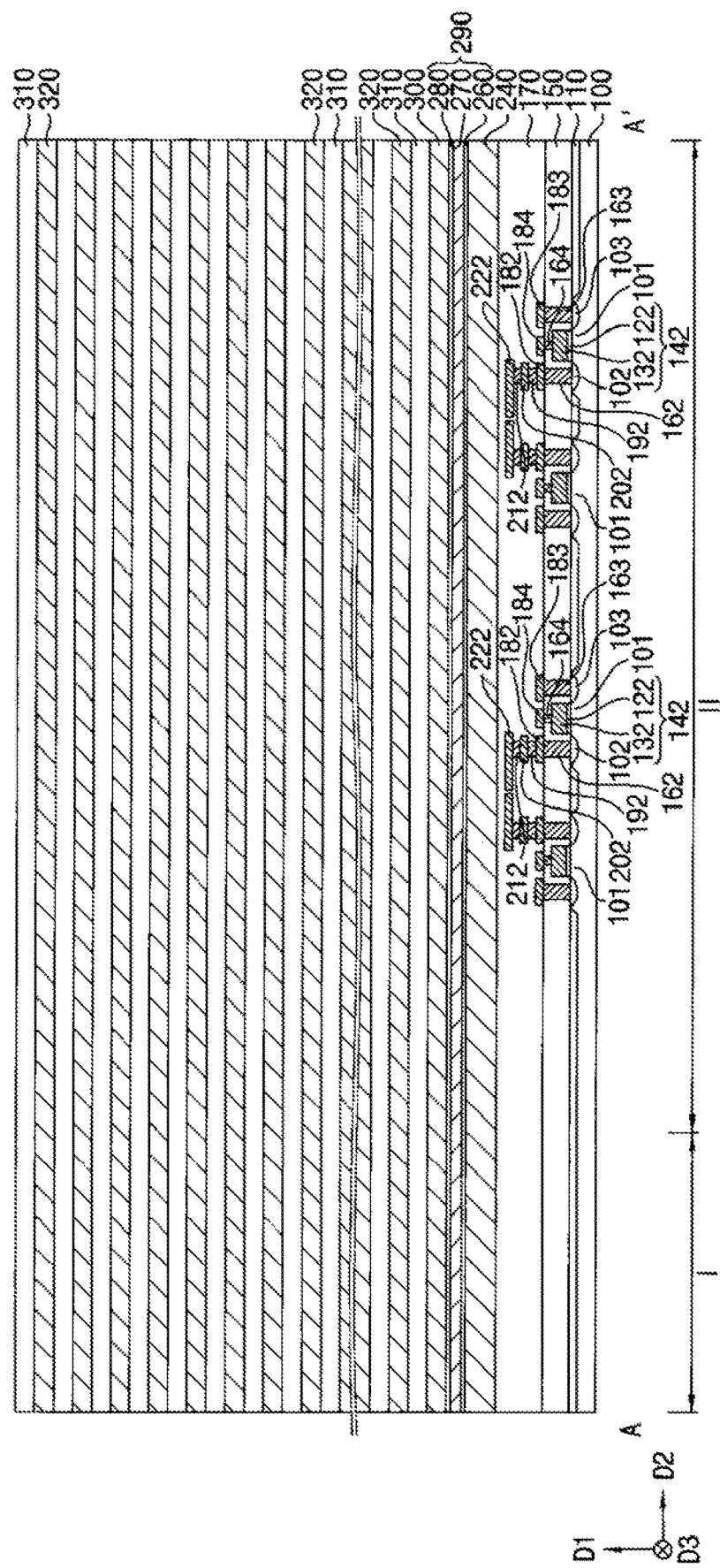

Referring to FIG. 8, a common source plate (CSP) 240, a first sacrificial layer structure 290, and a first support layer 300 may be sequentially formed on the second insulating interlayer 170.

The CSP 240 may include polysilicon doped with, e.g., n-type impurities. Alternatively, the CSP 240 may include a metal silicide layer and a polysilicon layer doped with, e.g., n-type impurities, sequentially stacked. The metal silicide layer may include, e.g., tungsten silicide.

The first sacrificial layer structure 290 may include first, second, and third sacrificial layers 260, 270, and 280 sequentially stacked in the first direction D1. The first and third sacrificial layers 260 and 280 may include an oxide, e.g., silicon oxide. The second sacrificial layer 270 may include a nitride, e.g., silicon nitride.

The first support layer 300 may include a material having an etching selectivity with respect to the first to third sacrificial layers 260, 270, and 280, e.g., polysilicon doped with n-type impurities. A portion of the first support layer 300 may extend through the first sacrificial layer structure 290 to contact an upper surface of the CSP 240, which may form a first support pattern.

An insulation layer 310 and a fourth sacrificial layer 320 may be alternately and repeatedly stacked on the first support layer 300, and thus a mold layer including the insulation layers 310 and the fourth sacrificial layers 320 alternately stacked may be formed on the first support layer 300. The insulation layer 310 may include an oxide, e.g., silicon oxide. The fourth sacrificial layer 320 may include a material having an etching selectivity with respect to the insulation layer 310, e.g., a nitride such as silicon nitride.

Figure 10:
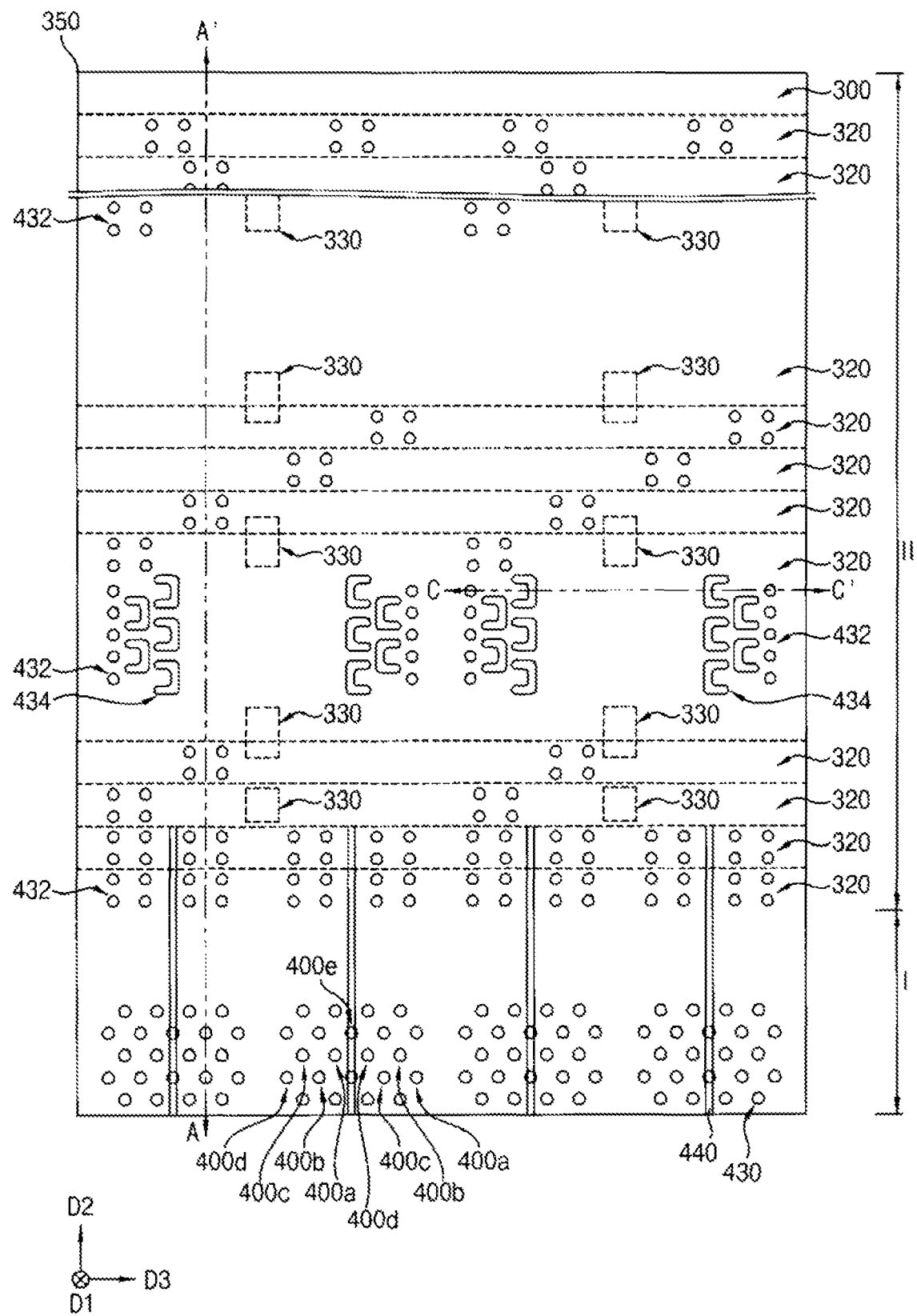

Referring to FIG. 10 together with FIG. 8, a first division pattern 330 may be formed through a portion of a lowermost one of the fourth sacrificial layers 320. The first division pattern 330 may be formed on the second region II of the substrate 100, and may include an oxide, e.g., silicon oxide. In example embodiments, a plurality of first division patterns 330 may be formed in each of the second and third directions D2 and D3.

Figure 9:
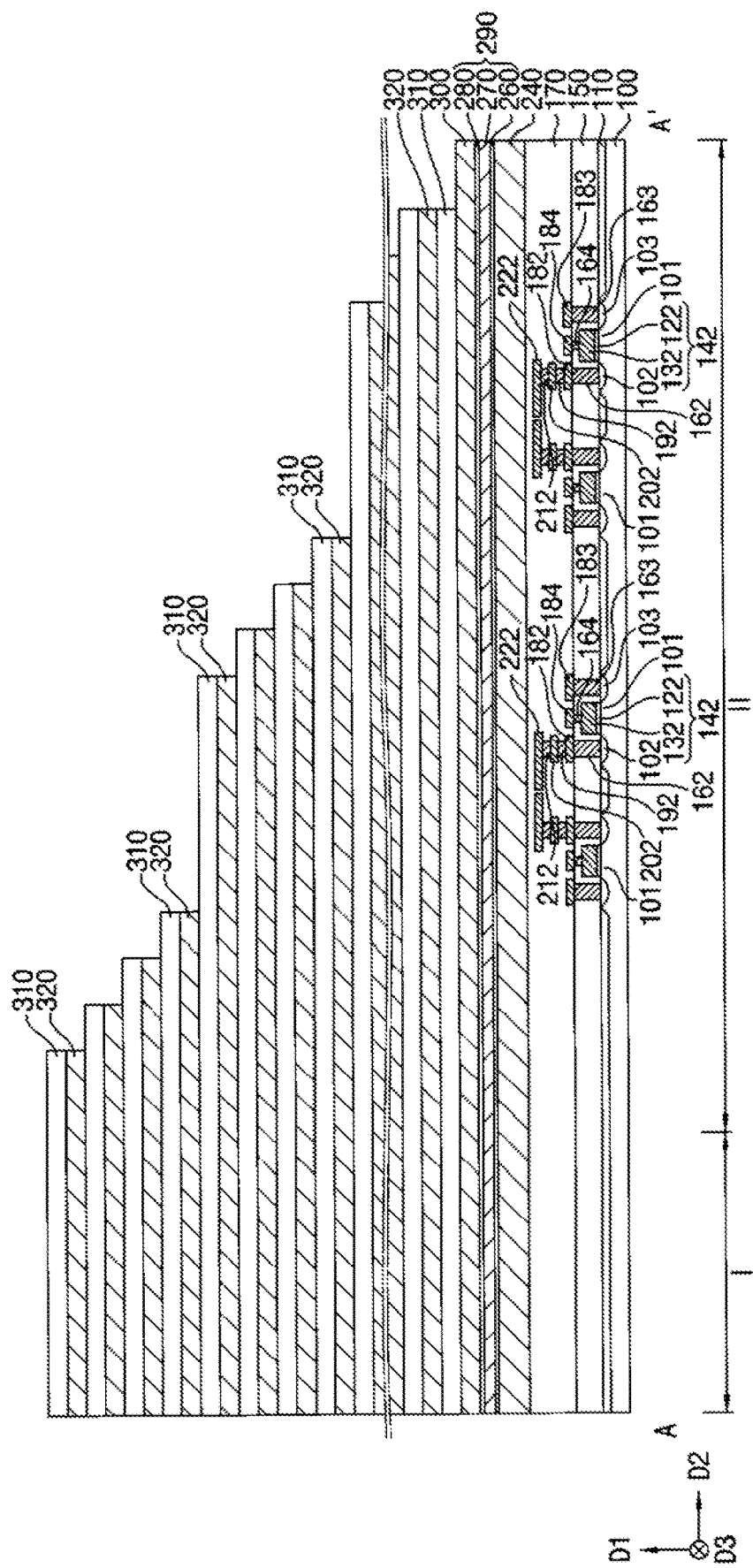

Referring to FIG. 9, a photoresist pattern (not shown) may be formed on an uppermost one of the insulation layers 310, and the uppermost one of the insulation layers 310 and an uppermost one of the fourth sacrificial layers 320 may be etched using the photoresist pattern as an etching mask. Thus, one of the insulation layers 310 directly under the uppermost one of the fourth sacrificial layers 320 may be partially exposed.

A trimming process in which an area of the photoresist pattern is reduced by a given ratio may be performed, and the uppermost one of the insulation layers 310, the uppermost one of the fourth sacrificial layers 320, the exposed one of the insulation layers 310, and one of the fourth sacrificial layers 320 directly under the exposed one of the insulation layers 310 may be etched using the photoresist pattern having the reduced area. The trimming process and the etching process may be alternately and repeatedly performed to form a mold having a staircase shape including a plurality of step layers each of which may include one fourth sacrificial layer 320 and one insulation layer 310 sequentially stacked.

Hereinafter, the "step layer" may be defined as not only an exposed portion but also a non-exposed portion of the fourth sacrificial layer 320 and the insulation layer 310 at the same level, and the exposed portion thereof may be defined as a "step." In example embodiments, the steps may be arranged in the second direction D2. Alternatively, the steps may also be arranged in the third direction D3.

In example embodiments, lengths in the second direction D2 of the steps included in the mold may be uniform except for lengths of some ones, which may be greater than the lengths of other ones. Hereinafter, ones of the steps having relatively small lengths may be referred to as first steps, and other ones of the steps having relatively large lengths may be referred to as second steps. FIG. 9 shows two second steps. The steps may be denoted by dotted lines in the drawings, hereinafter (see, e.g., FIG. 10).

The mold may be formed on the first support layer 300 on the first and second regions I and II of the substrate 100, and an edge upper surface of the first support layer 300 may not be covered by the mold but exposed. The steps of the mold may be formed on the second region II of the substrate 100.

Referring to FIGS. 10-11 and 14-16, a third insulating interlayer 340 may be formed on the CSP 240 to cover the mold and the first support layer 300, and may be planarized until an upper surface of the uppermost one of the insulation layers 310 of the mold may be exposed. Thus, a sidewall of the mold, an upper surface and a sidewall of the first support layer 300, and a sidewall of the first sacrificial layer structure 290 may be covered by the third insulating interlayer 340. A fourth insulating interlayer 350 may be formed on upper surfaces of the mold and the third insulating interlayer 340.

A channel hole extending in the first direction D1 may be formed through the fourth insulating interlayer 350, the mold, the first support layer 300, and the first sacrificial layer structure 290 on the first region I of the substrate 100 to expose an upper surface of the CSP 240. First and second dummy channel holes extending in the first direction D1 may be formed through the third and fourth insulating interlayers 340 and 350, a portion of the mold, the first support layer 300, and the first sacrificial layer structure 290 on the second region II of the substrate 100 to expose an upper surface of the CSP 240. In example embodiments, a plurality of channel holes may be formed to be arranged in each of the second and third directions D2 and D3 on the first region I of the substrate 100, and a plurality of first dummy channel holes and a plurality of second dummy channel holes may be formed to be arranged in each of the second and third directions D2 and D3 on the second region II of the substrate 100.

In example embodiments, the etching process may be performed by an extreme ultraviolet (EUV) lithography process, and thus each of the channel hole and the first and second dummy channel holes may have various types of shapes. In example embodiments, each of the channel hole and the first dummy channel holes may have a shape of, e.g., a circle, an ellipse, a rectangle, or a rounded rectangle having rounded corners, etc., in a plan view, while the second dummy channel hole may have a shape of, e.g., "C" or "U".

The channel holes and the first and second dummy channel holes may be simultaneously formed by the same etching process, or may be sequentially formed by independent etching processes.

A charge storage structure layer and a channel layer may be sequentially formed on sidewalls of the channel hole and the first and second dummy channel holes, the exposed upper surface of the CSP 240, and an upper surface of the fourth insulating interlayer 350. A filling layer may be formed on the channel layer to fill the channel hole and the first and second dummy channel holes. The filling layer, the channel layer, and the charge storage structure layer may be planarized until the upper surface of the fourth insulating interlayer 350 is exposed.

Thus, a charge storage structure 390, a channel 400, and a filling pattern 410, sequentially stacked, may be formed on the channel hole. Also, a first dummy charge storage structure 392, a first dummy channel 402, and a first dummy filling pattern 412, sequentially stacked, may be formed on the first dummy channel hole. Also, a second dummy charge storage structure 394, a second dummy channel 404, and a second dummy filling pattern 414, sequentially stacked, may be formed on the second dummy channel hole.

In example embodiments, the charge storage structure 390 may include a tunnel insulation pattern 380, a charge storage pattern 370, and a first blocking pattern 360 sequentially stacked from an outer sidewall of the channel 400 in a horizontal direction substantially parallel to the upper surface of the substrate 100. The tunnel insulation pattern 380 and the first blocking pattern 360 may include an oxide, e.g., silicon oxide. The charge storage pattern 370 may include a nitride, e.g., silicon nitride. The channel 400 may include, e.g., polysilicon or single crystalline silicon. The filling pattern 410 may include an oxide, e.g., silicon oxide.

In example embodiments, the first and second dummy charge storage structures 392 and 394 may include the same material as the charge storage structure 390, the first and second dummy channels 402 and 404 may include the same material as the channel 400, and the first and second dummy filling patterns 412 and 414 may include the same material as the filling pattern 410. Thus, the first dummy charge storage structure 392 may include a first dummy tunnel insulation pattern, a first dummy charge storage pattern, and a first dummy blocking pattern, sequentially stacked from an outer sidewall of the first dummy channel 402 in the horizontal direction. Also, the second dummy charge storage structure 394 may include a second dummy tunnel insulation pattern, a second dummy charge storage pattern, and a second dummy blocking pattern sequentially stacked from an outer sidewall of the second dummy channel 404 in the horizontal direction.

Upper portions of the filling pattern 410 and the channel 400 may be removed to form a first trench, and a capping layer may be formed on the filling pattern 410, the channel 400, the charge storage structure 390 and the fourth insulating interlayer 350, and may be planarized until the upper surface of the fourth insulating interlayer 350 is exposed to form a capping pattern 420 filling the first trench. The capping pattern 420 may include, e.g., polysilicon doped with impurities.

When the first trench is formed, the first dummy filling pattern 412 and the first dummy channel 402, and the second dummy filling pattern 414 and the second dummy channel 404 may also be removed to form second and third trenches, respectively. When the capping pattern 420 is formed, first and second dummy capping patterns 422 and 424 may also be formed in the second and third trenches, respectively. Thus, the first and second dummy capping patterns 422 and 424 may include the same material as the capping pattern 420.

The filling pattern 410, the channel 400, the charge storage structure 390, and the capping pattern 420 may form a memory channel structure 430, which may correspond to the memory channel structures 3220 and 4220 shown in FIGS. 3 and 4.

The first dummy filling pattern 412, the first dummy channel 402, the first dummy charge storage structure 392, and the first dummy capping pattern 422 may form a first dummy memory channel structure 432. The second dummy filling pattern 414, the second dummy channel 404, the second dummy charge storage structure 394, and the second dummy capping pattern 424 may form a second dummy memory channel structure 434.

The first and second dummy memory channel structures 432 and 434 may not serve as memory channel structures of memory cells, but may support the mold, and thus may be referred to as first and second support structures 432 and 434, respectively, hereinafter.

In example embodiments, each of the memory channel structure 430 and the first and second support structures 432 and 434 may have a shape of a pillar extending in the first direction D1. Each of the memory channel structure 430 and the first support structure 432 may have a shape of, e.g., a circle, an ellipse, a rectangle, or a rounded rectangle having rounded corners in a plan view, while the second support structure 434 may have a shape of, e.g., "C" or "U" in a plan view.

In example embodiments, the first support structures 432 may be formed through the first steps of the mold, and the second support structures 434 may be formed through the second steps of the mold. The first support structures 432 may be formed to be arranged in each of the second and third directions D2 and D3 in each first step, and may have various numbers and/or layouts.

The second support structures 434 may be formed to be arranged in each of the second and third directions D2 and D3 in each second step. In, e.g., FIG. 10, two second support structure columns including two second support structures 434 disposed in the second direction D2 and three second support structures 434 disposed in the second direction D2, respectively, and being spaced apart from each other in the third direction D3 in an area are shown. However, embodiments are not limited thereto, and the numbers and layouts of the second support structures 434 included in each of the second support structure columns may be varied.

The first support structures 432 may be formed to be adjacent to the second support structures 434 in an area in each second step. In some cases, the first support structures 432 may not be formed. In, e.g., FIG. 10, a plurality of first support structures 432 arranged in the second direction D2 is shown. However, embodiments are not limited thereto, and the numbers and layouts of the first support structures 432 in an area in each second step may also be varied.

Referring to FIG. 11, in example embodiments, the second support structure 434 may include a first extension portion 434a extending in the second direction D2, and a second extension portion 434b extending in the third direction D3 from the first extension portion 434a, in a plan view. The second extension portion 434b may extend in the third direction D3 from each of opposite ends in the second direction D2 of the first extension portion 434a.

Referring to FIG. 12, in an example embodiment, third support structures 436 may be formed in an area of each second step of the mold, instead of the second support structures 434. The numbers and layouts of the third support structures 436 in an area of each second step may be varied.

In example embodiments, each of the third support structures 436 may have a shape of "T" in a plan view. The third support structure 436 may include a first extension portion 436a extending in the second direction D2, and a second extension portion 436b extending in the third direction D3 from the first extension portion 436a, in a plan view. The second extension portion 436b may extend from a central portion in the second direction D2 of the first extension portion 436a.

Referring to FIG. 13, both the second and third support structures 434 and 436 may be formed in an area of each second step of the mold. The numbers and layouts of the second and third support structures 434 and 436 in an area of each second step of the mold may be varied.

As shown in FIGS. 10 to 13, in a plan view, unlike the first support structure 432 in the first dummy channel hole, which may have a shape of a circuit or a rectangle, each of the second support structure 434 in the second dummy channel hole and the third support structure 436 in the third dummy channel hole may have a shape of "C," "U" or "T."

As the height of the mold increases, some of the first dummy channel holes extending through the mold may not expose an upper surface of the CSP 240, which may be referred to as "not-open failure." In order to prevent the not-open failure, each of the first dummy channel holes may be enlarged, but this may cause neighboring ones of the first dummy channel holes to be connected with each other so that the first support structures 432 may not be well formed in the first dummy channel holes.

However, in example embodiments, each of the second and third dummy channel holes may not have a circular or rectangular shape, but may have a concavo-convex shape, and thus the not-open failure may be reduced. As compared to an ArF lithography process, the concavo-convex shape, e.g., the shape of "C," "U," or "T" (which is more complicated than the circular or rectangular shape) may be more easily formed through an EUV lithography process using EUV light having a relatively small wavelength as a light source. Thus, the second and third dummy channel holes may be easily formed.

A photomask for implementing the above shapes may be designed to simply have the shapes of "C," "U" and "T."

However, the second and third dummy channel holes that may be formed by etching an etching object layer using a photoresist pattern, which may be formed by a photo process using the photomask, may have shapes of "C," "U," or "T" of which corners are rounded.

Referring to FIG. 10, in example embodiments, a plurality of channels 400 may be formed in each of the second and third directions D2 and D3, to form a channel array. In example embodiments, the channel array may include a first channel column 400a including the channels 400 arranged in the second direction D2, and a second channel column 400b including the channels 400 arranged in the second direction D2 and being spaced apart from the first channel column 400a in the third direction D3. The channels 400 included in the first channel column 400a may be located at an acute angle in the second direction D2 or the third direction D3 with respect to the channels 400 included in the second channel column 400b.

The first and second channel columns 400a and 400b may be alternately and repeatedly arranged in the third direction D3. In example embodiments, five first channel columns 400a and four second channel columns 400b may be alternately disposed in the third direction D3, which may form a channel group. Hereinafter, four channel columns disposed in the channel group may be referred to as first, second, third, and fourth channel columns 400a, 400b, 400c and 400d, respectively, in this order, and a channel column at a central portion of the channel group may be referred to as a fifth channel column 400e; the other four channel columns may be referred to as first, second, third, and fourth channel columns 400a, 400b, 400c, and 400d, respectively.

Two channel groups disposed in the third direction D3 may form a channel block. Memory cells each including the channels 400, the charge storage structures 390, and gate electrodes illustrated below may also define a memory group and a memory block, correspondingly. An erase operation may be performed by the unit of the memory block in the vertical memory device. FIG. 10 shows two memory blocks disposed in the third direction D3. Each of the memory blocks may include two memory groups disposed in the third direction D3.

The fourth insulating interlayer 350 and some of the insulation layers 310 and the fourth sacrificial layers 320 may be etched to form a first opening extending in the second direction D2, and a second division pattern 440 may be formed in the first opening. The second division pattern 440 may extend through some of the channels 400, e.g., upper portions of the channels 400 included in the fifth channel column 400e in each channel group. Also, the second division pattern 440 may also extend through the fourth insulating interlayer 350, ones of the fourth sacrificial layers 320 at upper two levels, and ones of the insulation layers 310 at upper two levels, and may further extend through one of the insulation layers 310 at a third level from above. The second division pattern 440 may extend in the second direction D2 on the first and second regions I and II of the substrate 100, and may extend through upper two step layers of the mold. Thus, the fourth sacrificial layers 320 at two upper levels of the mold may be divided in the third direction D3 by the second division pattern 440.

Figure 17:
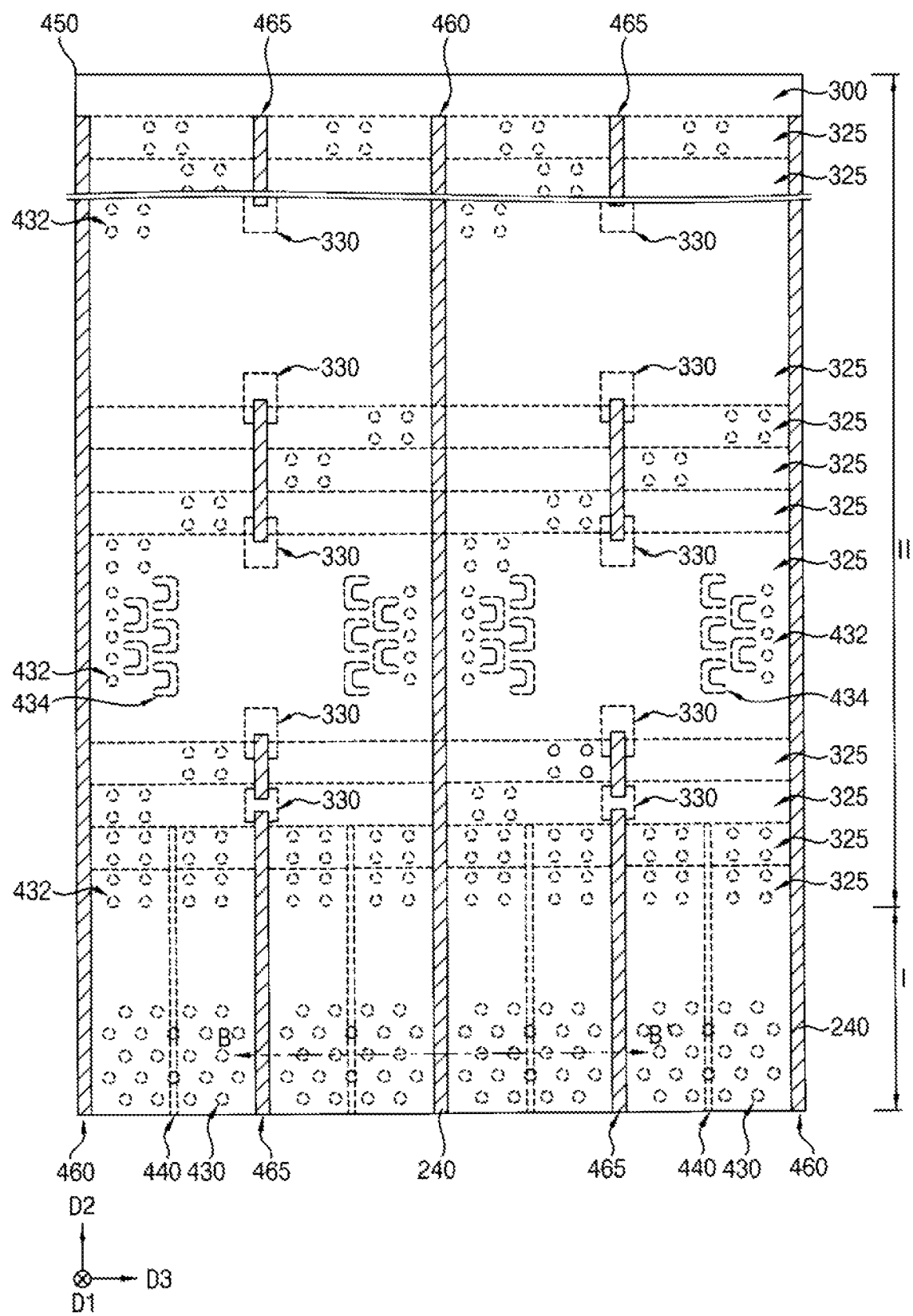

Referring to FIGS. 17 and 18, a fifth insulating interlayer 450 may be formed on the fourth insulating interlayer 350, the capping pattern 420, and the second division pattern 440. Second and third openings 460 and 465 may be formed through the third to fifth insulating interlayers 340, 350, and 450 and the mold by a dry etching process.

In example embodiments, the second opening 460 may extend in the second direction D2 on the first and second regions I and II of the substrate 100, and may extend to opposite ends in the second direction D2 of the mold having the staircase shape. In example embodiments, a plurality of second openings 460 may be spaced apart from each other in the third direction D3. Thus, the mold may be divided into a plurality of parts in the third direction D3 by the second openings 460. In an example embodiment, each of the second openings 460 may be formed between the memory blocks. Thus, the memory blocks may be divided by the second openings 460 to be spaced apart from each other in the third direction D3.

As the second opening 460 is formed, the insulation layers 310 and the fourth sacrificial layers 320 of the mold may be divided into first insulation patterns 315 and fourth sacrificial patterns 325, each of which may extend in the second direction D2.

In example embodiments, the third opening 465 may continuously extend in the second direction D2 on the first region I of the substrate 100. A plurality of third openings 465 may be spaced apart from each other in the second direction D2 on the second region II of the substrate 100. The third openings 465 arranged in the second direction D2 may be formed between neighboring ones of the second openings 460 in the third direction D3. In an example embodiment, the third openings 465 may be formed between memory groups in each of the memory blocks spaced apart from each other by the second openings 460. Thus, the memory groups may be spaced apart from each other in the third direction D3 by the third openings 465 in each of the memory blocks.

However, as shown in, e.g., FIG. 17, the third openings 465 may be spaced apart from each other in the second direction D2, which may be different from the second opening 460 continuously extending in the second direction D2 to opposite ends in the second direction D2 of the mold, and thus the memory groups in each memory block may not entirely divided from each other by the third opening 465. In example embodiments, a portion of the mold between neighboring ones of the third openings 465 in the second direction D2 may partially overlap the first division pattern 330 in the first direction D1.

Each of the third openings 465 may continuously extend in the second direction D2 on the first region I of the substrate 100, and may extend to opposite ends in the second direction D2 at upper two step layers of the mold on the second region II of the substrate 100. Thus, the fourth sacrificial patterns 325 at upper two levels may be divided in the third direction D3 by the third opening 465 and the second division patterns 440 at opposite sides of the third opening 465 in the third direction D3.

When the mold is divided in the third direction D3 to extend in the second direction D2 during the etching process for forming the second and third openings 460 and 465, the mold may not lean or fall down due to the first to third support structures 432, 434, and 436 and the memory channel structures 430 extending therethrough.

In example embodiments, the etching process may be performed until the second and third openings 460 and 465 expose an upper surface of the first support layer 300, and further extend through an upper portion of the first support layer 300.

Figure 19:
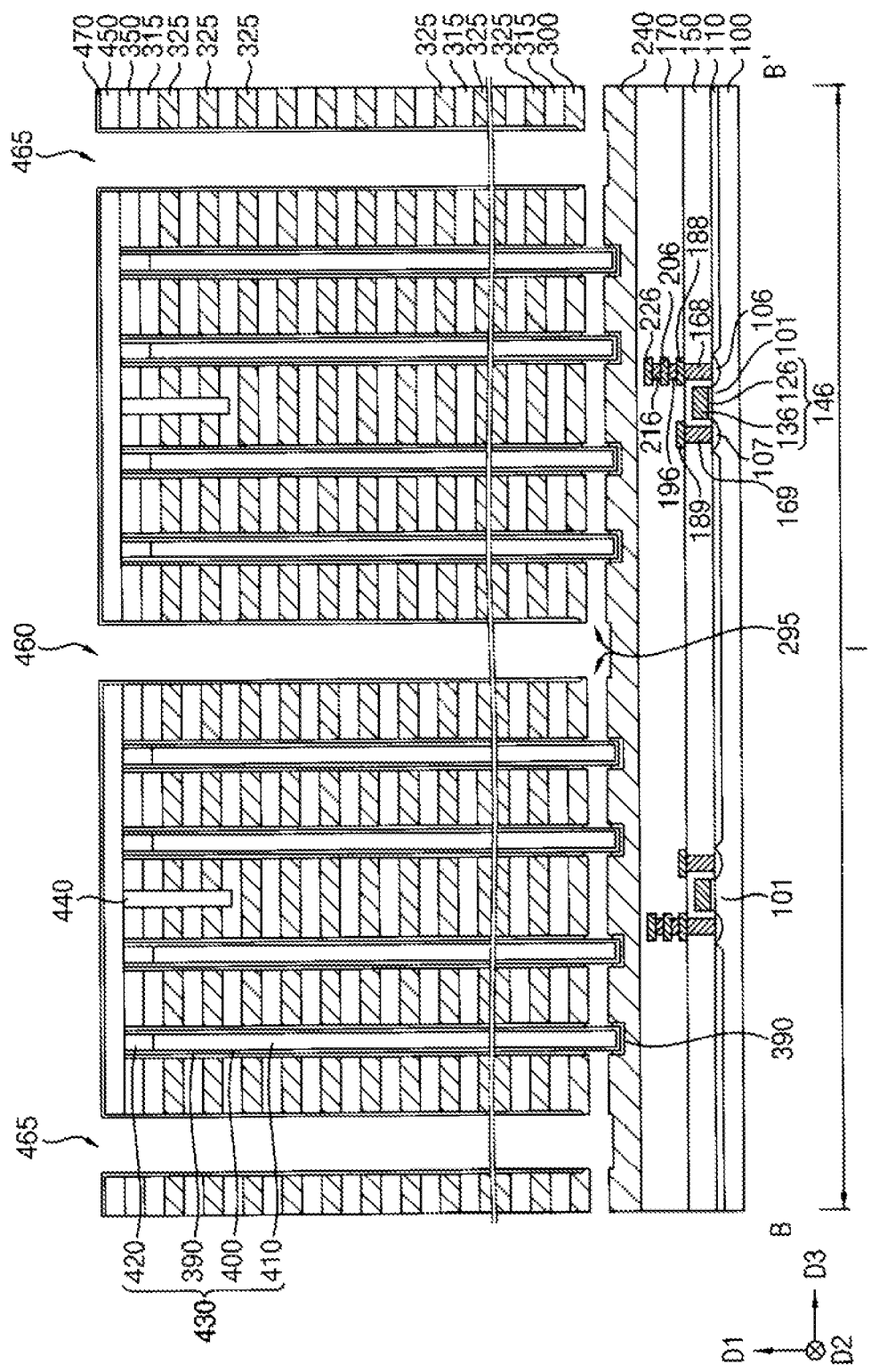

A first spacer layer may be formed on sidewalls of the second and third openings 460 and 465 and an upper surface of the fifth insulating interlayer 450, and may be anisotropically etched so that a portion of the first spacer layer on bottoms of the second and third openings 460 and 465 may be removed to form a first spacer 470, as shown in FIG. 19. Thus, a surface of the first support layer 300 may be partially exposed. The exposed first support layer 300 and a portion of the first sacrificial layer structure 140 thereunder may be removed to enlarge the second and third openings 460 and 465 downwardly. Accordingly, the second and third openings 460 and 465 may expose an upper surface of the CSP 240, and further extend through an upper portion of the CSP 240.

In example embodiments, the first spacer 470 may include, e.g., undoped polysilicon. When the first sacrificial layer structure 290 is partially removed, the sidewalls of the second and third openings 460 and 465 may be covered by the first spacer 470, and thus the first insulation pattern 315 and the fourth sacrificial pattern 325 included in the mold may not be removed.

Referring to FIG. 19, the first sacrificial layer structure 290 exposed by the second and third openings 460 and 465 may be removed by, e.g., a wet etching process to form a first gap 295. The wet etching process may be performed using, e.g., hydrofluoric acid or phosphoric acid.

As the first gap 295 is formed, a lower portion of the first support layer 300 and an upper surface of the CSP 240 may be exposed. Also, a sidewall of the charge storage structure 390 may be partially exposed by the first gap 295, and the exposed sidewall of the charge storage structure 390 may also be removed to expose an outer sidewall of the channel 400. Accordingly, the charge storage structure 390 may be divided into an upper portion extending through the mold to cover most portion of the outer sidewall of the channel 400 and a lower portion covering a lower surface of the channel 400 on the CSP 240.

Figure 20:
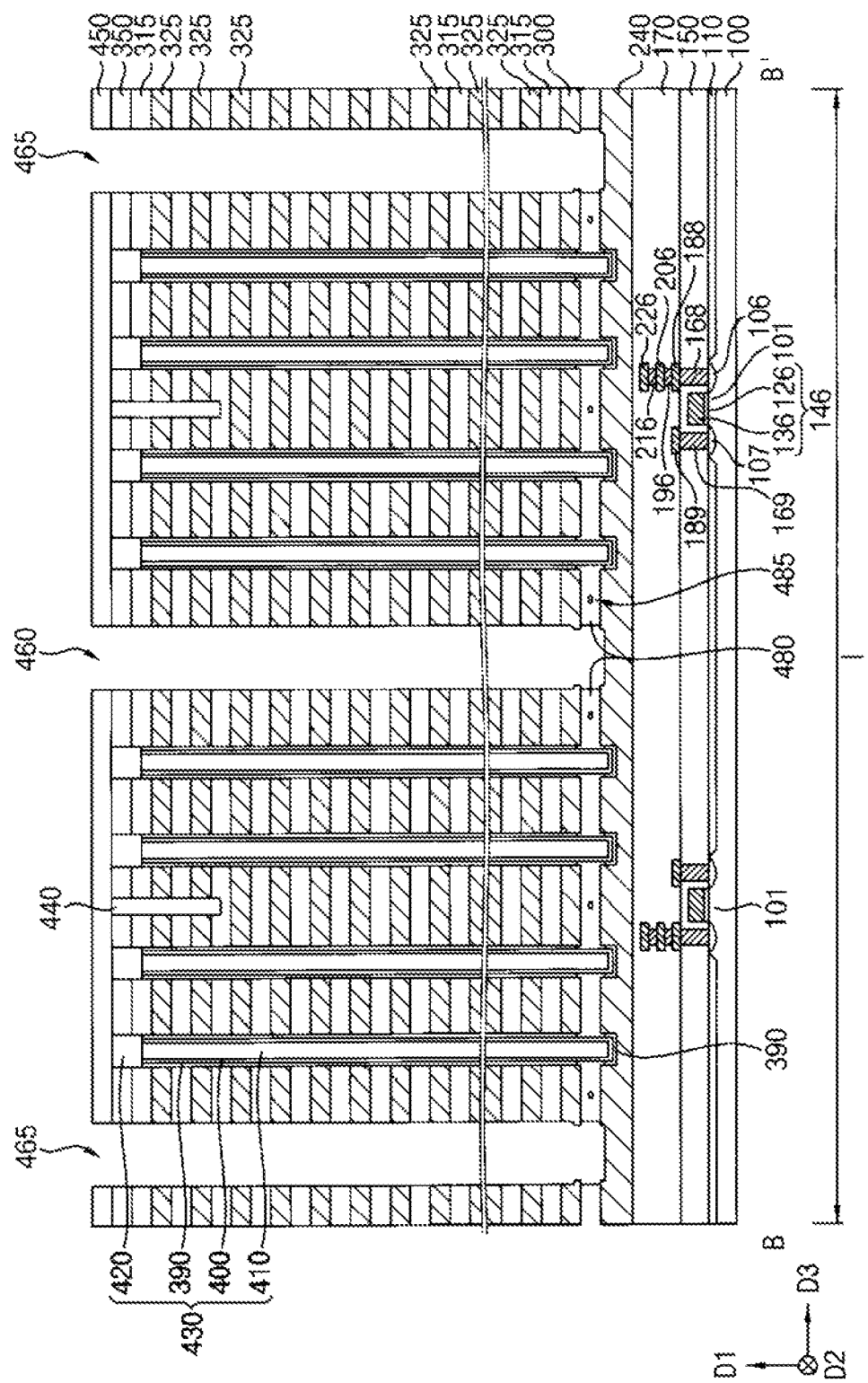

Referring to FIG. 20, after removing the first spacer 470, a channel connection layer may be formed on the sidewalls of the second and third openings 460 and 465 and in the first gap 295, and a portion of the channel connection layer in the second and third openings 460 and 465 may be removed to form a channel connection pattern 480 in the first gap 295. As the channel connection pattern 480 is formed, the channels 400 between neighboring ones of the second and third openings 460 and 465 in the third direction D3, that is, the channels 400 included in each channel group, may be connected with each other. The channel connection pattern 480 may include, e.g., polysilicon doped with n-type impurities or undoped polysilicon.

An air gap 485 may be formed in the channel connection pattern 480.

Figure 21:
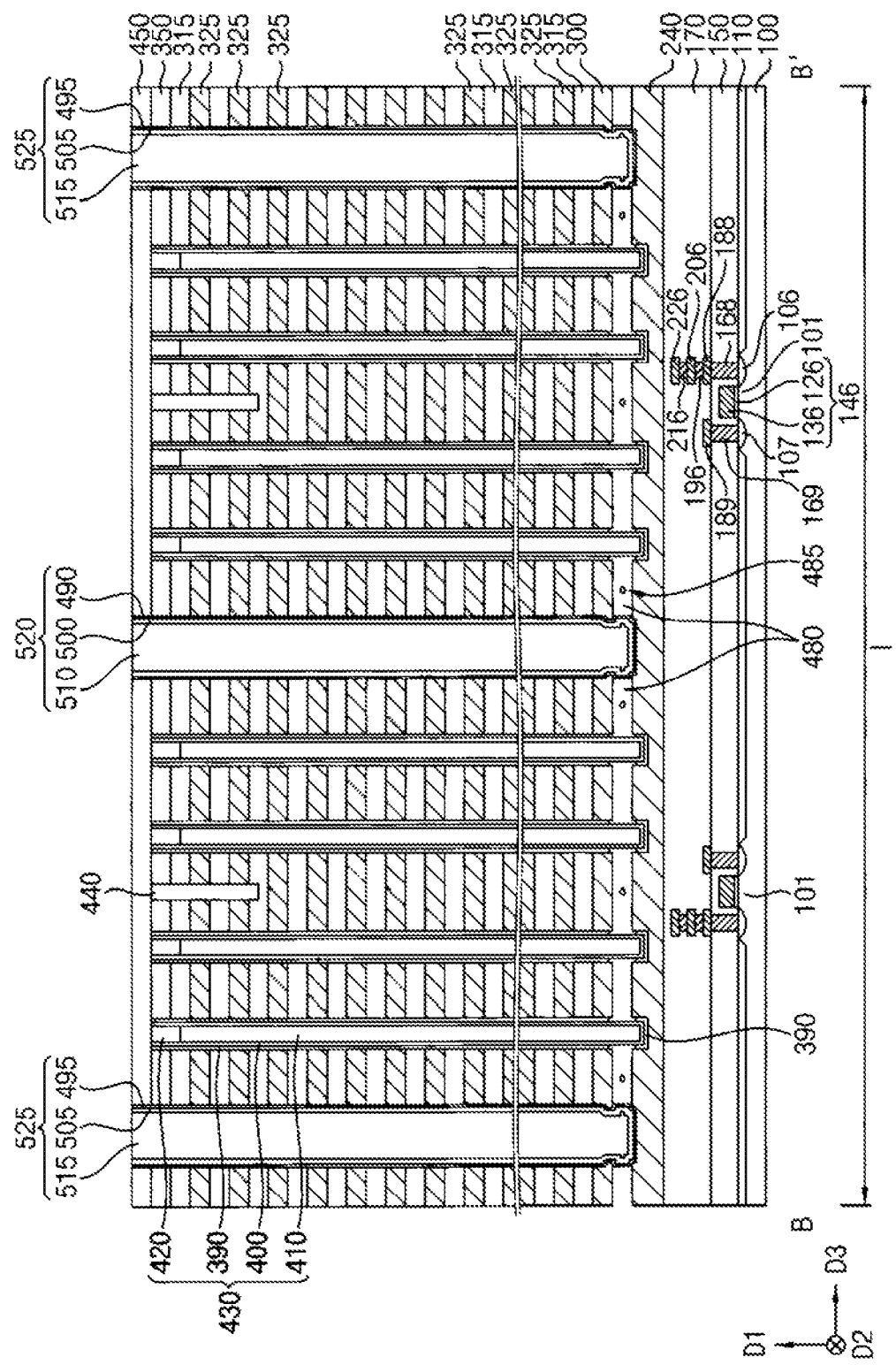

Referring to FIG. 21, second and third sacrificial layer structures 520 and 525 may be formed in the second and third openings 460 and 465, respectively.

The second and third sacrificial layer structures 520 and 525 may be formed by sequentially forming an etch stop layer and a second spacer layer on the sidewalls of the second and third openings 460 and 465 and the exposed upper surface of the CSP 240, forming a fifth sacrificial layer on the second spacer layer to fill the second and third openings 460 and 465, and planarizing the fifth sacrificial layer, the second spacer layer, and the etch stop layer until the upper surface of the fifth insulating interlayer 450 is exposed.

The second sacrificial layer structure 520 may include a first etch stop pattern 490, a second spacer 500, and a fifth sacrificial pattern 510, sequentially stacked. The third sacrificial layer structure 525 may include a second etch stop pattern 495, a third spacer 505 and a sixth sacrificial pattern 515, sequentially stacked.

The etch stop layer may include a material having an etching selectivity with respect to the fourth sacrificial pattern 325, e.g., an oxide such as silicon oxide. The second spacer layer may include, e.g., a nitride such as silicon nitride. The fifth sacrificial layer may include, e.g., polysilicon or silicon oxide.

Figure 22:
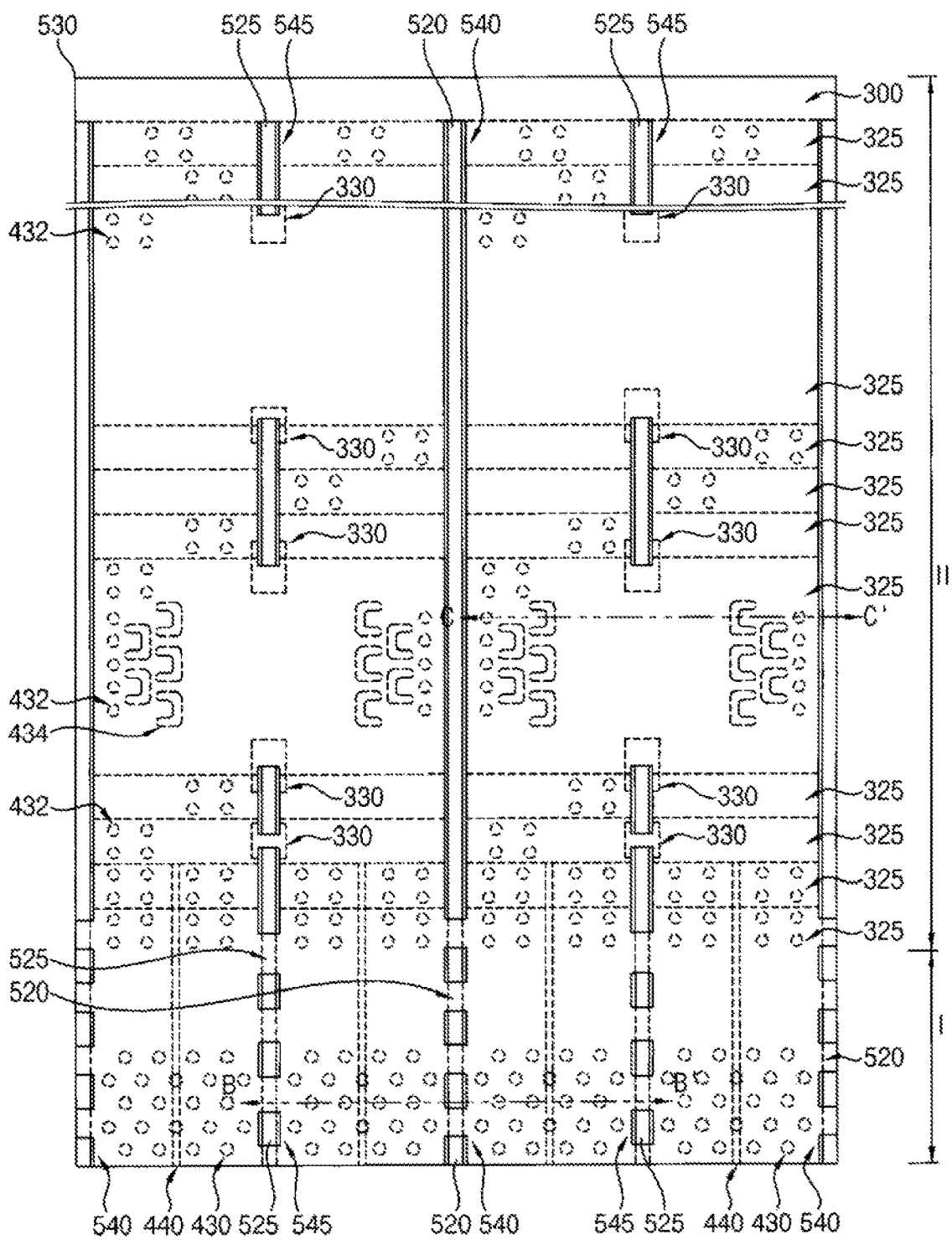
Figure 23:
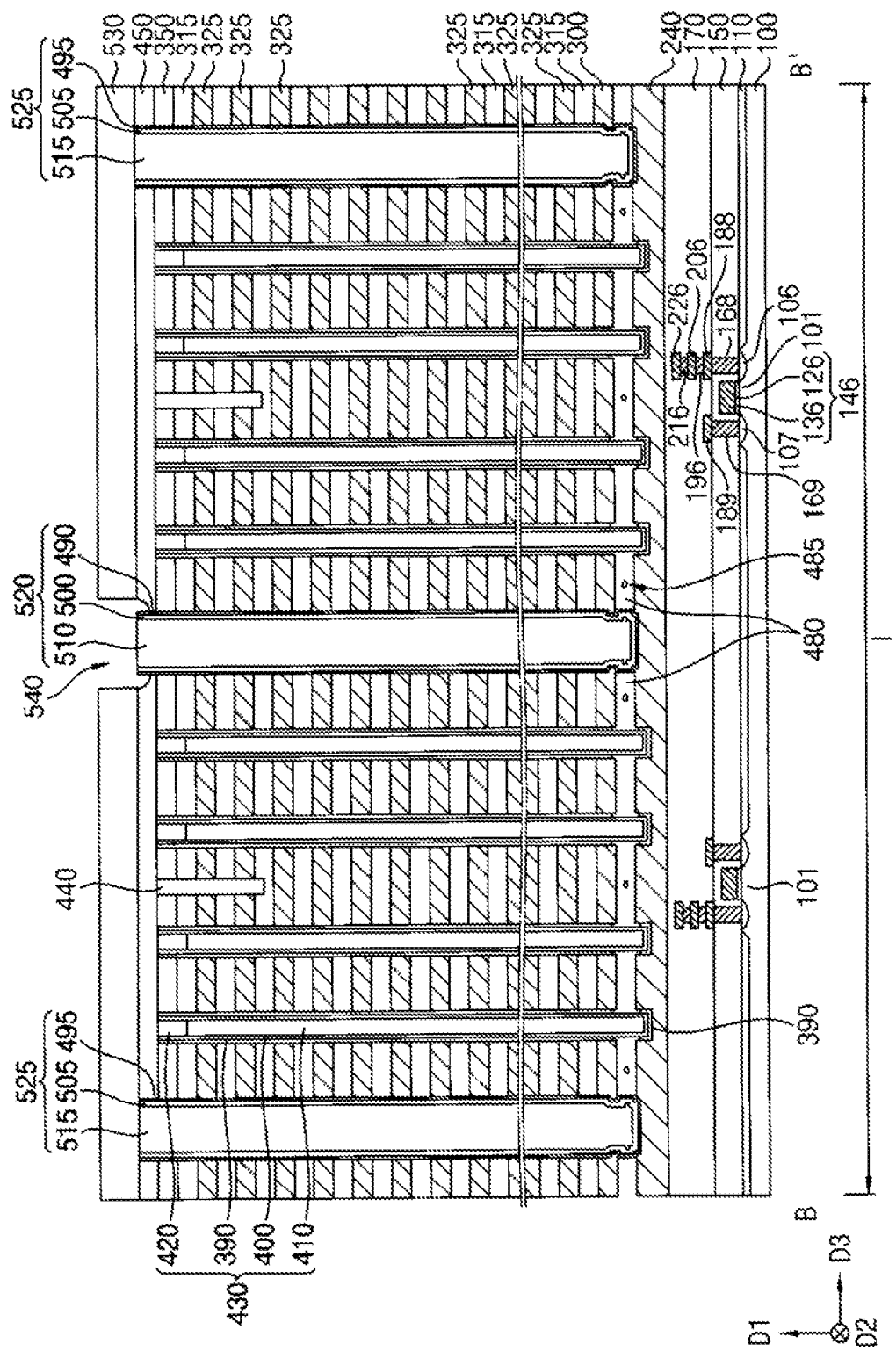

Referring to FIGS. 22 and 23, a second support layer 530 may be formed on the fifth insulating interlayer 450 and the second and third sacrificial layer structures 520 and 525, and may be partially etched to form fourth and fifth openings 540 and 545, respectively.

In example embodiments, the fourth opening 540 may overlap the second sacrificial layer structure 520 in the first direction D1. Referring to, e.g., FIG. 22, the fourth opening 540 may continuously extend in the second direction D2 on the second region II of the substrate 100, and a plurality of fourth openings 540 may be spaced apart from each other in the second direction D2 on the first region I of the substrate 100. However, embodiments are not limited thereto, and a plurality of fourth openings 540 may be spaced apart from each other in the second direction D2 even on the second region II of the substrate 100. In an example embodiment, the fourth opening 540 may have a width in the third direction D3 that greater than a width of the second sacrificial layer structure 520; however, embodiments are not limited thereto.

In example embodiments, the fifth opening 545 may overlap the third sacrificial layer structure 525 in the first direction D1. Thus, a plurality of fifth openings 545 may be spaced apart from each other in the second direction D2 on the second region II of the substrate 100. Also, a plurality of fifth openings 545 may be spaced apart from each other in the second direction D2 on the same third sacrificial layer structure 525 even on the first region I of the substrate 100. In an example embodiment, the fifth opening 545 may have a width in the third direction D3 greater than that of the third sacrificial layer structure 525, but embodiments are not limited thereto.

In example embodiments, the fourth and fifth openings 540 and 545 may be arranged in a zigzag pattern in the second direction D2 on the first region I of the substrate 100. The fourth and fifth openings 540 and 545 may partially overlap each other in the third direction D3.

The second support layer 530 may include an oxide, e.g., silicon oxide.

Figure 24:
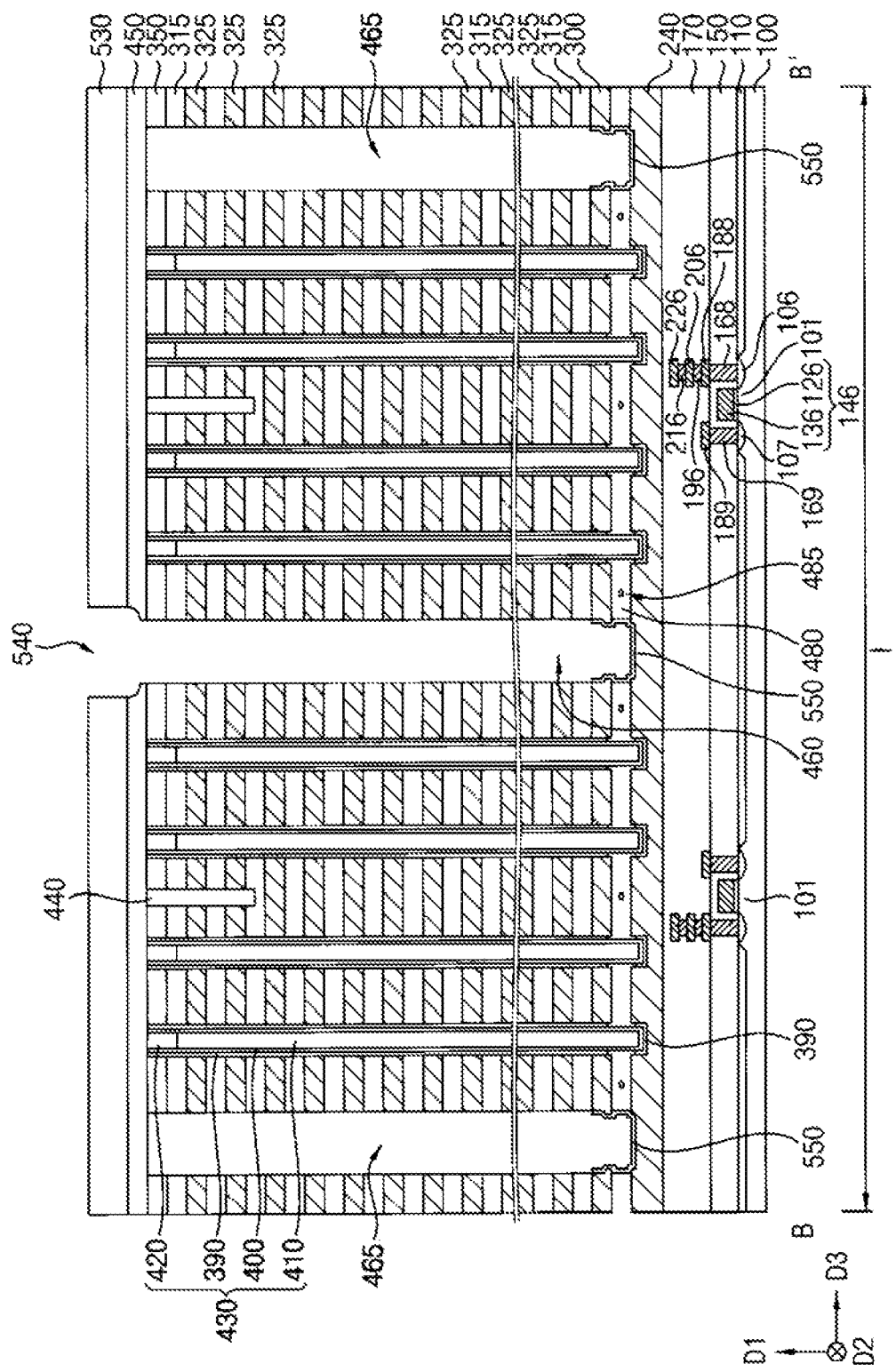

Referring to FIG. 24, the second and third sacrificial layer structures 520 and 525 may be removed by an etching process through the fourth and fifth openings 540 and 545, and thus the second and third openings 460 and 465 may be formed again.

As described above, the fourth and fifth openings 540 and 545 may not entirely expose but partially cover upper surfaces of the second and third sacrificial layer structures 520 and 525, respectively, on the first region I of the substrate 100, an thus, even though the second and third openings 460 and 465 are formed again by the etching process, the upper surfaces of the second and third sacrificial layer structures 520 and 525 may be at least partially covered by the second support layer 530. Accordingly, even though an upper surface of the mold is high and an extension length in the second direction D2 is large, the mold may not lean or fall down in the third direction D3, due to the second support layer 530 at least partially covering portions of the mold where the second and third openings 460 and 465 are formed.

A plurality of third openings 465 may be spaced apart from each other in the second direction D2 on the second region II of the substrate 100 so that a portion of the mold remain between the third openings 465, and the first to third support structures 432, 434, and 436 extend through the mold, and thus the mold may not lean or fall down in the third direction D3 due to the portion of the mold and the first to third support structures 432, 434, and 436.

In example embodiments, the second and third sacrificial layer structures 520 and 525 may be removed by a wet etching process.

An oxidation process may be performed on a layer structure including silicon and exposed by the second and third openings 460 and 465 to form a protection layer 550. In example embodiments, as the oxidation process is performed, the protection layer 550 may be formed on the upper surface of the CSP 240 exposed by the second and third openings 460 and 465, a sidewall of the channel connection pattern 480, and a sidewall of the first support layer 300. The protection layer 550 may include, e.g., silicon oxide.

Figure 25:
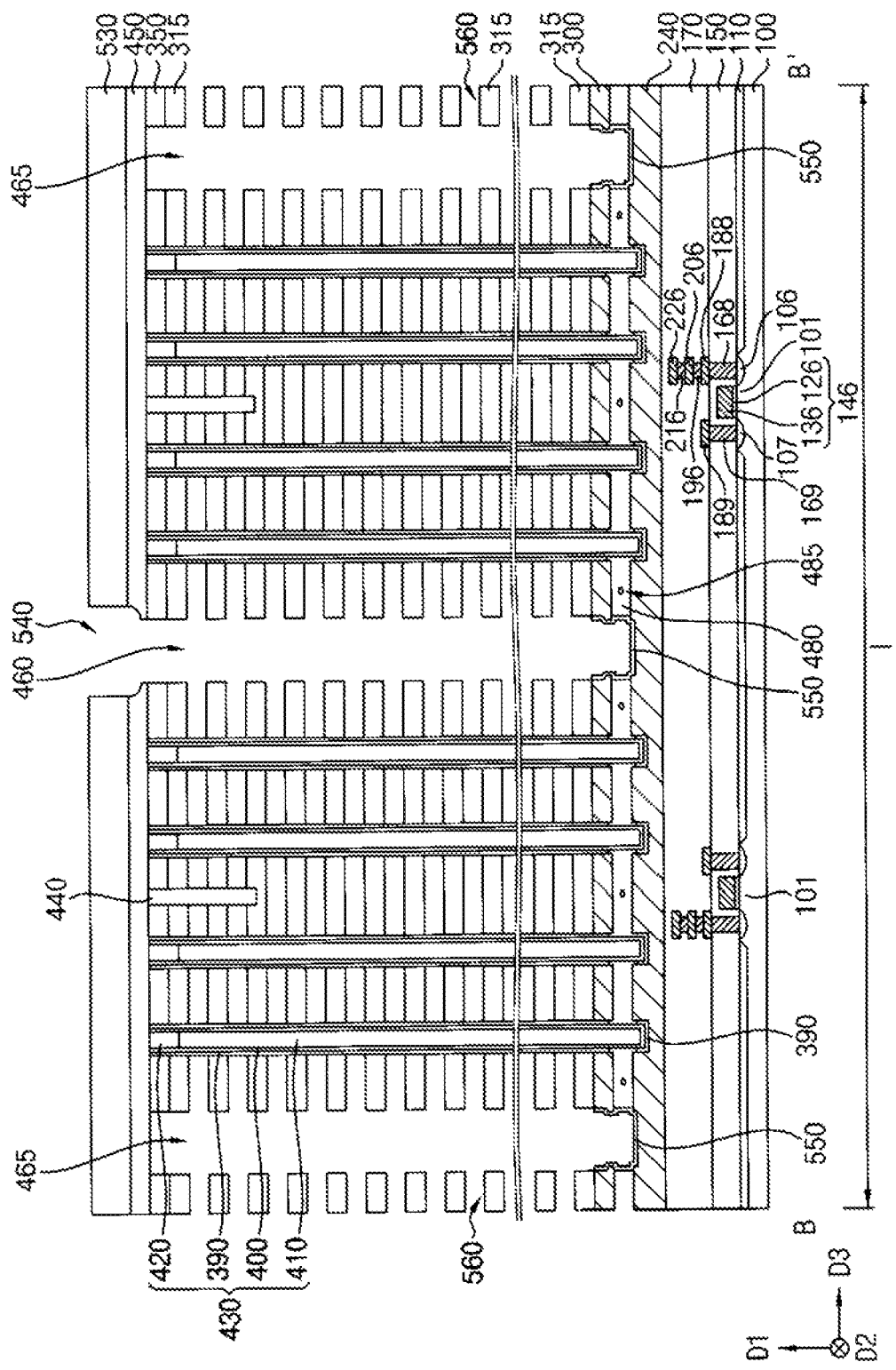
Figure 26:
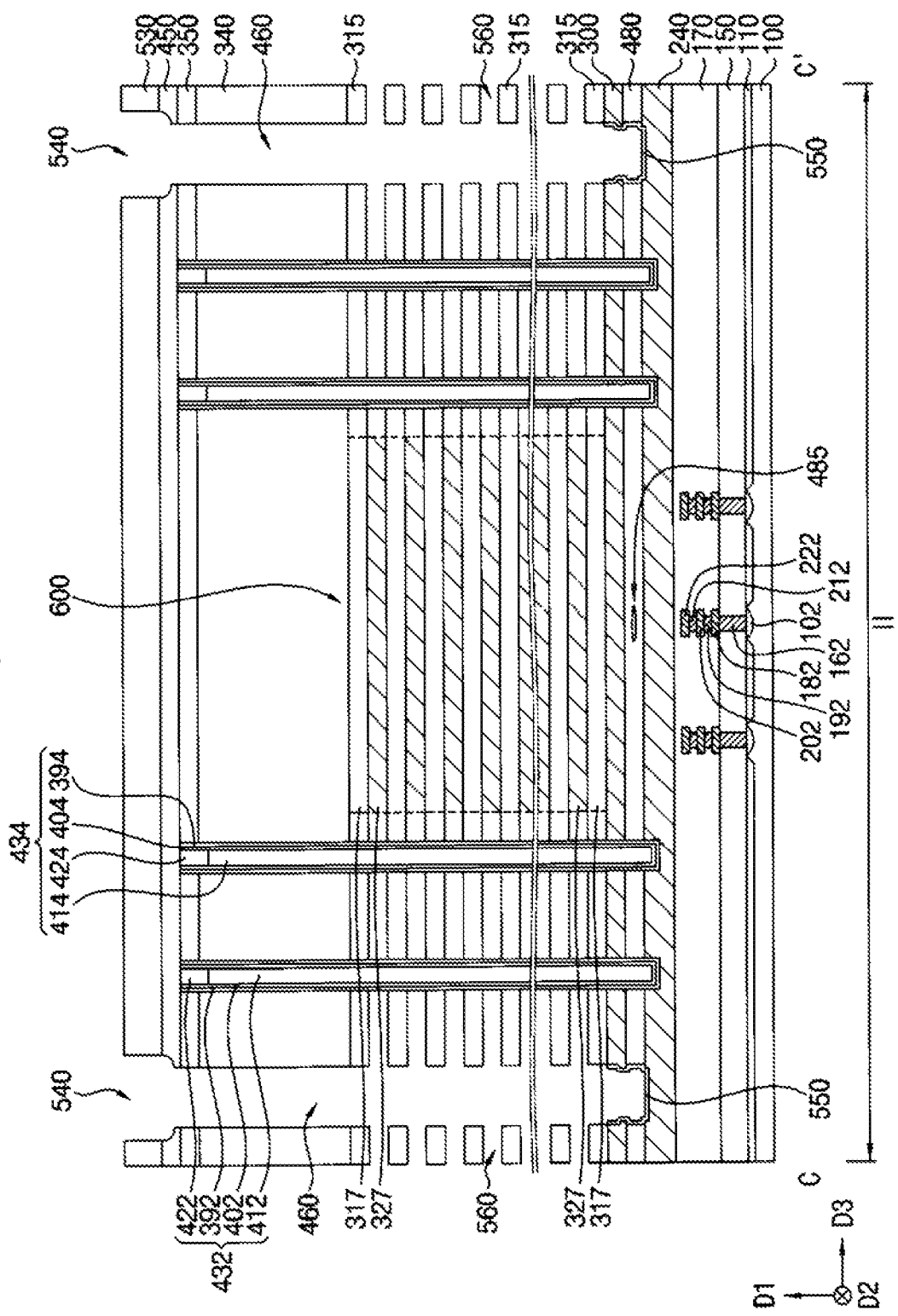

Referring to FIGS. 25 and 26, the fourth sacrificial patterns 325 exposed by the second and third openings 460 and 465 may be removed to form a second gap 560 between the first insulation patterns 315. An outer sidewall of the charge storage structure 390 included in the memory channel structure 430, and outer sidewalls of the first and second dummy charge storage structures 392 and 394 included in the first and second support structures 432 and 434, respectively, may be partially exposed by the second gap 560.

In example embodiments, the fourth sacrificial patterns 325 may be removed by a wet etching process using, e.g., phosphoric acid ($H_3PO_4$) or sulfuric acid ($H_2SO_4$). The wet etching process may be performed through the second and third openings 460 and 465. A portion of the fourth sacrificial pattern 325 between the second and third openings 460 and 465 may be entirely removed by an etching solution provided through the second and third openings 460 and 465 in two ways. However, the etching solution may be provided only in one way through the second opening 460 (at an area where the third opening 465 is not formed between neighboring ones of the second openings 460 in the third direction D3 on the second region II of the substrate 100), and thus the fourth sacrificial pattern 325 may not be entirely removed but partially remain, which may be referred to as a third insulation pattern 327. Also, a portion of the first insulation pattern 315 overlapping the third insulation patterns 327 in the first direction D1 may be referred to as a second insulation pattern 317. The second and third insulation patterns 317 and 327, alternately and repeatedly stacked in the first direction D1, may form an insulation pattern structure 600.

The insulation pattern structure 600 may extend through a portion of the mold on the second region II of the substrate 100, and may have a shape of a rectangle, ellipse, circle, or a shape of a rectangle having concave opposite sides in the second direction D2. In example embodiments, the insulation pattern structure 600 may extend through the second step (which has a relatively large length in the second direction D2) in each mold. In example embodiments, the second support structure 434 and/or the third support structure 436 may be formed between each of the second openings 460 and the insulation pattern structure 600, and as mentioned above, the first support structure 432 may be further formed.

Figure 27:
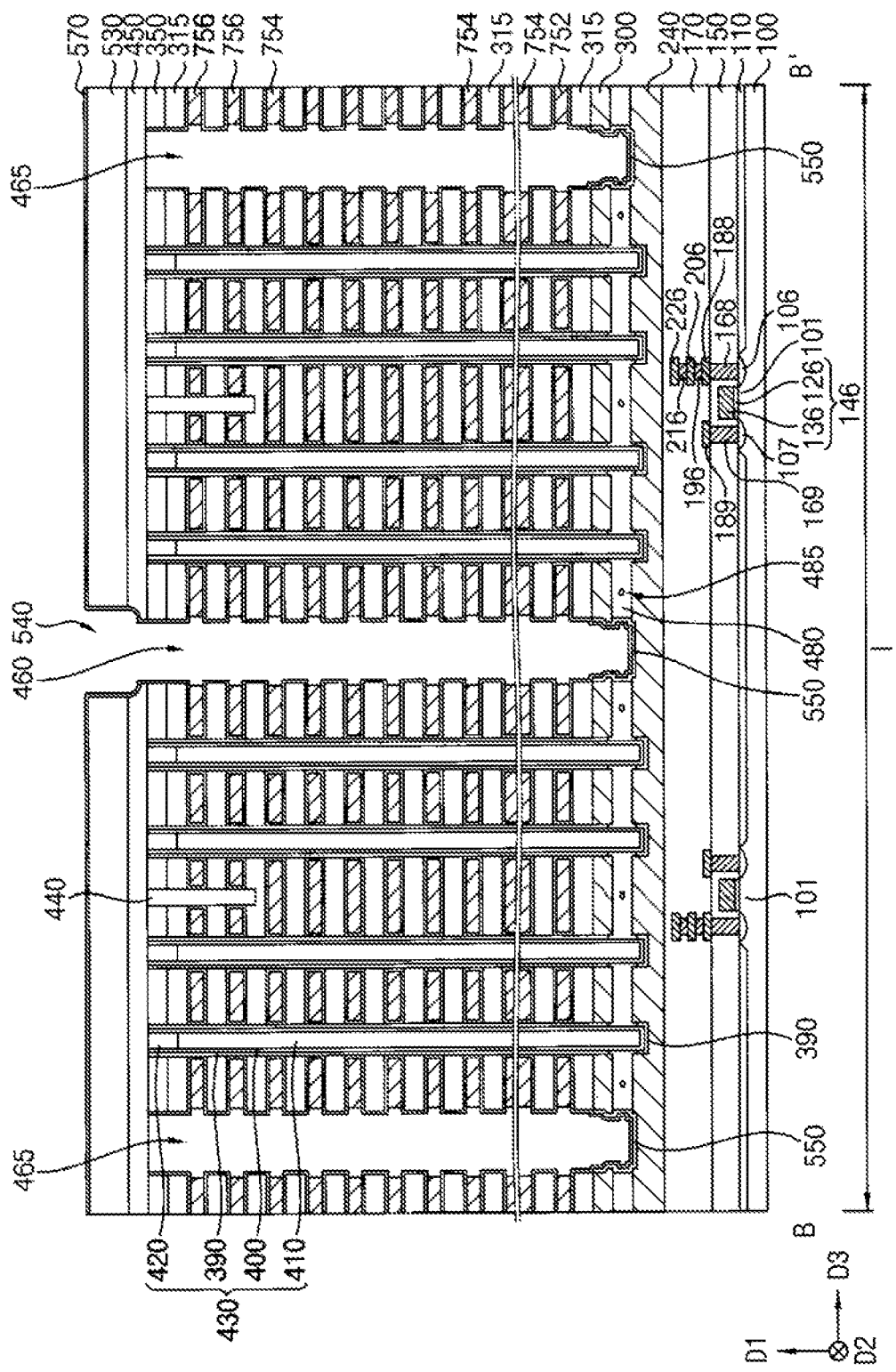
Figure 28:
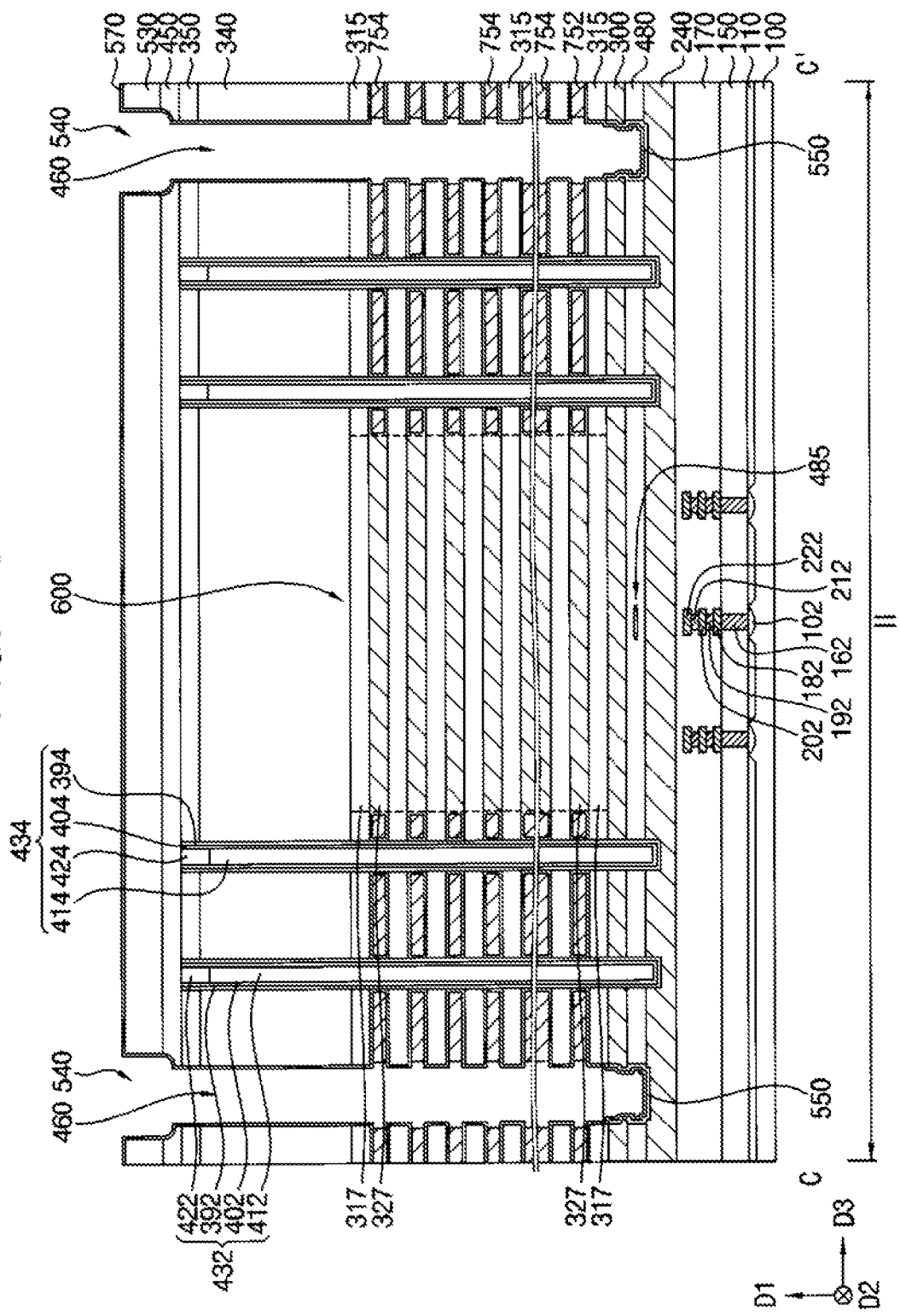

Referring to FIGS. 27 and 28, a second blocking layer 570 may be formed on the outer sidewall of the charge storage structure 390 exposed by the second and third openings 460 and 465, the outer sidewalls of the first and second dummy charge storage structures 392 and 394 included in the first and second support structures 432 and 434 exposed by the second and third openings 460 and 465, inner walls of the second gaps 560, surfaces of the first insulation patterns 315, an upper surface of the protection layer 550, a sidewall and an upper surface of the fifth insulating interlayer 450, and a sidewall and upper surface of the second support layer 530.

A gate electrode layer may be formed on the second blocking layer 570. The gate electrode layer may include a gate barrier layer and a gate conductive layer sequentially stacked. The gate electrode layer may include a low resistance metal, e.g., tungsten, titanium, tantalum, platinum, etc. The gate barrier layer may include a metal nitride, e.g., titanium nitride, tantalum nitride, etc. The second blocking layer 570 may include a metal oxide, e.g., aluminum oxide, hafnium oxide, zirconium oxide, etc.

The gate electrode layer may be partially removed to form a gate electrode in each of the second gaps 560. In example embodiments, the gate electrode layer may be partially removed by a wet etching process. As a result, the fourth sacrificial pattern 325 in the mold (which has the staircase shape including the fourth sacrificial pattern 325 and the first insulation pattern 315 sequentially stacked as a step layer) may be replaced with the gate electrode and the second blocking layer 570 covering lower and upper surfaces of the gate electrode.

In example embodiments, the gate electrode may extend in the second direction D2. A plurality of gate electrodes may be spaced apart from each other in the first direction D1 to form a gate electrode structure. The gate electrodes may be staked in a staircase shape in which extension lengths in the second direction D2 decrease in a stepwise manner from a lowermost level toward an uppermost level. An end portion in the second direction D2 of each of the gate electrodes that is not overlapped with upper gate electrodes in the first direction D1, that is, the step of each of the step layers, may be referred to as a pad. The gate electrode structure may include first pads having a relatively short length in the second direction D2, and second pads having a relatively large length in the second direction D2. The numbers of the first and second pads may not be limited.

A plurality of gate electrode structures may be formed in the third direction D3. The gate electrode structures may be spaced apart from each other in the third direction D3 by the second openings 460. As described above, the third opening 465 may not extend in the second direction D2 to opposite ends in the second direction D2 of the gate electrode structure, but a plurality of third openings 465 may be spaced apart from each other in the second direction D2, and thus the gate electrode structure may not be divided by the third openings 465. However, one of the gate electrodes at a lowermost level may be divided in the third direction D3 by the third openings 465, the first division pattern 330, and the insulation pattern structure 600, and each one of the gate electrodes at upper two levels may be divided in the third direction D3 by the third opening 465 and the second division pattern 440.

In example embodiments, the gate electrode structure may include first, second, and third gate electrodes 752, 754, and 756 sequentially stacked in the first direction D1. In example embodiments, the first gate electrode 752 may serve as a ground selection line (GSL), the third gate electrode 756 may serve as a string selection line (SSL), and the second gate electrode 754 may be formed at a plurality of levels between the first and third gate electrodes 752 and 756 and may serve as word lines, respectively.

In example embodiments, each of the memory blocks between neighboring ones of the second openings 460 in the second direction D2 may include two GSLs, one word line, and four SSLs at each level. However, embodiments are not limited thereto.

Figure 29:
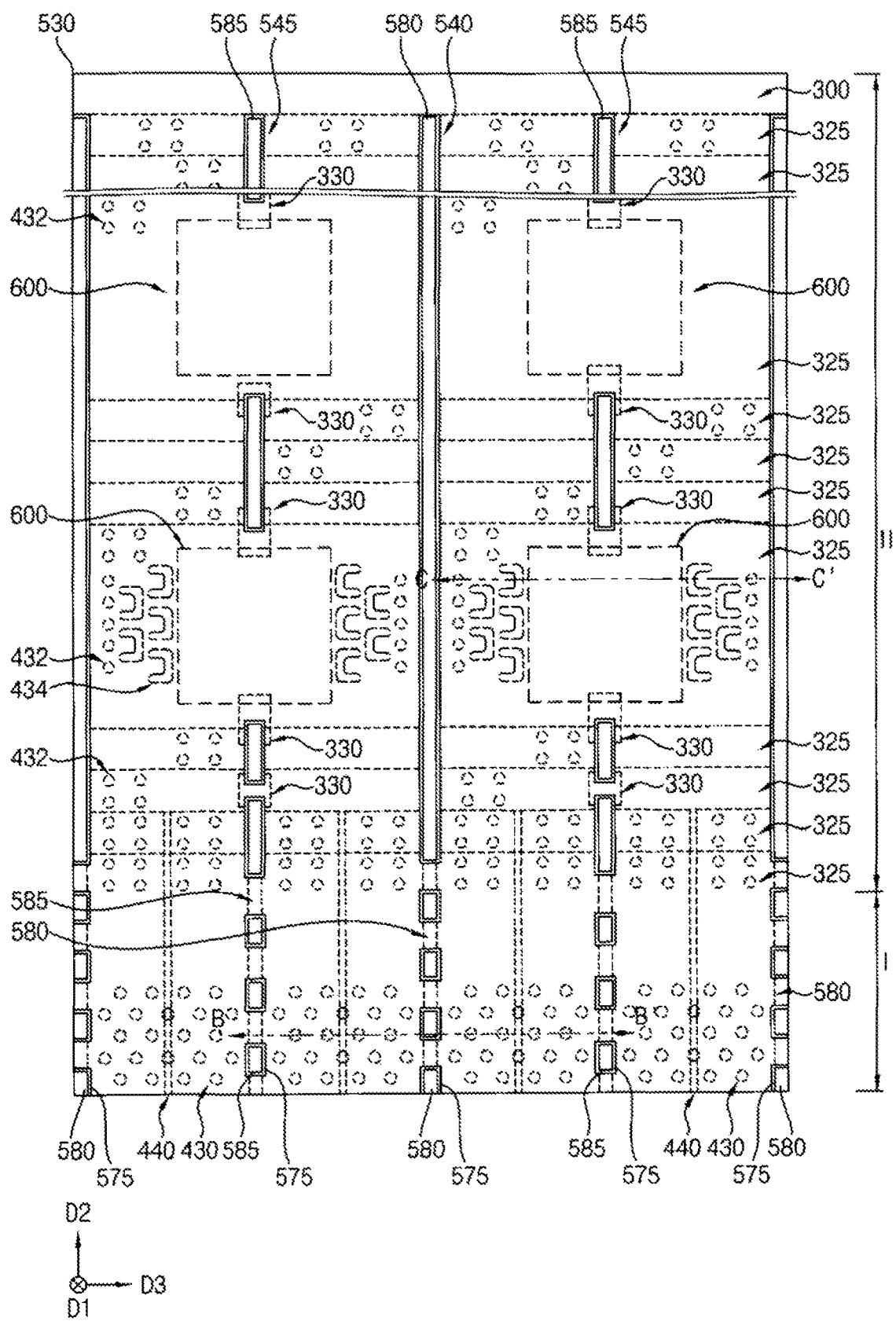
Figure 30:
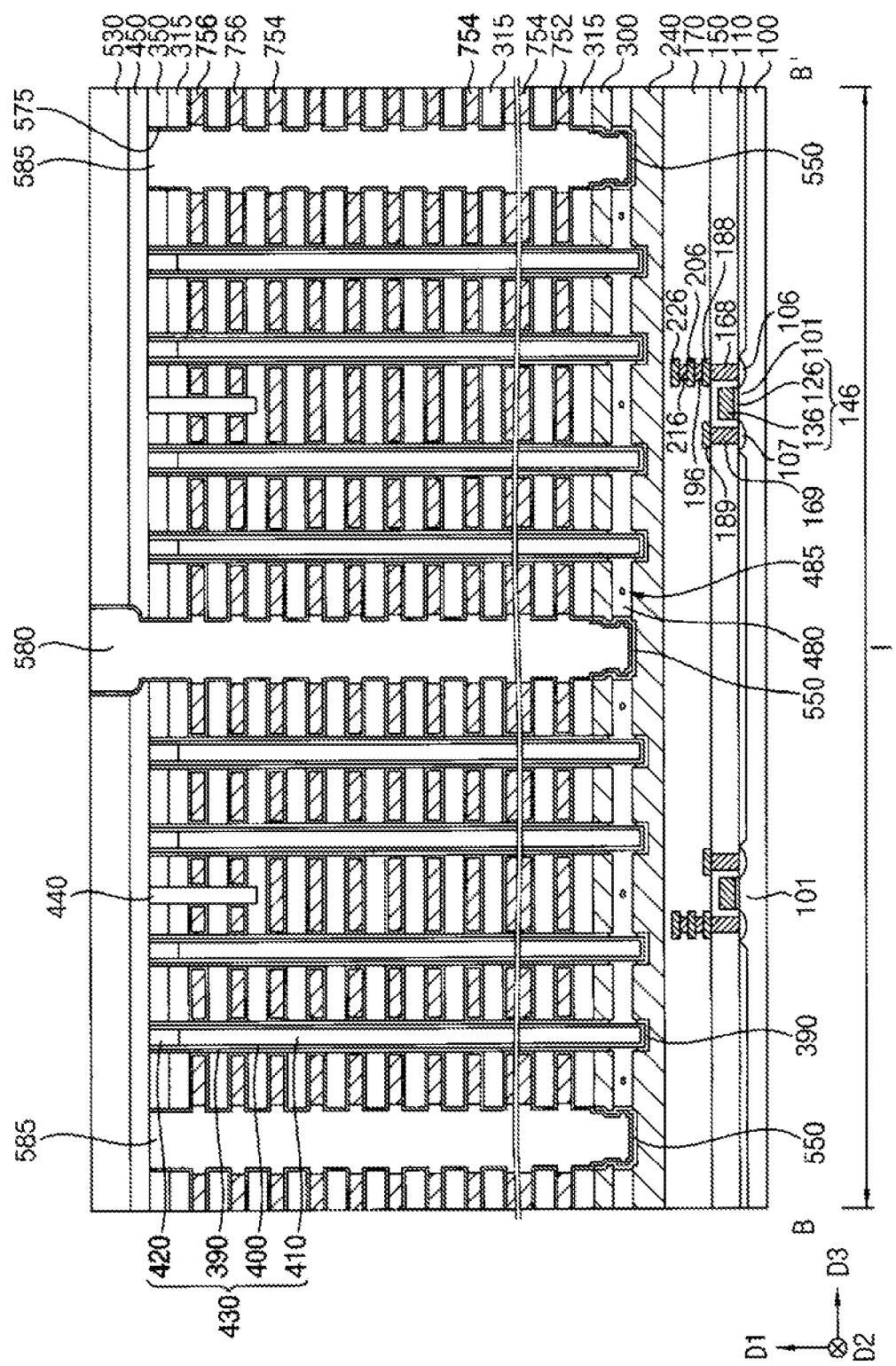
Figure 31:
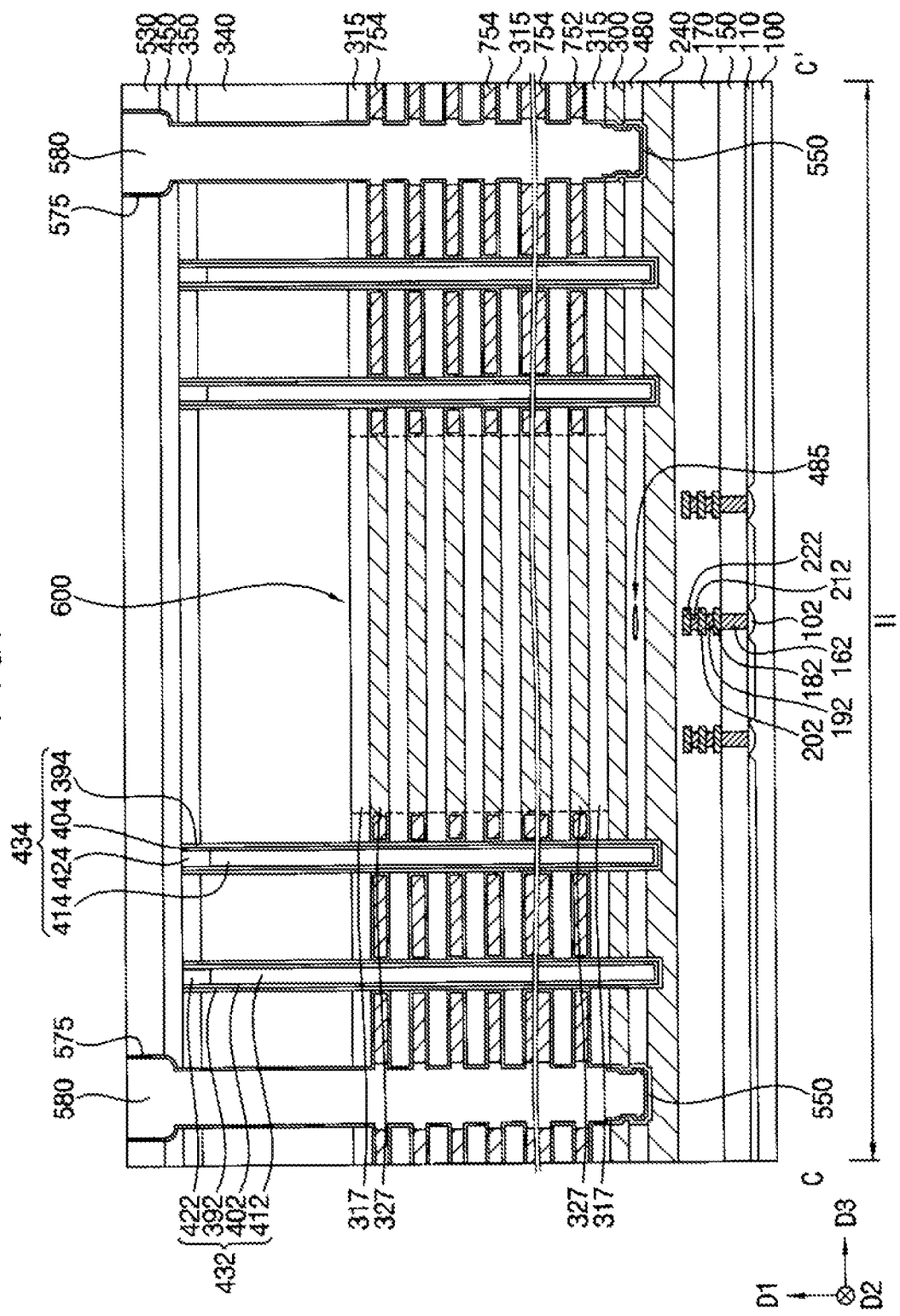

Referring to FIGS. 29 to 31, a third division pattern 580 filling the second and fourth openings 460 and 540 and a fourth division pattern 585 filling the third and fifth openings 465 and 545 may be formed on the second blocking layer 570, and may be planarized until an upper surface of the second support layer 530 is exposed. Thus, the second blocking layer 570 may be transformed into a second blocking pattern 575.

The third and fourth division patterns 580 and 585 may include an oxide, e.g., silicon oxide.

Figure 32:
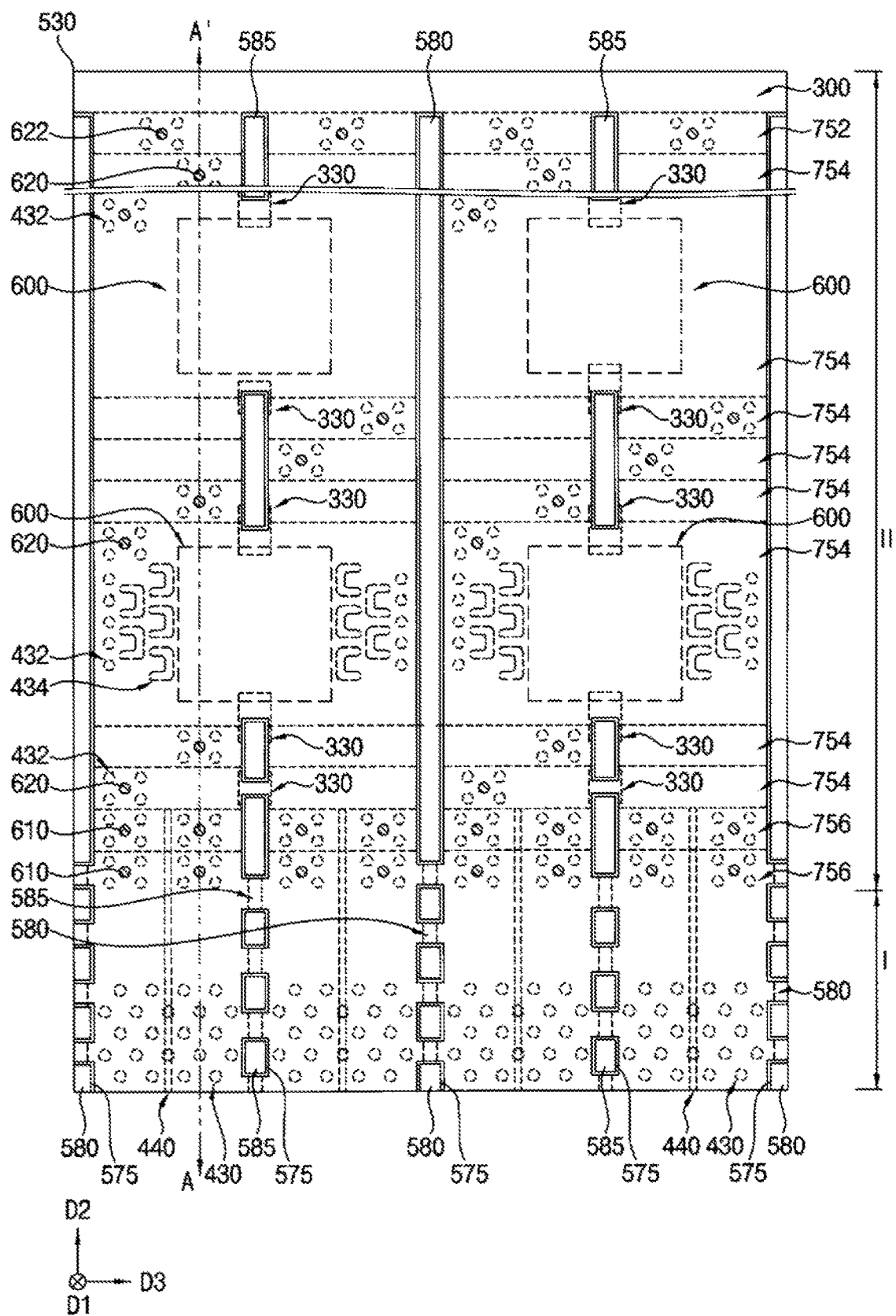
Figure 33:
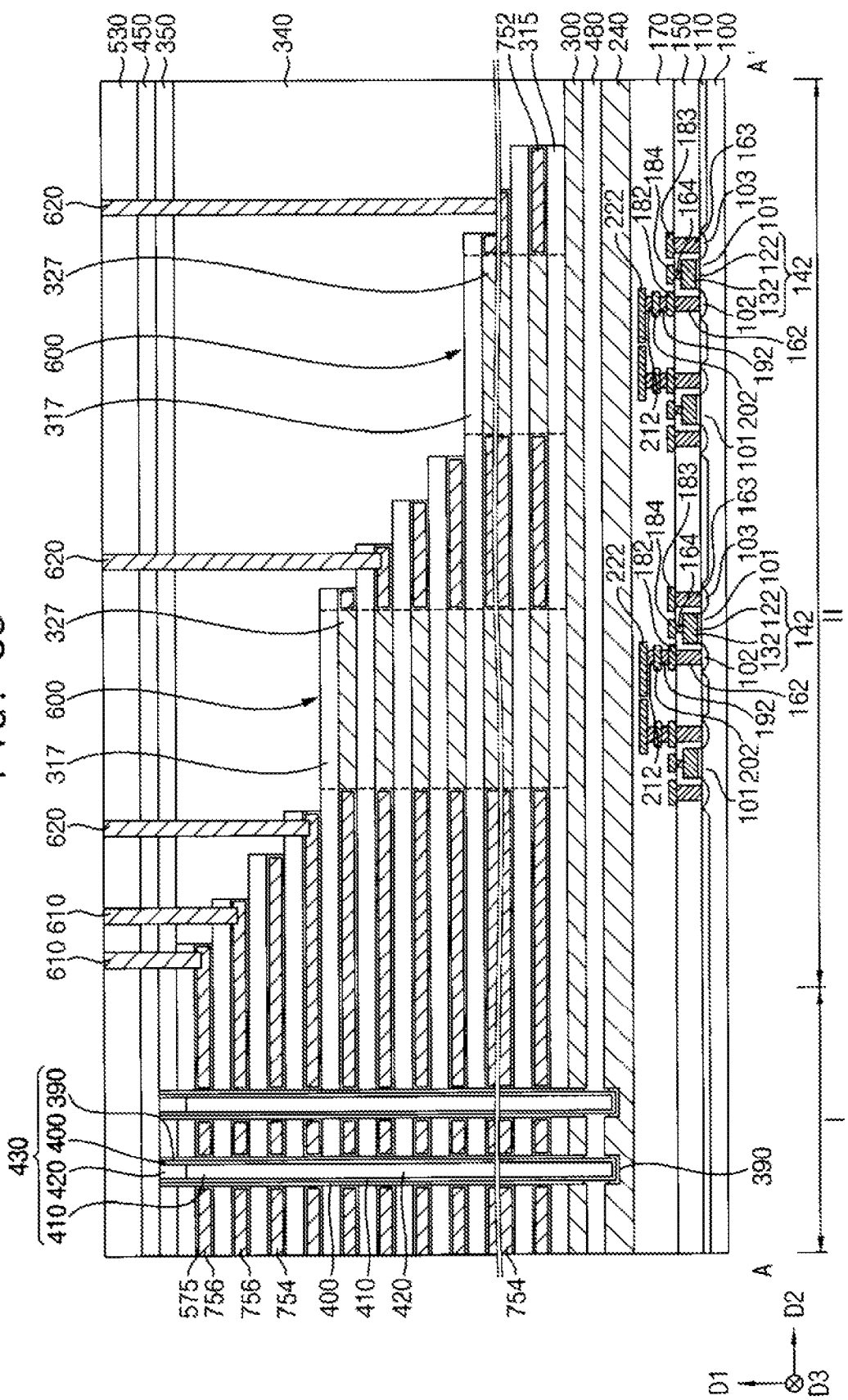

Referring to FIGS. 32 and 33, first to third upper contact plugs 610, 620, and 622 may be formed through the second support layer 530, the third to fifth insulating interlayers 340, 350 and 450, and the first insulation pattern 315 on the second region II of the substrate 100.

The first to third contact plugs 610, 620, and 622 may contact pads of the third, second and first gate electrodes 756, 754, and 752, respectively. In example embodiments, each of the first to third upper contact plugs 610, 620, and 622 may be formed in an area surrounded by the first support structures 432 in each of the first and second pads of the gate electrode structure. For example, the first support structures 432 may be disposed at vertices of a rectangle in a plan view, and each of the first to third upper contact plugs 610, 620, and 622 may be formed in an inside of the rectangle. However, the numbers and layouts of the first to third upper contact plugs 610, 620, and 622 may not be limited to those shown in FIG. 32.

Figure 34:
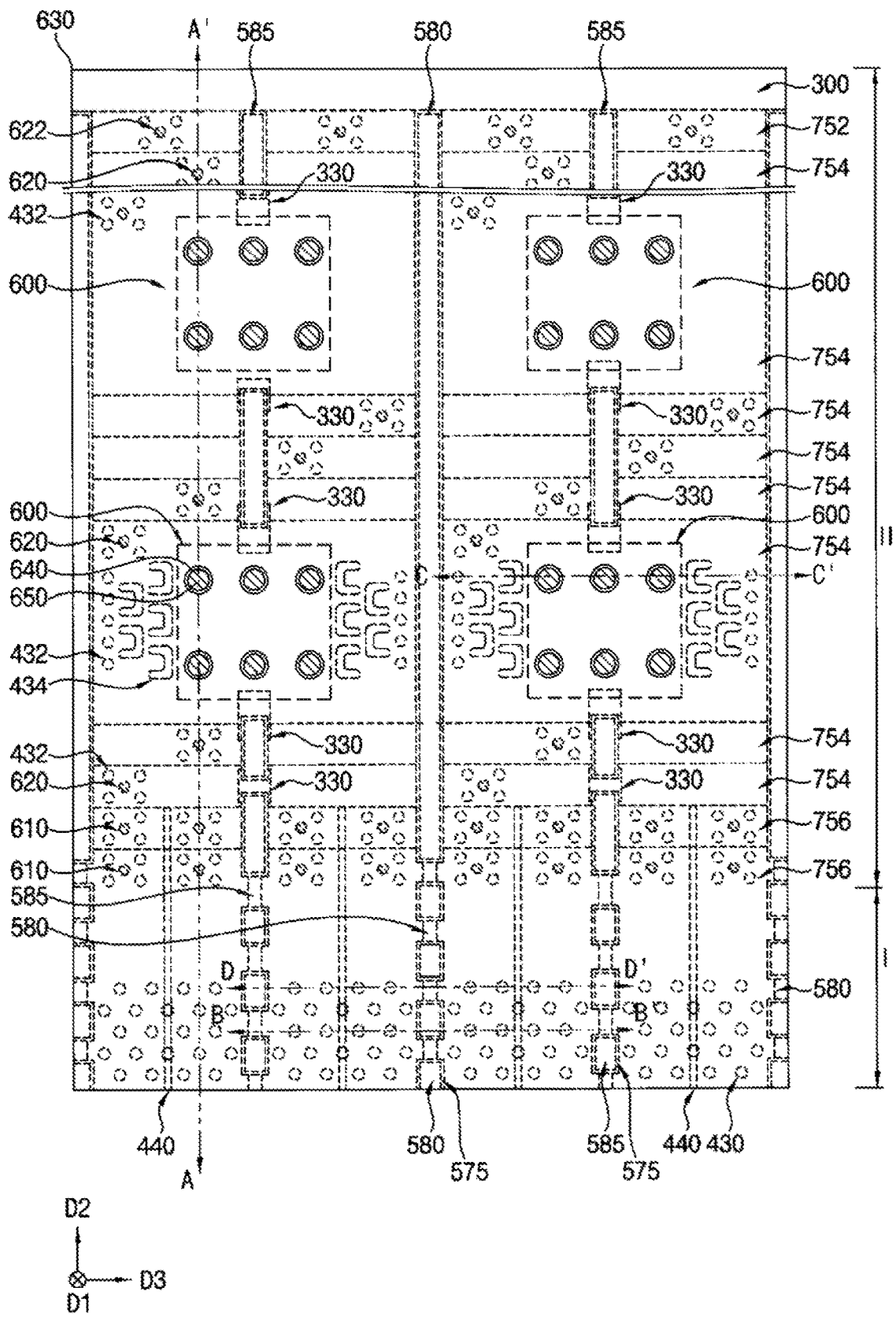
Figure 35:
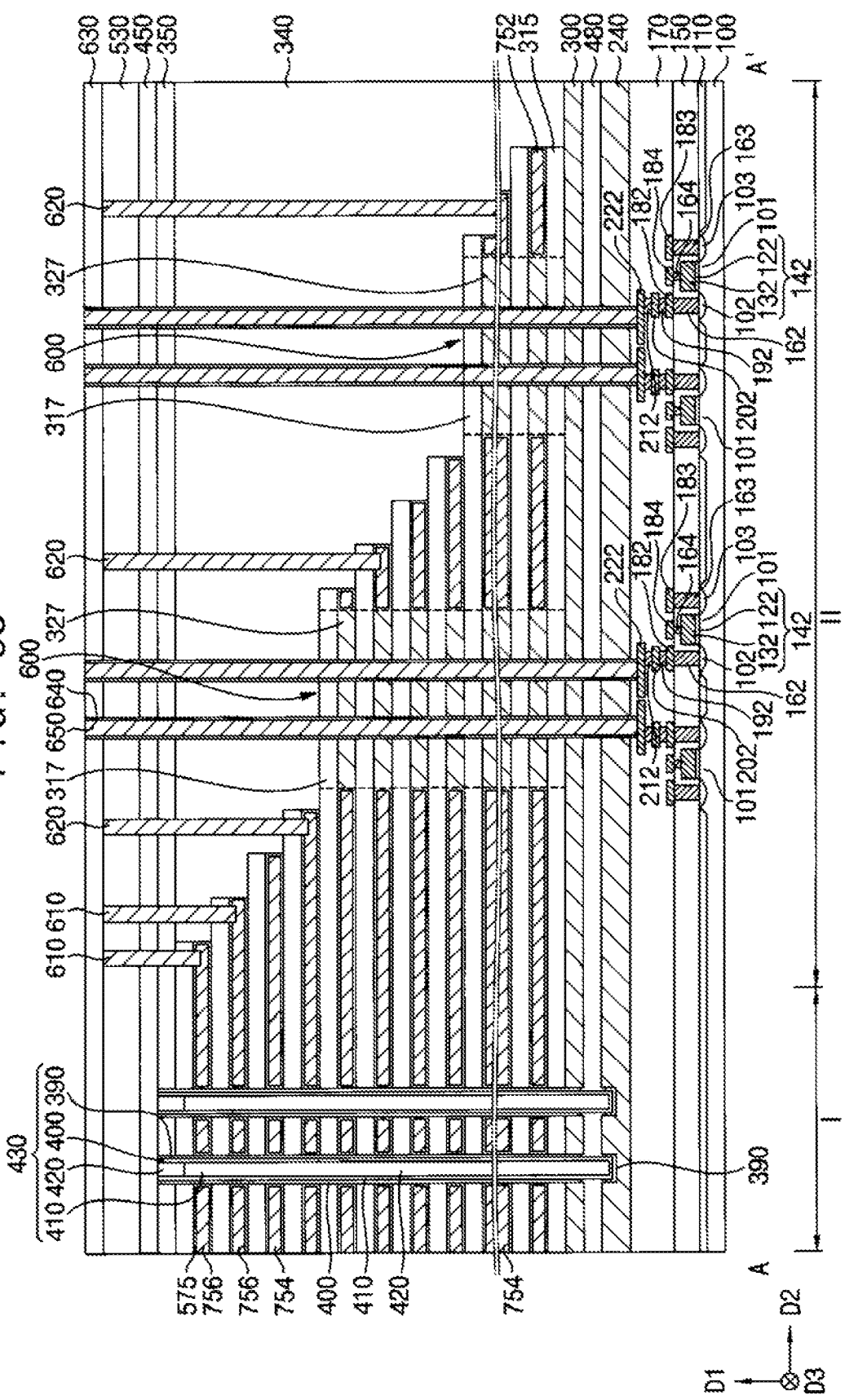
Figure 36:
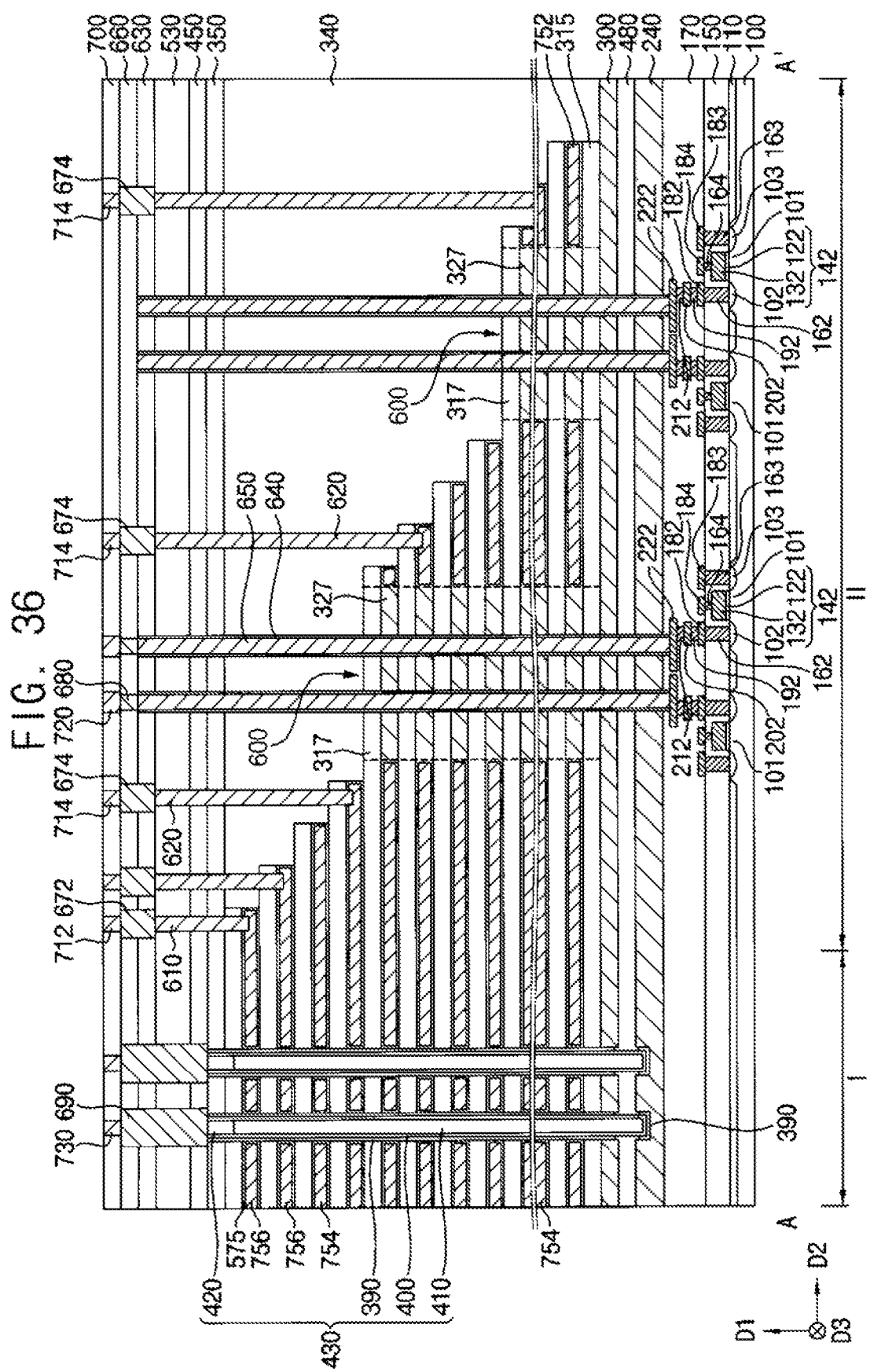

Referring to FIGS. 34 and 35, a sixth insulating interlayer 630 may be formed on the second support layer 530 and the first to third upper contact plugs 610, 620, and 622.

A through via 650 may be formed through the insulation pattern structure 600, the first support layer 300, the channel connection pattern 480, the CSP 240, and the second insulating interlayer 170 to contact an upper surface of the eighth lower wiring 222. A plurality of through vias 650 may be formed to be spaced apart from each other in an area where the insulation pattern structure 600 is formed. In the drawing, six through vias 650 are formed in each area, but embodiments are not limited thereto.

A fourth insulation pattern 640 may be formed on a sidewall of the through via 650, and may be electrically connected to the first support layer 300, the channel connection pattern 480, and the CSP 240. However, the through via 650 may extend through the insulation pattern structure 600 (i.e., through the second and third insulation patterns 317 and 327) to be electrically insulated from the first to third gate electrodes 752, 754, and 756. Thus, if an additional insulation pattern is formed on sidewalls of the first support layer 300, the channel connection pattern 480, and the CSP 240, then the fourth insulation pattern 640 may not be formed.

The first to third contact plugs 610, 620, and 622 and the through via 650 may include, e.g., a metal, a metal nitride, a metal silicide, etc. The fourth insulation pattern 640 may include an oxide, e.g., silicon oxide.

A common source contact plug may be further formed through a portion of the first support layer 300 that is not covered by the gate electrode structure.

Referring to FIGS. 36 to 39, a seventh insulating interlayer 660 may be formed on the sixth insulating interlayer 630, the fourth insulation pattern 640, and the through via 650. Fourth and fifth upper contact plugs 672 and 674, a sixth upper contact plug, and seventh and eighth upper contact plugs 680 and 690 may be formed.

The fourth and fifth upper contact plugs 672 and 674 and the sixth upper contact plug may extend through the sixth and seventh insulating interlayers 630 and 660 to contact upper surfaces of the first to third upper contact plugs 610, 620, and 622, respectively. The seventh upper contact plug 680 may extend through the seventh insulating interlayer 660 to contact an upper surface of the through via 650. The eighth upper contact plug 690 may extend through the second support layer 530 and the fifth to seventh insulating interlayers 450, 630, and 660 to contact an upper surface of the capping pattern 420.

An eighth insulating interlayer 700 may be formed on the seventh insulating interlayer 660, the fourth and fifth upper contact plugs 672 and 674, the sixth upper contact plug, and the seventh and eighth upper contact plugs 680 and 690.

First and second upper wirings 712 and 714, a third upper wiring, and fourth and fifth upper wirings 720 and 730 may be formed. The first and second upper wirings 712 and 714 may contact upper surfaces of the fourth and fifth upper contact plugs 672 and 674. The third upper wiring may contact an upper surface of the sixth upper contact plug. The fourth and fifth upper wirings 720 and 730 may contact upper surfaces of the seventh and eighth upper contact plugs 680 and 690, respectively.

In example embodiments, the fifth upper wiring 730 may extend in the third direction D3. A plurality of fifth upper wirings 730 may be formed. The fifth upper wiring 730 may serve as a bit line. Alternatively, an additional upper via and a sixth upper wiring may be further formed on the fifth upper wiring 730, and the sixth upper wiring may serve as a bit line.

The numbers and layouts of the first and second upper wirings 712 and 714, the third upper wiring, and the fourth upper wiring 720 on the second region II of the substrate 100 may be varied.

The fabrication of the semiconductor device may be completed by the above processes.

As described above, even though the second and third openings 460 and 465 (each of which may extend through the mold in the second direction D2) are formed, the mold may not lean or fall down due to the first to third support structures 432, 434, and 436 extending through the mold. In a plan view, unlike the first support structure 432 having a circular or rectangular shape, the second and third support structures 434 and 436 may have a concavo-convex shape, e.g., a shape of "C," "U," or "T," and the not-open failure (in which the second and third dummy channel holes for forming the second and third support structures 434 and 436, respectively, do not expose the upper surface of the CSP 240) may be reduced. Accordingly, the second and third support structures 434 and 436 filling the second and third dummy channel holes, respectively, may stably support the mold.

Particularly, the dummy channel holes between the insulation pattern structure 600 and the second opening 460 may be vulnerable to the not-open failure. However, each of the dummy channel holes may have a concavo-convex shape, so that the second and third support structures 434 and 436 having a stable structure may be formed.

The semiconductor device may have the following structural characteristics.

Referring to FIG. 34 and FIGS. 36 to 39, the semiconductor device may include the lower circuit patterns on the substrate 100 including the first region I and the second region II at least partially surrounding the first region I; the CSP 240 over the lower circuit patterns; the gate electrode structure including the gate electrodes 752, 754, and 756, each of which may extend in the second direction D2, spaced apart from each other in the first direction D1 on the CSP 240; the memory channel structure 430 including the channel 400 extending in the first direction D1 through the gate electrode structure on the first region I of the substrate 100 to contact the upper surface of the CSP 240 and the charge storage structure 390 on the outer sidewall of the channel 400; the third division pattern 580 extending in the second direction D2 on each of opposite sides in the third direction D3 of the gate electrode structure; the insulation pattern structure 600 extending through a portion of the gate electrode structure on the CSP 240; the through via 650 extending in the first direction D1 through the insulation pattern structure 600 and the CSP 240 to contact and be electrically connected to one of the lower circuit patterns; the contact plugs 610, 620, and 622 extending in the first direction D1 to contact end portions in the second direction D2, that is, the pads of the gate electrodes 752, 754, and 756; the first support structure 432 extending in the first direction D1 through the gate electrode structure to contact the upper surface of the CSP 240, which may be adjacent to the contact plugs 610, 620, and 622; and the second support structure or the third support structure extending in the first direction D1 through a portion of the gate electrode structure between the insulation pattern structure 600 and the third division pattern 580.

Figure 40:
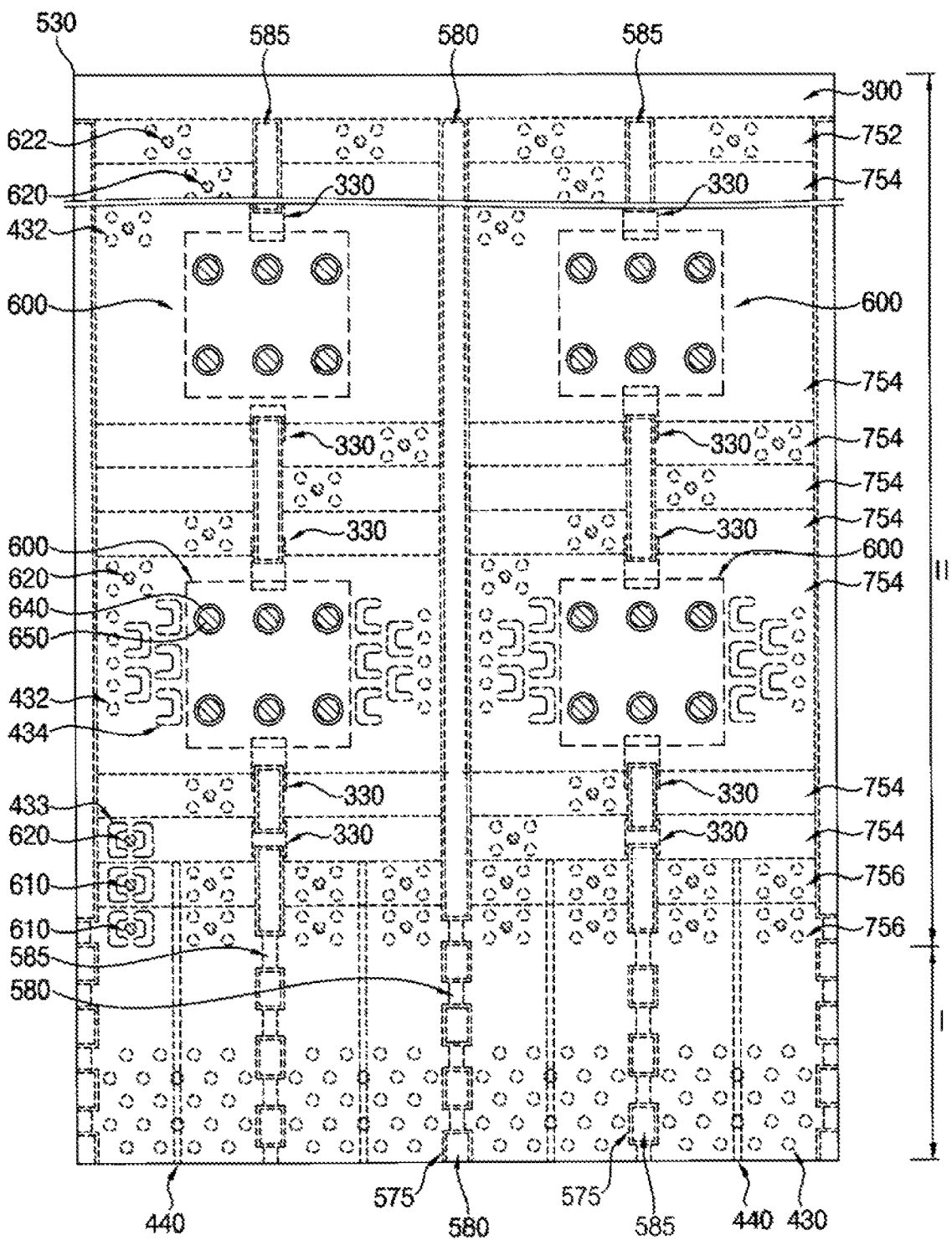
FIG. 40 is a plan view illustrating a semiconductor device in accordance with example embodiments, which may correspond to FIG. 34.

FIG. 40 is a plan view illustrating a semiconductor device in accordance with example embodiments, which may correspond to FIG. 34. This semiconductor device may be substantially the same as or similar to that of FIGS. 34 and 36 to 39, except that some of the first support structures 432 are replaced with fourth support structures 433.

Referring to FIG. 40, some of the first support structures 432 may be replaced with the fourth support structures 433. The fourth support structures 433 may surround each of the first to third upper contact plugs 610, 620, and 622 extending through each of the first and second pads of the gate electrode structure. In example embodiments, each of the fourth support structures 433 may have a shape of "C" or "U" in a plan view.

As shown in FIG. 40, the fourth support structures 433 may be formed at opposite sides in the third direction D3 of each of the first to third upper contact plugs 610, 620, and 622. Alternatively, the fourth support structures 433 may be formed at opposite sides in the second direction D2 of each of the first to third upper contact plugs 610, 620, and 622.

In a plan view, the fourth support structures 433 having the shape of "C" or "U" may be formed instead of the first support structures 432 having the circular or rectangular shape. Thus, a fourth dummy channel hole for forming the fourth support structure 433 may be formed to contact the upper surface of the CSP 240, so that the fourth support structure 433 may be formed in the fourth dummy channel hole to have a stable structure.

In other example embodiments, each of the fourth support structures 433 may have a shape of "T" instead of the circular or rectangular shape in a plan view. Alternatively, some ones of the fourth support structures 433 may have a shape of "C" or "U," and other ones of the fourth support structures 433 may have a shape of "T" in a plan view.

In still other example embodiments, all of the first support structures 432 may be replaced with the fourth support structures 433.

Figure 41:
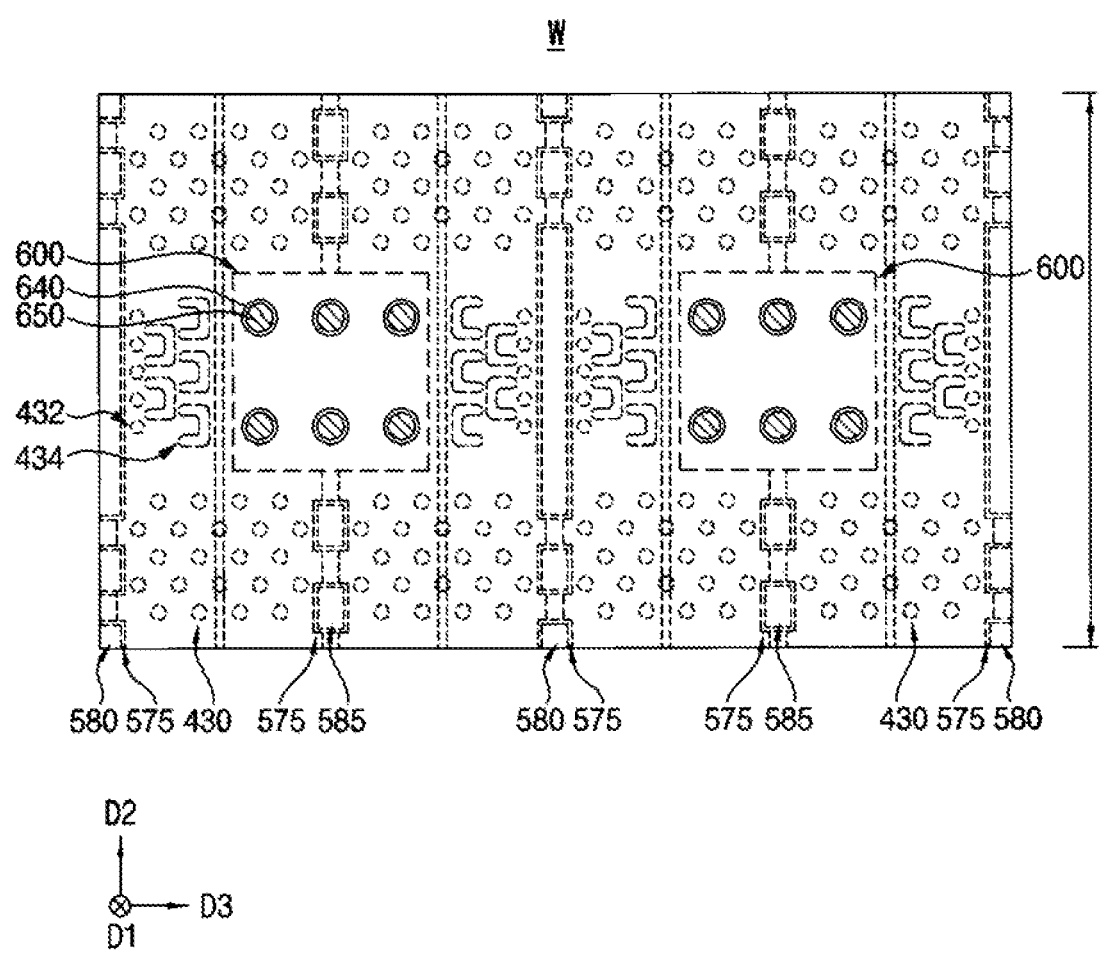
FIG. 41 is a plan view illustrating a semiconductor device in accordance with example embodiments, which may be a plan view of region W in FIG. 5.

FIG. 41 is a plan view illustrating a semiconductor device in accordance with example embodiments, which may be a plan view of region W in FIG. 5. This semiconductor device may be substantially the same as or similar to that of FIGS. 34 and 36 to 39, except that the insulation pattern structure 600, the through via 650, and the first and second support structures 432 and 434 may be formed even on the first region I of the substrate 100.

Referring to FIG. 41, the insulation pattern structure 600 may be formed between the third division patterns 580, which may be formed between neighboring ones of the second openings 460 in the third direction D3, at a dummy region even on the first region I of the substrate 100. The through via 650 may extend through the insulation pattern structure 600 to be electrically connected to the lower circuit patterns.

Also, the first and second support structures 432 and 434 may be further formed between the insulation pattern structure 600 and the third division patterns 580, which may have layouts similar to or the same as the first and second support structures 432 and 434 in each second pad on the second region II of the substrate 100. In example embodiments, the third support structures 436 may be formed instead of the second support structures 434, or both the second and third support structures 434 and 436 may be formed.

Figure 42A:
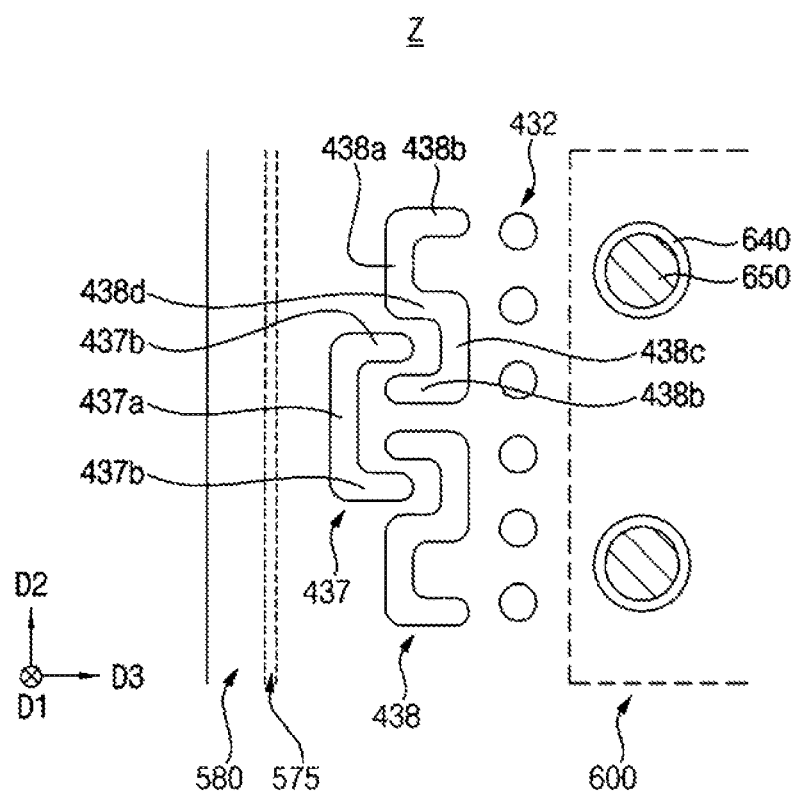
FIGS. 42A and 42B are plan views illustrating semiconductor devices in accordance with example embodiments, which may be plan views of region Z in FIG. 10 and may correspond to FIGS. 11 to 13.
Figure 42B:
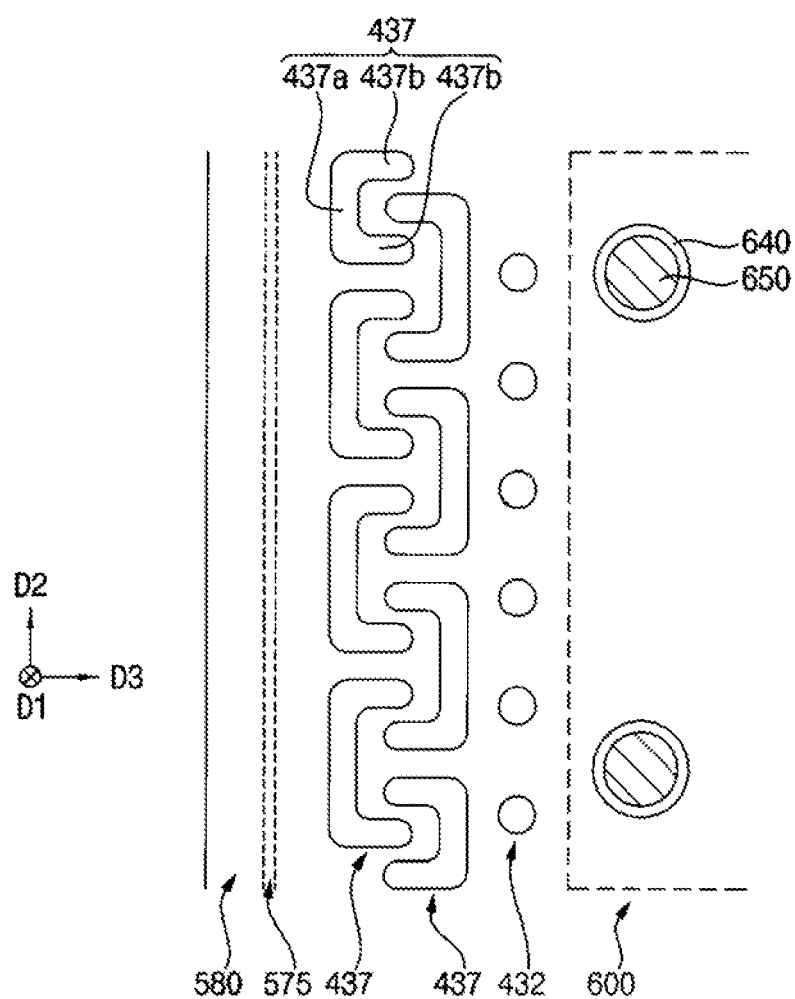

FIGS. 42A and 42B are plan views illustrating semiconductor devices in accordance with example embodiments, which may be plan views of region Z in FIG. 10 and may correspond to FIGS. 11 to 13. This semiconductor device may be substantially the same as or similar to that of FIGS. 34 and 36 to 39, except for including fifth and sixth support structures 437 and 438 instead of the second support structure 434.

Referring to FIG. 42A, the fifth support structure 437 having a shape of "C" or "U" and the sixth support structure 438 having a shape of "2" or "5" in a plan view may be formed between the third division pattern 580 and the insulation pattern structure 600. The first support structure 432 may be further formed.

In an example embodiment, the fifth support structure 437 may have a shape of "C" or "U" in which a concave portion facing the third direction D3 extends in the second direction D2. Two sixth support structures 438 (each of which may have a shape of "5" or "2" extending in the second direction D2, and which may be arranged in mirror image and spaced apart from each other in the second direction D2) may be arranged such that end portions of the two sixth support structures 438 face the concave portion of the fifth support structure 437. The fifth and sixth support structures 437 and 438 may be spaced apart from each other in the third direction D3.

In example embodiments, the fifth support structure 437 may include a first extension portion 437a extending in the second direction D2, and second extension portions 437b extending in the third direction D3 from opposite end portions in the second direction D2 of the first extension portion 437a. Each of the second extension portions 437b may extend toward a corresponding sixth support structure 438.

In example embodiments, the sixth support structure 438 may include first and second extension portions 438a and 438c that are not aligned with each other along the second direction D2 by being spaced apart from each other in the third direction D3. Also, the sixth support structure 438 may include and third and fourth extension portions 438b and 438d spaced apart from each other in the second direction D2. An end portion in the second direction D2 of the first extension portion 438a may overlap, in the third direction D3, a corresponding end portion in the second direction D2 of the second extension portion 438c. The fourth extension portion 438d may connect the end portions of the first and second extension portions 438a and 438c, which may be adjacent to each other and overlap each other in the third direction D3. Respective third extension portions 438b may extend in the third direction D3 from end portions of the first and second extension portions 438a and 438c, which may be distal to each other and may not overlap each other in the third direction D3.

In example embodiments, a plurality of sixth support structures 438 may be spaced apart from each other in the second direction D2, and one of the third extension portions 438b of each of two sixth support structures 438 neighboring in the second direction D2 may face the first extension portion 437a of the fifth support structure 437 in the third direction D3.

Referring to FIG. 42B, the fifth support structure 437 having the shape of "C" or "U" in a plan view may be formed between the third division pattern 580 and the insulation pattern structure 600. The first support structure 432 may be further formed.

In example embodiments, a plurality of fifth support structures 437 may be arranged in the second direction D2 to form a support structure column, and first and second support structure columns may be formed to be spaced apart from each other in the third direction D3. The fifth support structures included in the first and second support structure columns may be arranged in a zigzag pattern, e.g., to alternate while overlapping, in the second direction D2. In example embodiments, each second extension portion 437b of each fifth support structure 437 included in the first support structure column may extend toward the first extension portion 437a of a corresponding one of the fifth support structures 437 in the second support structure column, and each second extension portion 437b of each fifth support structure 437 included in the second support structure column may extend toward the first extension portion 437a of a corresponding one of the fifth support structures 437 in the first support structure column.

Fifth and sixth dummy channel holes for forming the fifth and sixth support structures 437 and 438 may have a reduced not-open failure due to the second and third dummy channel holes for forming the second and third support structures 434 and 436, and thus the fifth and sixth support structures 437 and 438 may have stable structures.

As illustrated with reference to FIGS. 10 to 16, the fifth and sixth support structures 437 and 438 may also be formed at an area where the second pads of the gate electrodes 752, 754, and 756 are formed on the second region II of the substrate 100, or may be formed in the dummy region on the first region I of the substrate 100 As illustrated with reference to FIG. 41.

Figure 43:
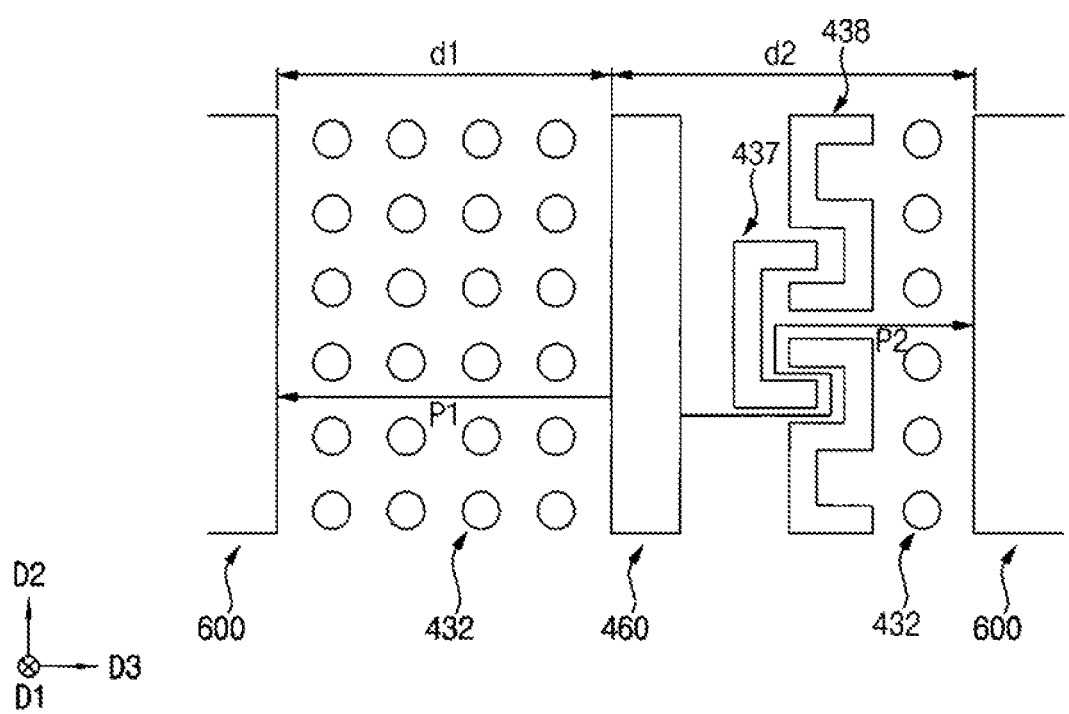
FIG. 43 is a plan view illustrating the relationship between the fifth and sixth support structures 437 and 438 and the etching process for forming the second gap 560 by removing the fourth sacrificial patterns 325 illustrated with reference to FIGS. 25 and 26.

FIG. 43 is a plan view illustrating the relationship between the fifth and sixth support structures 437 and 438 and the etching process that forms the second gap 560 by removing the fourth sacrificial patterns 325, illustrated with reference to FIGS. 25 and 26.

Referring to FIG. 43 and FIGS. 25 and 26, a wet etching process may be performed using an etching solution so that the fourth sacrificial patterns 325 may be removed through the second and third openings 460 and 465 to form the second gaps 560.

The etching solution provided from the second opening 460 in the third direction D3 may move in opposite directions to the same distance during the same time, so as to remove the fourth sacrificial patterns 325. The first support structures 432 may be formed at one side of the second opening 460, and the etching solution may move in the third direction D3 through a first path P1 shown in FIG. 43. The fifth and sixth support structures 437 and 438 may be formed at the other side of the second opening 460, and the etching solution may move in the third direction D3 through a second path P2 shown in FIG. 43.

As shown in FIG. 43, the fifth and sixth support structures 437 and 438 may be arranged to be adjacent to each other, and thus the second path P2 through which the etching solution move from the second opening 460 may be bent, e.g., convoluted and extended, due to the fifth and sixth support structures 437 and 438. Thus, when compared to the first path P1 through which the etching solution can move straight from the second opening 460 between the first support structures 432, the distance travelled by the etching solution through the second path P2 during the same time may be relatively small. Thus, a second distance d2 from the second opening 460 to the insulation pattern structure 600 (which may be formed in an area that the etching solution does not reach) in an area including the fifth and sixth support structures 437 and 438 may be less than a first distance d1 from the second opening 460 to the insulation pattern structure 600 in an area including the first support structures 432.

Accordingly, a length in the third direction D3 of the insulation pattern structure 600 between neighboring ones of the second openings 460 in the third direction D3 may be increased by replacing some of the first support structures 432 adjacent to the second opening 460 with the fifth and sixth support structures 437 and 438, which may increase an area of the insulation pattern structure 600. Also, the layouts of the insulation pattern structure 600 and the second and third openings 460 and 465 may be adjusted. These features may be obtained by the combination of the fifth and sixth support structures 437 and 438 shown in FIG. 42A, or by the combination of the fifth support structures 437 shown in FIG. 42B.

Figure 44:
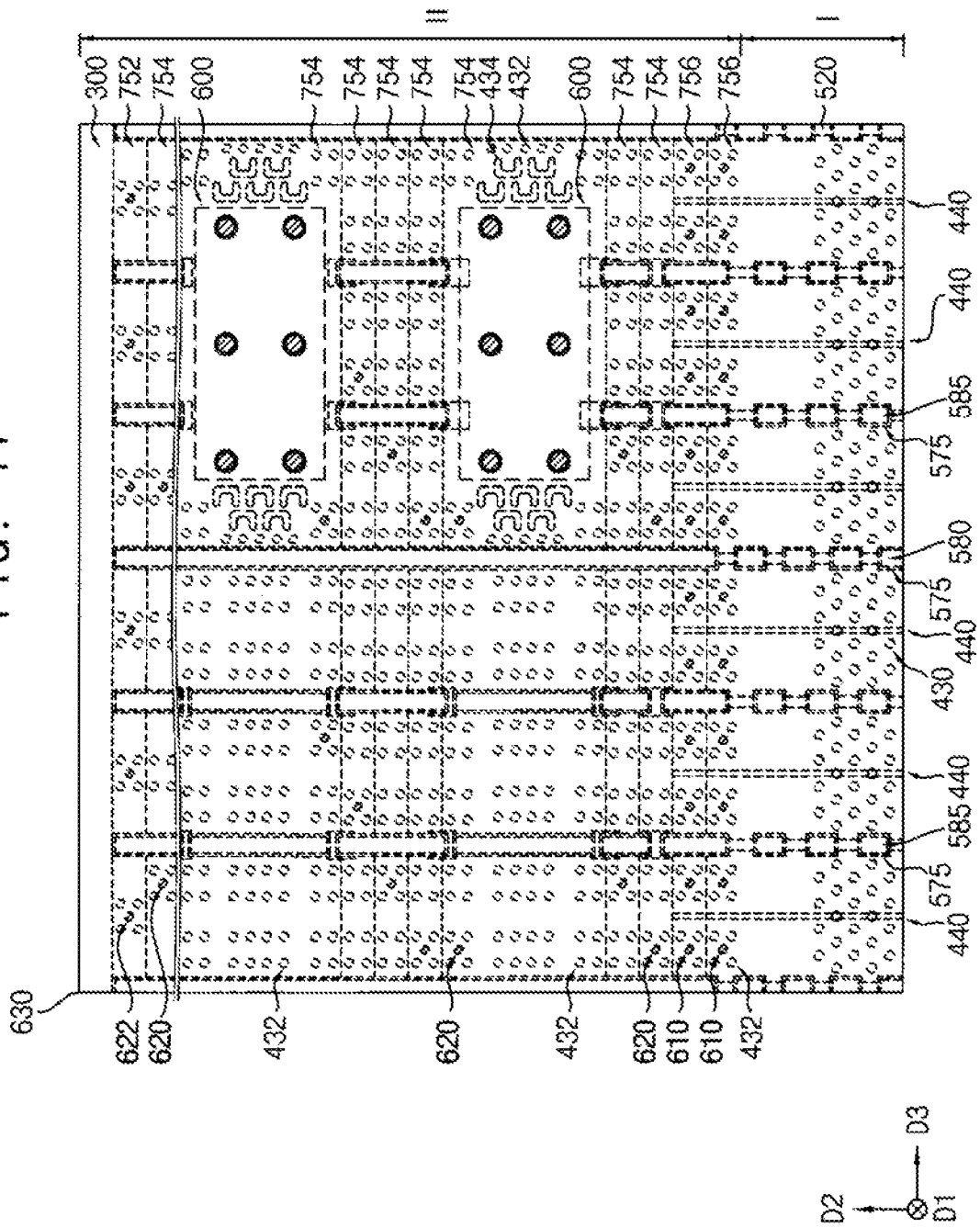
FIG. 44 is a cross-sectional view illustrating a semiconductor device in accordance with example embodiments, which may correspond to FIG. 34.

FIG. 44 is a cross-sectional view illustrating a semiconductor device in accordance with example embodiments, which may correspond to FIG. 34. This semiconductor device may be substantially the same as or similar to that of FIGS. 34 and 36 to 39, except for the layouts of the fourth division pattern 585 and the insulation pattern structure 600.

Referring to FIG. 44, among two memory blocks disposed in the third direction D3, the insulation pattern structure 600 and the through via 650 extending in the first direction D1 through the insulation pattern structure 600 may be formed at each second pad of the gate electrode structure included in a first memory block, and the fourth division pattern 585 may be formed at each second pad of the gate electrode structure included in a second memory block to be spaced apart from the fourth division patterns 585 at the first pads of the gate electrode structure.

The second support structures 434 and/or the third support structures 436 may be formed between each of the third division patterns 580 and the insulation pattern structure 600 in the first memory block, while the first support structures 432 may be formed between the third and fourth division patterns 580 and 585 in the second memory block.

In FIG. 44, in the first memory block, two fourth division patterns 585 neighboring in the third direction D3 are shown, but embodiments are not limited thereto. For example, if the fifth and sixth support structures 437 and 438 are formed at an area adjacent to the third division patterns 580 illustrated with reference to FIGS. 42A, 42B and 43, the insulation pattern structure 600 may have a relatively large area, and thus only one fourth division pattern 585 may be formed between the third division patterns 580.

In general, during an etching process that forms the second gap 560 by removing the fourth sacrificial patterns 325, in order to obtain a desired area of the insulation pattern structure 600 in consideration of the distance of the etching solution moving in the third direction D3, the distance between the third division patterns 580 may be increased, so that two or more than two fourth division patterns 585 may be arranged. However, in example embodiments, the fifth and sixth support structures 437 and 438 may be arranged to decrease the moving distance of the etching solution so that the insulation pattern structure 600 may have a sufficient area even without the increase of the distance between the third division patterns 580. Accordingly, the distance between the third division patterns 580 may be reduced, and the number of the third division patterns 580 may be reduced.

Figure 37:
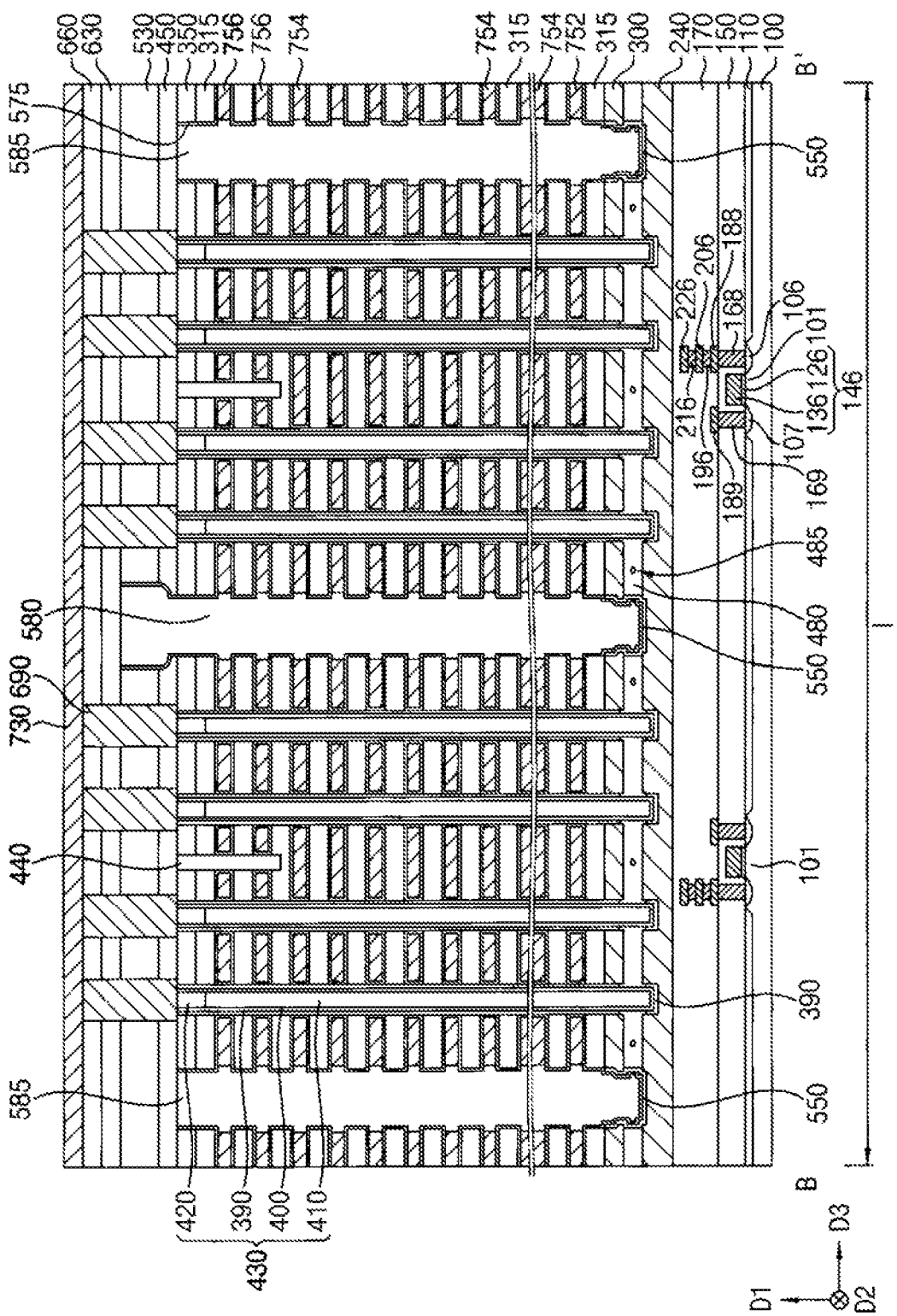
Figure 38:
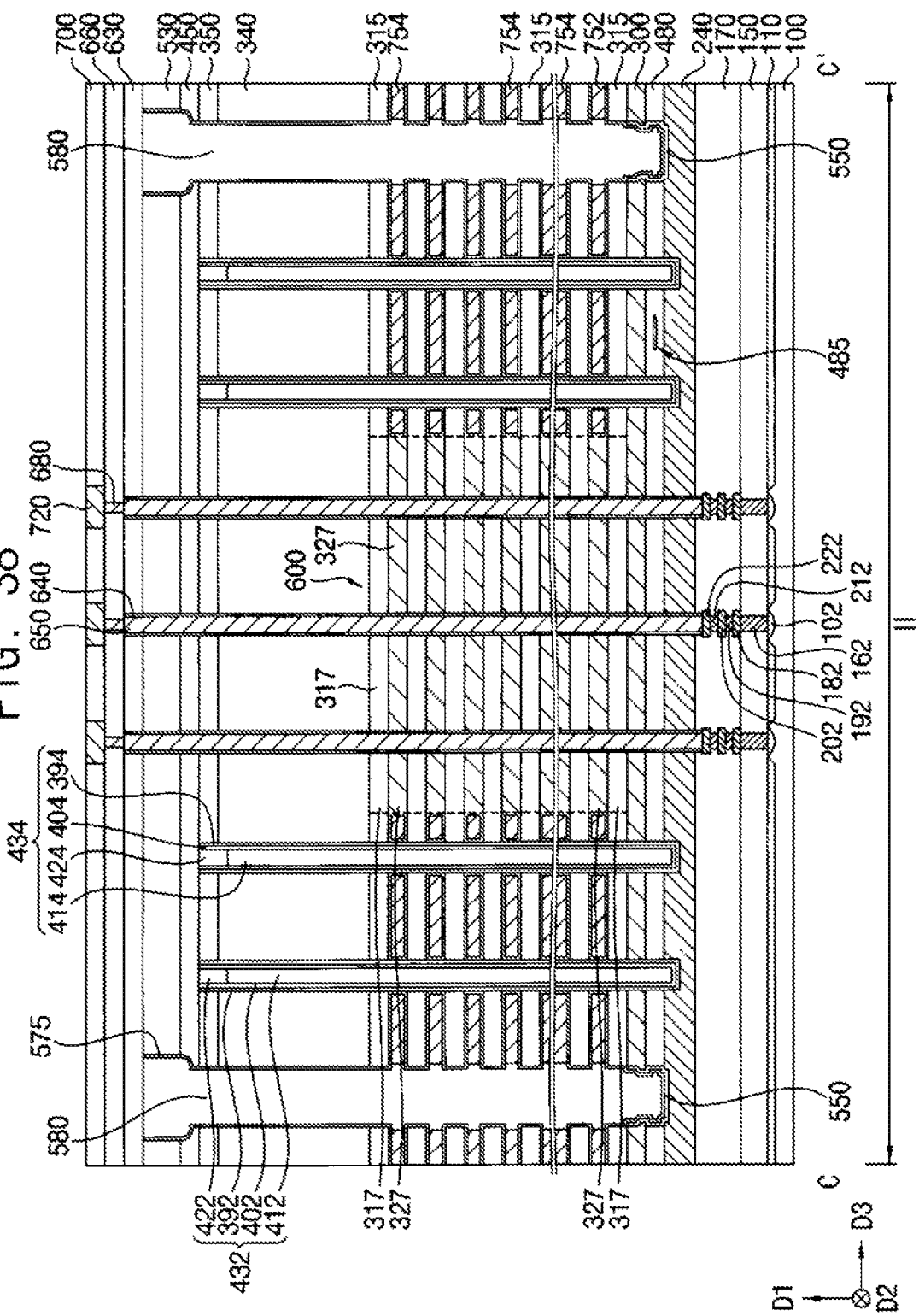
Figure 45:
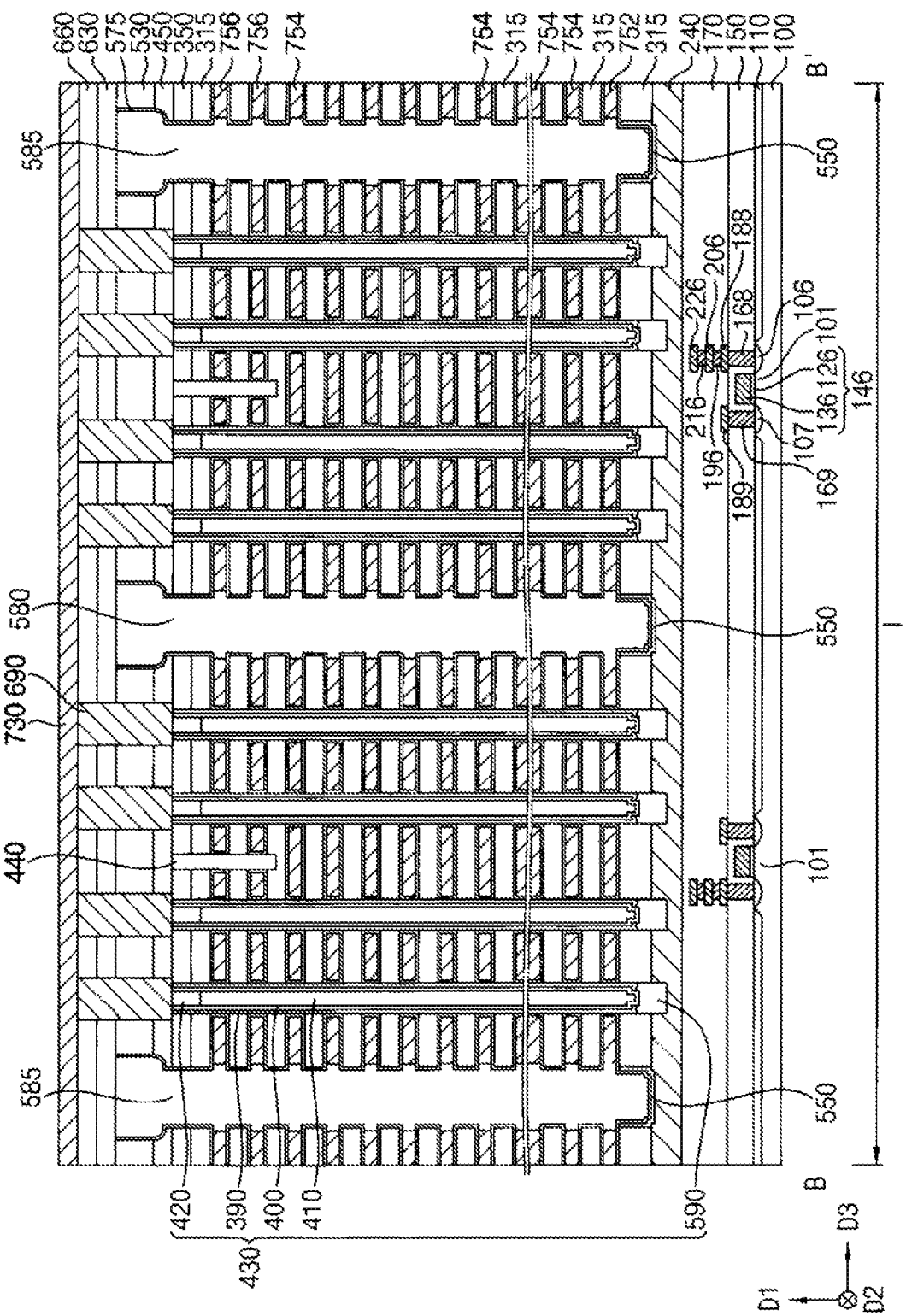
FIG. 45 is a cross-sectional view illustrating a semiconductor device in accordance with example embodiments, which may correspond to FIG. 37.

FIG. 45 is a cross-sectional view illustrating a semiconductor device in accordance with example embodiments, which may correspond to FIG. 37. This semiconductor device may be substantially the same as or similar to that of FIGS. 34 and 36 to 39, except for the memory channel structure 430, the channel connection pattern 480, and the first support layer 300.

The memory channel structure 430 may further include a semiconductor pattern 590 on the substrate 100. The charge storage structure 390, the channel 400, the filling pattern 410, and the capping pattern 420 may be formed on the semiconductor pattern 590.

The semiconductor pattern 590 may include, e.g., single crystalline silicon or polysilicon. In an example embodiment, an upper surface of the semiconductor pattern 590 may be formed at a height between lower and upper surfaces of the first insulation pattern 315 between the first and second gate electrodes 752 and 754. The charge storage structure 390 may have a cup-like shape of which a central lower surface is opened, e.g., at a bottom of the charge storage structure 390, and may contact an edge upper surface of the semiconductor pattern 590. The channel 400 may have a cup-like shape, e.g., at a bottom of the channel 400, and may contact a central upper surface of the semiconductor pattern 590. Thus, the channel 400 may be electrically connected to the CSP 240 through the semiconductor pattern 590.

The channel connection pattern 480 and the first support layer 300 may not be formed between the CSP 240 and the first gate electrode 752. In an example embodiment, one of the first insulation patterns 315 between the first and second gate electrodes 752 and 754 may have a thickness greater than those of other ones of the first insulation pattern 315 at upper levels.

Figure 46:
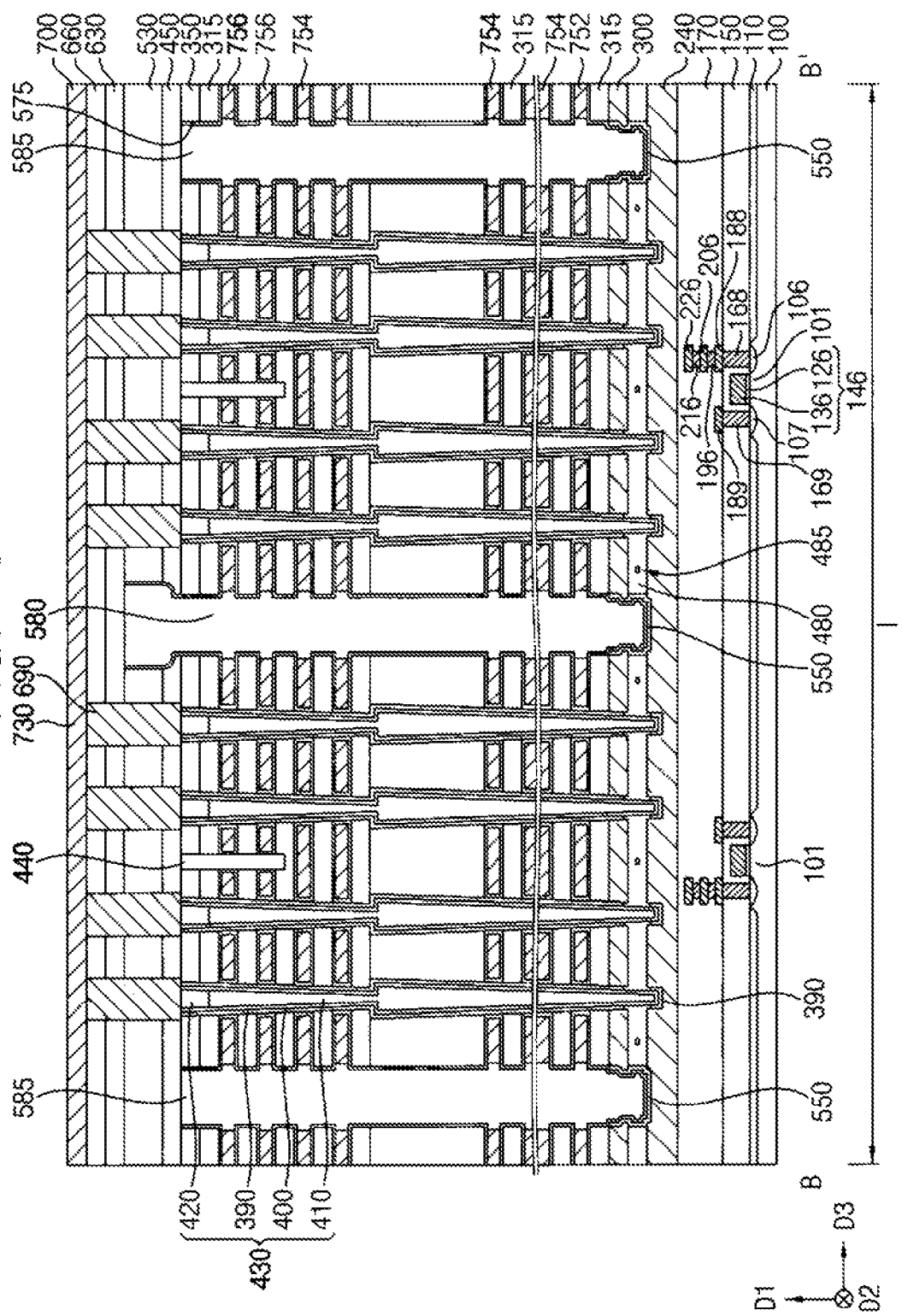
FIG. 46 is a cross-sectional view illustrating a semiconductor device in accordance with example embodiments, which may correspond to FIG. 37.

FIG. 46 is a cross-sectional view illustrating a semiconductor device in accordance with example embodiments, which may correspond to FIG. 37. This semiconductor device may be substantially the same as or similar to that of FIGS. 34 and 36 to 39, except for the memory channel structure 430.

The memory channel structure 430 may include lower and upper portions sequentially stacked. Each of the lower and upper portions may have a width gradually increasing from a bottom toward a top thereof. In example embodiments, a lower surface of the upper portion of the memory channel structure 430 may have an area that is less than an area of an upper surface of the lower portion of the memory channel structure 430.

In FIG. 46, the memory channel structure 430 includes two portions, that is, the lower and upper portions, but embodiments are not limited thereto, and the memory channel structure 430 may include more than two portions. Each of the portions of the memory channel structure 430 may have a width gradually increasing from a bottom toward a top thereof, and an area of a lower surface of an upper portion may be less than that of an upper surface of a lower portion that is directly under the upper portion.

FIG. 47 is a cross-sectional view illustrating a semiconductor device in accordance with example embodiments, which may correspond to FIG. 37. This semiconductor device may be substantially the same as or similar to that of FIGS. 34 and 36 to 39, except that upper structures are inverted and bonding structures are further formed. The lower circuit patterns may correspond to the peripheral circuit wirings 4110 of FIG. 4. Circuit structures including the lower circuit patterns may correspond to the first structure 4100 of FIG. 4.

In example embodiments, ninth to twelfth insulating interlayers 800, 820, 840, and 860 may be sequentially stacked on the eighth and ninth lower wirings 222 and 226 and the second insulating interlayer 170. Also, a first bonding pattern (extending through the ninth insulating interlayer 800 to contact the eighth lower wiring 222) and a second bonding pattern 810 (extending through the ninth insulating interlayer 800 to contact the ninth lower wiring 226) may be formed. Also, a third bonding pattern (extending through the tenth insulating interlayer 820 to contact the first bonding pattern) and a fourth bonding pattern 830 (extending through the tenth insulating interlayer 820 to contact the second bonding pattern 810) may be formed. The first to third bonding patterns and the second and fourth bonding patterns 810 and 830 may include a metal, e.g., copper, aluminum, etc., and may be formed by, e.g., a dual damascene process.

A seventh upper wiring (extending through the eleventh insulating interlayer 840 to contact the third bonding pattern) and an eighth upper wiring 850 (extending through the eleventh insulating interlayer 840 to contact the fourth bonding pattern 830) may be formed. A first upper via (extending through the twelfth insulating interlayer 860 to contact the seventh upper wiring) and a second upper via 870 (extending through the twelfth insulating interlayer 860 to contact the eighth upper wiring 850) may be formed.

At least some of the first and second upper wirings 712 and 714, the third upper wiring, the fourth and fifth upper wirings 720 and 730, and the sixth upper wiring may be electrically connected to the lower circuit patterns through the first and third bonding patterns or the second and fourth bonding patterns.

By way of summation and review, as a number of stacks of memory cells in a semiconductor device increases, a mold for forming the memory cells may be deformed.

As described above, embodiments may provide a semiconductor device having improved characteristics, and may provide a massive data storage system including a semiconductor device having improved characteristics. In a method of manufacturing a semiconductor device in accordance with example embodiments, support structures for preventing the deformation of a mold may be stably formed, and thus the semiconductor device including the support structures may have enhanced characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
a gate electrode structure on a substrate, the gate electrode structure including gate electrodes spaced apart from each other in a first direction perpendicular to an upper surface of the substrate, each of the gate electrodes extending in a second direction parallel to the upper surface of the substrate;
a channel extending in the first direction through the gate electrode structure;
a division pattern at each of opposite sides of the gate electrode structure in a third direction, the third direction being parallel to the upper surface of the substrate and crossing the second direction, the division pattern extending in the second direction;
an insulation pattern structure extending through a portion of the gate electrode structure;
a through via extending in the first direction through the insulation pattern structure;
a first support structure extending in the first direction through the gate electrode structure; and
a second support structure extending in the first direction through a portion of the gate electrode structure between the insulation pattern structure and the division pattern,
wherein the second support structure includes:
a first extension portion extending in the second direction in a plan view; and
second extension portion connected to the first extension portion, the second extension portion extending in the third direction from the first extension portion,
wherein the second support structure has a shape of "C" or "U" in a plan view,
wherein the first support structure is one of a plurality of first support structures arranged in a support structure column extending in the second direction,
wherein the second support structure is one of a plurality of second support structures arranged as first and second support structure columns, which extend in the second direction while being spaced apart from each other in the third direction, and
wherein the first support structure column of the plurality of second support structures is arranged between the support structure column of the plurality of first support structures and the second support structure column of the plurality of second support structures.

2. The semiconductor device as claimed in claim 1, wherein the second extension portion extends in the third direction from each of opposite end portions in the second direction of the first extension portion.

3. The semiconductor device as claimed in claim 1, wherein the second extension portion extends in the third direction from a central portion of the first extension portion in the second direction.

4. The semiconductor device as claimed in claim 1, wherein corners of each of the first and second extension portions are rounded in a plan view.

5. The semiconductor device as claimed in claim 1, wherein:
the first support structure is arranged between the division pattern and the first support structure, the second support structure having a shape of a circle, an ellipse, a rectangle, or a rounded rectangle with rounded corners.

6. The semiconductor device as claimed in claim 5, further comprising:
a contact plug extending in the first direction to contact an upper surface of an end portion in the second direction of each of the gate electrodes; and
a third support structure extending in the first direction through the gate electrode structure, the third support structure being adjacent to the contact plug,
wherein the third support structure has a same shape as the first support structure in a plan view.

7. The semiconductor device as claimed in claim 1, wherein:
the second support structure includes a third support structure and a fourth support structure, each arranged in the third direction between the division pattern and the insulation pattern structure,
the first extension portion and the second extension portion are each part of the third support structure,
the second extension portion extends in the third direction, toward the fourth support structure, from each of opposite end portions in the second direction of the first extension portion,
the fourth support structure includes two third extension portions that extend in the second direction and are spaced apart from each other in the third direction,
the fourth support structure includes three fourth extension portions that extend in the third direction and are spaced apart from each other in the second direction,
the two third extension portions are not aligned with each other along the second direction,
corresponding ones of end portions in the second direction of the two third extension portions, respectively, overlap each other in the third direction, and are connected to each other by one of the fourth extension portions, and
other two of the fourth extension portions extend in the third direction from outer end portions in the second direction of the two third extension portions.

8. The semiconductor device as claimed in claim 7, wherein:
the fourth support structure is one of a plurality of fourth support structures spaced apart from each other in the second direction, and
adjacent fourth extension portions of respective neighboring ones of the plurality of fourth support structures face the first extension portion in the third direction.

9. The semiconductor device as claimed in claim 1, wherein:
the second extension portion extends in the third direction from each of opposite end portions in the second direction of the first extension portion,
the plurality of second support structures of the first and second support structure columns together are arranged in a zigzag pattern in the second direction,
the second extension portions in the first support structure column extend toward the second support structure column, and
the second extension portions in the second support structure column extend toward the first support structure column.

10. The semiconductor device as claimed in claim 1, wherein:
the substrate includes a cell array region, and an extension region at least partially surrounding the cell array region,
the gate electrode structure and the division pattern are formed on the cell array region and the extension region,
the channel is formed on the cell array region, and
the insulation pattern structure, the through via, and the second support structure are formed on the extension region and/or the cell array region.

11. The semiconductor device as claimed in claim 1, wherein:
the channel has a cup shape,
the semiconductor device further comprises:
a charge storage structure on an outer sidewall of the channel;
a filling pattern filling an inner space formed by the channel; and
a capping pattern on the channel and the filling pattern, the capping pattern contacting an inner sidewall of the charge storage structure, and
the charge storage structure, the channel, the filling pattern, and the capping pattern form a memory channel structure extending in the first direction.

12. The semiconductor device as claimed in claim 11, wherein:
the second support structure includes:
a dummy channel having a cup shape and extending in the first direction;
a dummy charge storage structure on an outer sidewall of the dummy channel;
a dummy filling pattern filling an inner space formed by the dummy channel; and
a dummy capping pattern on the dummy channel and the dummy filling pattern, the dummy capping pattern contacting an inner sidewall of the dummy charge storage structure, and
the dummy channel, the dummy charge storage structure, the dummy filling pattern, and the dummy capping pattern include materials substantially the same as those of the channel, the charge storage structure, the filling pattern, and the capping pattern, respectively.

13. The semiconductor device as claimed in claim 1, wherein the insulation pattern structure includes first and second patterns alternately and repeatedly stacked in the first direction, the first and second patterns including different materials from each other.

14. A semiconductor device, comprising:
lower circuit patterns on a substrate, the substrate including a cell array region and an extension region at least partially surrounding the cell array region;
a common source plate (CSP) over the lower circuit patterns;
a gate electrode structure on the CSP, the gate electrode structure including gate electrodes spaced apart from each other in a first direction perpendicular to an upper surface of the substrate, each of the gate electrodes extending in a second direction parallel to the upper surface of the substrate;
a memory channel structure extending through the gate electrode structure on the cell array region and contacting an upper surface of the CSP, the memory channel structure including:
a channel extending in the first direction; and a charge storage structure on an outer sidewall of the channel;
a division pattern at each of opposite sides of the gate electrode structure in a third direction, the third direction being parallel to the upper surface of the substrate and crossing the second direction, the division pattern extending in the second direction;
an insulation pattern structure extending through a portion of the gate electrode structure on the CSP;
a through via extending in the first direction through the insulation pattern structure and the CSP, the through via contacting one of the lower circuit patterns and electrically connected thereto;
a contact plug extending in the first direction to contact an upper surface of an end portion in the second direction of one of the gate electrodes;
a first support structure extending in the first direction through the gate electrode structure and contacting an upper surface of the CSP, the first support structure being adjacent to the contact plug; and
a second support structure extending in the first direction through a portion of the gate electrode structure between the insulation pattern structure and the division pattern, and contacting an upper surface of the CSP,
wherein the second support structure has a shape of "C" or "U" in a plan view,
wherein the first support structure is one of a plurality of first support structures arranged in a support structure column extending in the second direction,
wherein the second support structure is one of a plurality of second support structures arranged as first and second support structure columns, which extend in the second direction while being spaced apart from each other in the third direction, and
wherein the first support structure column of the plurality of second support structures is arranged between the support structure column of the plurality first support structures and the second support structure column of the plurality of second support structures.

15. The semiconductor device as claimed in claim 14, wherein the insulation pattern structure, the through via, and the second support structure are formed on the extension region and/or the cell array region.

16. The semiconductor device as claimed in claim 14, further comprising a third support structure between the division pattern and the second support structure, the third support structure having a same shape as the first support structure in a plan view.

17. The semiconductor device as claimed in claim 14, wherein:
the plurality of second support structures of the first and second support structure columns together are arranged in a zigzag pattern in the second direction.

18. A massive data storage system, comprising:
a semiconductor device having:
a memory cell structure including:
a gate electrode structure on a substrate, the gate electrode structure including gate electrodes spaced apart from each other in a first direction perpendicular to an upper surface of the substrate, each of the gate electrodes extending in a second direction parallel to the upper surface of the substrate;
a channel extending in the first direction through the gate electrode structure;
a division pattern at each of opposite sides of the gate electrode structure in a third direction, the third direction being parallel to the upper surface of the substrate and crossing the second direction, the division pattern extending in the second direction;
an insulation pattern structure extending through a portion of the gate electrode structure;
a through via extending in the first direction through the insulation pattern structure;
a first support structure extending in the first direction through the gate electrode structure; and
a second support structure extending in the first direction through a portion of the gate electrode structure between the insulation pattern structure and the division pattern, the second support structure including a first extension portion extending in the second direction in a plan view, and including a second extension portion connected to the first extension portion, the second extension portion extending in the third direction from the first extension portion;
peripheral circuit wirings configured to apply electrical signals to the memory cell structure; and
an input/output pad electrically connected to the peripheral circuit wirings; and
a controller electrically connected to the semiconductor device through the input/output pad, the controller configured to control the semiconductor device,
wherein the second support structure has a shape of "C" or "U" in a plan view,
wherein the first support structure is one of a plurality of first support structures arranged in a support structure column extending in the second direction,
wherein the second support structure is one of a plurality of second support structures arranged as first and second support structure columns, which extend in the second direction while being spaced apart from each other in the third direction, and
wherein the first support structure column of the plurality of second support structures is arranged between the support structure column of the plurality of first support structures and the second support structure column of the plurality of second support structures.

19. The massive data storage system as claimed in claim 18, wherein the second extension portion extends in the third direction from each of opposite ends in the second direction of the first extension portion.

* * * * *